(12) United States Patent
Fillingim et al.

(10) Patent No.: US 9,116,823 B2
(45) Date of Patent: Aug. 25, 2015

(54) SYSTEMS AND METHODS FOR ADAPTIVE ERROR-CORRECTION CODING

(71) Applicant: Fusion-io, Inc., Salt Lake City, UT (US)

(72) Inventors: Jeremy Fillingim, Salt Lake City, UT (US); David Flynn, Sandy, UT (US); John Strasser, Syracuse, UT (US); Bill Inskeep, West Valley City, UT (US)

(73) Assignee: Intelligent Intellectual Property Holdings 2 LLC (DE)

( * ) Notice: Subject to any disclaimer, the term of this patent is extended or adjusted under 35 U.S.C. 154(b) by 5 days.

(21) Appl. No.: 13/830,652

(22) Filed: Mar. 14, 2013

(65) Prior Publication Data

US 2013/0205183 A1 Aug. 8, 2013

Related U.S. Application Data

(63) Continuation-in-part of application No. 13/784,705, filed on Mar. 4, 2013, which is a continuation-in-part of application No. 13/296,834, filed on Nov. 15, 2011, which is a continuation-in-part of application No.

(Continued)

(51) Int. Cl.
*G11C 29/00* (2006.01)
*G06F 11/10* (2006.01)
(Continued)

(52) U.S. Cl.
CPC *G06F 11/10* (2013.01); *G06F 9/52* (2013.01); *G06F 11/108* (2013.01); *G06F 11/1044* (2013.01); *G06F 12/0253* (2013.01); *H04L 12/46* (2013.01); *H04L 12/4625* (2013.01);

(Continued)

(58) Field of Classification Search
CPC ............ G06F 11/1068; G06F 11/1072; G06F 11/1008; G06F 11/1076; G11C 29/00
USPC ........................................................ 714/773
See application file for complete search history.

(56) References Cited

U.S. PATENT DOCUMENTS 5,111,463 A 5/1992 Zook
5,151,905 A 9/1992 Yokono et al.
(Continued)

FOREIGN PATENT DOCUMENTS

EP 0747822 12/1996
EP 1100001 5/2001
(Continued)

OTHER PUBLICATIONS

Application No. 200780051027.1, 2380.2.2CN, Office Action, Apr. 23, 2013.

(Continued)

*Primary Examiner* — Albert Decady
*Assistant Examiner* — Enam Ahmed
(74) *Attorney, Agent, or Firm* — Kunzler Law Group, PC

(57) ABSTRACT

A storage module is configured to store data segments, such as error-correcting code (ECC) codewords, within an array comprising a plurality of columns. The ECC codewords may comprise ECC codeword symbols. The ECC symbols of a data segment may be arranged in a horizontal arrangement, a vertical arrangement, a hybrid channel arrangement, and/or vertical stripe arrangement within the array. The individual ECC symbols may be stored within respective columns of the array (e.g., may not cross column boundaries). Data of an unavailable ECC symbol may be reconstructed by use of other ECC symbols stored on other columns of the array.

18 Claims, 28 Drawing Sheets

Related U.S. Application Data

11/952,101, filed on Dec. 6, 2007, now Pat. No. 8,402,201.

(60) Provisional application No. 60/873,111, filed on Dec. 6, 2006, provisional application No. 60/974,470, filed on Sep. 22, 2007, provisional application No. 61/606,253, filed on Mar. 2, 2012, provisional application No. 61/606,755, filed on Mar. 5, 2012.

(51) Int. Cl.
| | | |
|---|---|---|
| *G06F 12/02* | (2006.01) | |
| *G06F 9/52* | (2006.01) | |
| *H04L 12/46* | (2006.01) | |
| *H04L 12/64* | (2006.01) | |
| *H04L 29/08* | (2006.01) | |

(52) U.S. Cl.
CPC ...... *H04L 12/6418* (2013.01); *G06F 2211/109* (2013.01); *G06F 2212/2022* (2013.01); *H04L 67/1097* (2013.01)

(56) References Cited

U.S. PATENT DOCUMENTS

| | | | |
|---|---|---|---|
| 5,261,068 A | 11/1993 | Gaskins et al. | |
| 5,291,496 A | 3/1994 | Andaleon et al. | |
| 5,313,475 A | 5/1994 | Cromer et al. | |
| 5,323,489 A | 6/1994 | Bird | |
| 5,325,509 A | 6/1994 | Lautzenheiser | |
| 5,379,304 A * | 1/1995 | Dell et al. | 714/773 |
| 5,388,083 A | 2/1995 | Assar et al. | |
| 5,404,485 A | 4/1995 | Ban | |
| 5,438,671 A | 8/1995 | Miles | |
| 5,479,638 A | 12/1995 | Assar et al. | |
| 5,485,595 A | 1/1996 | Assar et al. | |
| 5,504,882 A | 4/1996 | Chai | |
| 5,544,356 A | 8/1996 | Robinson et al. | |
| 5,551,003 A | 8/1996 | Mattson et al. | |
| 5,559,988 A | 9/1996 | Durante et al. | |
| 5,592,641 A | 1/1997 | Fandrich et al. | |
| 5,594,883 A | 1/1997 | Pricer | |
| 5,603,001 A | 2/1997 | Sukegawa et al. | |
| 5,664,096 A | 9/1997 | Ichinomiya et al. | |
| 5,701,434 A | 12/1997 | Nakagawa | |
| 5,734,861 A | 3/1998 | Cohn et al. | |
| 5,745,671 A | 4/1998 | Hodges | |
| 5,754,563 A | 5/1998 | White | |
| 5,758,118 A | 5/1998 | Choy et al. | |
| 5,822,759 A | 10/1998 | Treynor | |
| 5,845,313 A | 12/1998 | Estakhri et al. | |
| 5,845,329 A | 12/1998 | Onishi et al. | |
| 5,893,138 A | 4/1999 | Judd et al. | |
| 5,907,856 A | 5/1999 | Estakhri et al. | |
| 5,924,113 A | 7/1999 | Estakhri et al. | |
| 5,930,815 A | 7/1999 | Estakhri et al. | |
| 5,960,462 A | 9/1999 | Solomon et al. | |
| 5,961,660 A | 10/1999 | Capps, Jr. et al. | |
| 5,969,986 A | 10/1999 | Wong et al. | |
| 6,000,006 A | 12/1999 | Bruce et al. | |
| 6,000,019 A | 12/1999 | Dykstal et al. | |
| 6,014,724 A | 1/2000 | Jenett | |
| 6,061,511 A | 5/2000 | Marantz et al. | |
| 6,078,520 A | 6/2000 | Tobita et al. | |
| 6,105,076 A | 8/2000 | Beardsley et al. | |
| 6,128,695 A | 10/2000 | Estakhri et al. | |
| 6,141,249 A | 10/2000 | Estakhri et al. | |
| 6,145,051 A | 11/2000 | Estakhri et al. | |
| 6,170,039 B1 | 1/2001 | Kishida | |
| 6,170,047 B1 | 1/2001 | Dye | |
| 6,172,906 B1 | 1/2001 | Estakhri et al. | |
| 6,173,381 B1 | 1/2001 | Dye | |
| 6,185,654 B1 | 2/2001 | Van Doren | |
| 6,223,308 B1 | 4/2001 | Estakhri et al. | |
| 6,230,234 B1 | 5/2001 | Estakhri et al. | |
| 6,240,040 B1 | 5/2001 | Akaogi et al. | |
| 6,330,688 B1 | 12/2001 | Brown | |
| 6,353,878 B1 | 3/2002 | Dunham | |
| 6,356,986 B1 | 3/2002 | Solomon et al. | |
| 6,370,631 B1 | 4/2002 | Dye | |
| 6,374,336 B1 | 4/2002 | Peters et al. | |
| 6,385,688 B1 | 5/2002 | Mills | |
| 6,385,710 B1 | 5/2002 | Goldman et al. | |
| 6,393,513 B2 | 5/2002 | Estakhri et al. | |
| 6,404,647 B1 | 6/2002 | Minne | |
| 6,404,676 B2 | 6/2002 | Kihara et al. | |
| 6,412,080 B1 | 6/2002 | Fleming et al. | |
| 6,418,478 B1 | 7/2002 | Ignatius et al. | |
| 6,418,509 B1 | 7/2002 | Yanai et al. | |
| 6,424,872 B1 | 7/2002 | Glanzer et al. | |
| 6,446,188 B1 | 9/2002 | Henderson et al. | |
| 6,477,617 B1 | 11/2002 | Golding | |
| 6,519,185 B2 | 2/2003 | Harari et al. | |
| 6,523,102 B1 | 2/2003 | Dye et al. | |
| 6,535,869 B1 | 3/2003 | Housel, III | |
| 6,564,285 B1 | 5/2003 | Mills | |
| 6,567,307 B1 | 5/2003 | Estakhri | |
| 6,571,312 B1 | 5/2003 | Sugai et al. | |
| 6,587,915 B1 | 7/2003 | Kim | |
| 6,601,211 B1 | 7/2003 | Norman | |
| 6,604,168 B2 | 8/2003 | Ogawa | |
| 6,625,685 B1 | 9/2003 | Cho et al. | |
| 6,671,757 B1 | 12/2003 | Multer et al. | |
| 6,675,318 B1 | 1/2004 | Lee | |
| 6,675,349 B1 | 1/2004 | Chen | |
| 6,697,076 B1 | 2/2004 | Trivedi et al. | |
| 6,710,901 B2 | 3/2004 | Pastor | |
| 6,715,046 B1 | 3/2004 | Shoham et al. | |
| 6,725,321 B1 | 4/2004 | Sinclair et al. | |
| 6,728,851 B1 | 4/2004 | Estakhri et al. | |
| 6,742,078 B1 | 5/2004 | Chien et al. | |
| 6,751,155 B2 | 6/2004 | Gorobets | |
| 6,754,774 B2 | 6/2004 | Gruner et al. | |
| 6,754,800 B2 | 6/2004 | Wong et al. | |
| 6,757,800 B1 | 6/2004 | Estakhri et al. | |
| 6,760,805 B2 | 7/2004 | Lasser | |
| 6,763,424 B2 | 7/2004 | Conley | |
| 6,775,185 B2 | 8/2004 | Fujisawa et al. | |
| 6,779,088 B1 | 8/2004 | Benveniste et al. | |
| 6,785,785 B2 | 8/2004 | Piccirillo et al. | |
| 6,795,890 B1 | 9/2004 | Sugai et al. | |
| 6,801,979 B1 | 10/2004 | Estakhri et al. | |
| 6,839,819 B2 | 1/2005 | Martin | |
| 6,839,826 B2 | 1/2005 | Cernea | |
| 6,845,428 B1 | 1/2005 | Kedem | |
| 6,871,257 B2 | 3/2005 | Conley et al. | |
| 6,877,076 B1 | 4/2005 | Cho et al. | |
| 6,880,049 B2 | 4/2005 | Gruner et al. | |
| 6,883,068 B2 | 4/2005 | Tsirigotis et al. | |
| 6,883,079 B1 | 4/2005 | Priborsky | |
| 6,910,170 B2 | 6/2005 | Choi et al. | |
| 6,912,537 B2 | 6/2005 | Selkirk et al. | |
| 6,912,598 B1 | 6/2005 | Bedarida et al. | |
| 6,912,618 B2 | 6/2005 | Estakhri et al. | |
| 6,928,505 B1 | 8/2005 | Klingman | |
| 6,931,509 B2 | 8/2005 | Lloyd-Jones | |
| 6,938,133 B2 | 8/2005 | Johnson et al. | |
| 6,968,421 B2 | 11/2005 | Conley | |
| 6,977,599 B2 | 12/2005 | Widmer | |
| 6,978,342 B1 | 12/2005 | Estakhri et al. | |
| 6,996,676 B2 | 2/2006 | Megiddo | |
| 7,000,063 B2 | 2/2006 | Friedman et al. | |
| 7,010,652 B2 | 3/2006 | Piccirillo et al. | |
| 7,043,599 B1 | 5/2006 | Ware et al. | |
| 7,050,337 B2 | 5/2006 | Iwase et al. | |
| 7,058,769 B1 | 6/2006 | Danilak | |
| 7,069,380 B2 | 6/2006 | Ogawa et al. | |
| 7,076,723 B2 | 7/2006 | Saliba | |
| 7,089,391 B2 | 8/2006 | Geiger et al. | |
| 7,096,321 B2 | 8/2006 | Modha | |
| 7,111,140 B2 | 9/2006 | Estakhri et al. | |
| 7,130,960 B2 | 10/2006 | Kano | |
| 7,139,864 B2 | 11/2006 | Bennett et al. | |
| 7,149,947 B1 | 12/2006 | MacLellan et al. | |

(56) References Cited

U.S. PATENT DOCUMENTS

| | | | |
|---|---|---|---|
| 7,162,571 B2 | 1/2007 | Kilian et al. | |
| 7,167,953 B2 | 1/2007 | Megiddo et al. | |
| 7,173,852 B2 | 2/2007 | Gorobets | |
| 7,178,081 B2 | 2/2007 | Lee et al. | |
| 7,181,572 B2 | 2/2007 | Walmsley | |
| 7,194,577 B2 | 3/2007 | Johnson et al. | |
| 7,215,580 B2 | 5/2007 | Gorobets | |
| 7,219,197 B2 | 5/2007 | Hatakeyama | |
| 7,219,238 B2 | 5/2007 | Saito et al. | |
| 7,237,141 B2 | 6/2007 | Fredin | |
| 7,243,203 B2 | 7/2007 | Scheuerlein | |
| 7,246,179 B2 | 7/2007 | Camara et al. | |
| 7,248,691 B1 | 7/2007 | Pandit et al. | |
| 7,287,109 B2 | 10/2007 | Barth et al. | |
| 7,305,520 B2 | 12/2007 | Voigt et al. | |
| 7,328,307 B2 | 2/2008 | Hoogterp | |
| 7,337,201 B1 | 2/2008 | Yellin et al. | |
| 7,340,566 B2 | 3/2008 | Voth | |
| 7,340,645 B1 | 3/2008 | Martin et al. | |
| 7,366,868 B2 | 4/2008 | Reuter et al. | |
| 7,376,034 B2 | 5/2008 | Torabi et al. | |
| 7,389,465 B2 | 6/2008 | Radke et al. | |
| 7,424,593 B2 | 9/2008 | Estakhri et al. | |
| 7,441,090 B2 | 10/2008 | Estakhri et al. | |
| 7,450,420 B2 | 11/2008 | Sinclair et al. | |
| 7,451,346 B2 | 11/2008 | Katsuragi | |
| 7,454,555 B2 | 11/2008 | Ware et al. | |
| 7,480,766 B2 | 1/2009 | Gorobets | |
| 7,487,320 B2 | 2/2009 | Bansal et al. | |
| 7,523,249 B1 | 4/2009 | Estakhri et al. | |
| 7,549,013 B2 | 6/2009 | Estakhri et al. | |
| 7,552,271 B2 | 6/2009 | Sinclair et al. | |
| 7,565,569 B2 | 7/2009 | Zohar et al. | |
| 7,631,138 B2 | 12/2009 | Gonzalez et al. | |
| 7,644,239 B2 | 1/2010 | Ergan et al. | |
| 7,652,922 B2 | 1/2010 | Kim | |
| 7,725,628 B1 | 5/2010 | Phan et al. | |
| 7,797,479 B2 | 9/2010 | Trika et al. | |
| 7,856,528 B1 | 12/2010 | Frost et al. | |
| 7,873,803 B2 | 1/2011 | Cheng | |
| 7,944,762 B2 | 5/2011 | Gorobets | |
| 8,296,628 B2 * | 10/2012 | Madan | 714/773 |
| 8,423,701 B2 | 4/2013 | Perroni et al. | |
| 8,595,573 B2 * | 11/2013 | Shalvi et al. | 714/718 |
| 2002/0053009 A1 | 5/2002 | Selkirk et al. | |
| 2002/0057798 A1 | 5/2002 | Zhang | |
| 2002/0069317 A1 | 6/2002 | Chow et al. | |
| 2002/0069318 A1 | 6/2002 | Chow et al. | |
| 2002/0194451 A1 | 12/2002 | Mukaida et al. | |
| 2003/0023911 A1 * | 1/2003 | Davis et al. | 714/723 |
| 2003/0028704 A1 | 2/2003 | Mukaida et al. | |
| 2003/0061296 A1 | 3/2003 | Craddock et al. | |
| 2003/0093741 A1 | 5/2003 | Argon et al. | |
| 2003/0163630 A1 | 8/2003 | Aasheim et al. | |
| 2003/0163633 A1 | 8/2003 | Aasheim | |
| 2003/0163663 A1 | 8/2003 | Aasheim et al. | |
| 2003/0165076 A1 | 9/2003 | Gorobets et al. | |
| 2003/0198084 A1 | 10/2003 | Fujisawa et al. | |
| 2004/0044705 A1 | 3/2004 | Stager | |
| 2004/0064647 A1 | 4/2004 | DeWhitt et al. | |
| 2004/0088514 A1 | 5/2004 | Bullen | |
| 2004/0186946 A1 | 9/2004 | Lee | |
| 2004/0225946 A1 * | 11/2004 | Hashimoto et al. | 714/764 |
| 2004/0268359 A1 | 12/2004 | Hanes | |
| 2005/0002263 A1 | 1/2005 | Iwase et al. | |
| 2005/0015539 A1 | 1/2005 | Horii et al. | |
| 2005/0027951 A1 | 2/2005 | Piccirillo et al. | |
| 2005/0055495 A1 | 3/2005 | Vihmalo | |
| 2005/0055497 A1 | 3/2005 | Estakhri et al. | |
| 2005/0132148 A1 | 6/2005 | Arimilli et al. | |
| 2005/0132259 A1 | 6/2005 | Emmot et al. | |
| 2005/0141312 A1 | 6/2005 | Sinclair et al. | |
| 2005/0141313 A1 | 6/2005 | Gorobets | |
| 2005/0144361 A1 | 6/2005 | Gonzalez et al. | |
| 2005/0149618 A1 | 7/2005 | Cheng | |
| 2005/0149819 A1 | 7/2005 | Hwang | |
| 2005/0193166 A1 | 9/2005 | Johnson et al. | |
| 2005/0204187 A1 | 9/2005 | Lee et al. | |
| 2005/0216653 A1 | 9/2005 | Aasheim et al. | |
| 2005/0223154 A1 | 10/2005 | Uemura | |
| 2005/0229090 A1 | 10/2005 | Shen et al. | |
| 2005/0240713 A1 | 10/2005 | Wu | |
| 2005/0246510 A1 | 11/2005 | Retnamma et al. | |
| 2006/0004955 A1 | 1/2006 | Ware et al. | |
| 2006/0059326 A1 | 3/2006 | Aasheim et al. | |
| 2006/0064556 A1 | 3/2006 | Aasheim et al. | |
| 2006/0075057 A1 | 4/2006 | Goldea et al. | |
| 2006/0107097 A1 | 5/2006 | Zohar et al. | |
| 2006/0136687 A1 | 6/2006 | Conley | |
| 2006/0136779 A1 | 6/2006 | Lee et al. | |
| 2006/0152981 A1 | 7/2006 | Ryu | |
| 2006/0248387 A1 | 11/2006 | Nicholson et al. | |
| 2006/0271725 A1 | 11/2006 | Wong | |
| 2007/0005928 A1 | 1/2007 | Trika et al. | |
| 2007/0016699 A1 | 1/2007 | Minami | |
| 2007/0028035 A1 | 2/2007 | Nishihara | |
| 2007/0030734 A1 | 2/2007 | Sinclair | |
| 2007/0050571 A1 | 3/2007 | Nakamura | |
| 2007/0058610 A1 | 3/2007 | Brandstatter | |
| 2007/0074092 A1 | 3/2007 | Dammann et al. | |
| 2007/0086260 A1 | 4/2007 | Sinclair | |
| 2007/0113150 A1 | 5/2007 | Resnick | |
| 2007/0118713 A1 | 5/2007 | Guterman | |
| 2007/0143566 A1 | 6/2007 | Gorobets | |
| 2007/0162830 A1 | 7/2007 | Stek et al. | |
| 2007/0168564 A1 | 7/2007 | Conley et al. | |
| 2007/0168698 A1 | 7/2007 | Coulson et al. | |
| 2007/0174574 A1 | 7/2007 | Kano | |
| 2007/0198770 A1 | 8/2007 | Horii et al. | |
| 2007/0204100 A1 | 8/2007 | Shin et al. | |
| 2007/0204197 A1 | 8/2007 | Yokokawa | |
| 2007/0204199 A1 | 8/2007 | Chung et al. | |
| 2007/0220396 A1 * | 9/2007 | Jackson | 714/758 |
| 2007/0233937 A1 | 10/2007 | Coulson et al. | |
| 2007/0245217 A1 | 10/2007 | Valle | |
| 2007/0268754 A1 | 11/2007 | Lee et al. | |
| 2007/0271468 A1 | 11/2007 | McKenney et al. | |
| 2007/0271572 A1 | 11/2007 | Gupta et al. | |
| 2007/0274150 A1 | 11/2007 | Gorobets | |
| 2007/0300008 A1 | 12/2007 | Rogers et al. | |
| 2008/0022187 A1 | 1/2008 | Bains | |
| 2008/0034259 A1 | 2/2008 | Ko | |
| 2008/0082736 A1 | 4/2008 | Chow et al. | |
| 2008/0098083 A1 | 4/2008 | Shergill | |
| 2008/0098159 A1 | 4/2008 | Song et al. | |
| 2008/0109647 A1 | 5/2008 | Gavens et al. | |
| 2008/0120303 A1 | 5/2008 | Selkirk et al. | |
| 2008/0141043 A1 | 6/2008 | Flynn | |
| 2008/0144826 A1 | 6/2008 | Chang | |
| 2008/0270714 A1 * | 10/2008 | Van Den Bosch | 711/157 |
| 2009/0043952 A1 | 2/2009 | Estakhri et al. | |
| 2009/0083485 A1 | 3/2009 | Cheng | |
| 2009/0204750 A1 | 8/2009 | Estakhri et al. | |
| 2009/0235017 A1 | 9/2009 | Estakhri et al. | |
| 2009/0313453 A1 | 12/2009 | Stefanus et al. | |
| 2010/0091535 A1 | 4/2010 | Sommer et al. | |
| 2011/0182119 A1 | 7/2011 | Strasser et al. | |
| 2011/0240749 A1 * | 10/2011 | Naddor | 235/494 |

FOREIGN PATENT DOCUMENTS

| | | |
|---|---|---|
| EP | 1607868 | 12/2005 |
| GB | 0123416.0 | 9/2001 |
| JP | 2004086295 | 3/2004 |
| WO | 2005010773 | 2/2005 |
| WO | 2008070796 | 6/2008 |

OTHER PUBLICATIONS

U.S. Appl. No. 11/952,091, Office Action, Feb. 7, 2012.
U.S. Appl. No. 11/952,091, Notice of Allowance, Jun. 28, 2012.
Application No. 200780050974.9, Office Action, Jul. 27, 2011.
Application No. 200780050974.9, Office Action, May 23, 2012.
Application No. PCT/US2007/086683, International Preliminary

(56) References Cited

OTHER PUBLICATIONS

Report on Patentability, Nov. 5, 2009.
Application No. PCT/US2007/086683, International Search Report and Written Opinion, Oct. 26, 2009.
U.S. Appl. No. 11/952,095, Office Action, Oct. 29, 2010.
U.S. Appl. No. 11/952,095, Office Action, Jun. 8, 2011.
U.S. Appl. No. 11/952,095, Office Action, Feb. 14, 2012.
U.S. Appl. No. 11/952,095, Office Action, Sep. 4, 2013.
Application No. 200780051027.1, Office Action, Feb. 1, 2011.
Application No. 200780051027.1, Office Action, Feb. 16, 2012.
Application No. PCT/US2007/086686, International Search Report and Written Opinion, Apr. 28, 2008.
Application No. PCT/US2007/086686, International Preliminary Report on Patentability, Dec. 16, 2008.
U.S. Appl. No. 11/952,101, Office Action, Jan. 6, 2011.
U.S. Appl. No. 11/952,101, Office Action, Dec. 22, 2011.
Application No. 200780050969.8, Office Action, Nov. 11, 2010.
Application No. 20078005096.8, Office Action. Jul. 6, 2011.
Application No. 200780050969.8, Office Action, Nov. 7. 2011.
Application No. 07865335.9, Office Action, Nov. 18, 2010.
Application No. PCT/US2007/086688, International Search Report and Written Opinion, Apr. 28, 2008.
Application No. PCT/US2007/086688, International Preliminary Report on Patentabirty, Mar. 16, 2009.
"Datadirect Storage Systems Selected for NCSA Cluster", HPCWire, Sep. 4, 2010 pp. 2, http://www.hpcwire.com/hpcwire/hpcwireWWW/03/0815/105731.html.
"Introducing Box Hill's Fibre Box", Fibre Channel News, Jan. 16, 1997, p. 5, http://hsi.web.cern.ch/HSI/fcs/news/jandec97.htm.
"Hynix 48-GB Flash MCP", Slashdot, Sep. 6, 2007, pp. 3, http://hardware.slashdot.org/article.pl?sid=07/09/06/146218&from=rss.
"Am29"DL322D/323D/324D, Spansion, Oct. 7, 2004, pp. 57 Data Sheet XP-002476181, Publication No. 21534, Revision #, Amendment #7.
Ari, Ismail, "Performance Boosting and Workload Isolation in Storage Area Networks with SANCache", Proceedings of the 23rd IEEE/14th NASA Goddard Conference on Mass Storage Systems and Technologies, May 2006, pp. 11, College Park, Maryland, US.
Dan, Raz, "Implementing MLC NAND Flash for Cost-Effective, High-Capacity Memory", M-Systems White Paper, Sep. 2003, pp. 13, 92-SR-014-02-8L, Rev. 1.1.
"Ecc Algorithm", Samsung Electronics, Mar. 2005, pp. 8.
Kawaguchi, Atsuo, "A Flash-Memory Based File System", Hitachi, Ltd., 1995, pp. 10.
Morgenstern, David, "Is There a Flash Memory RAID in Your Future?", Ziff Davis Enterprise Holdings, Inc., Nov. 8, 2006, pp. 4, http://www.eweek.com—eWeek.
"File System Primer", CoolSolutionsWiki, Jul. 17, 2006, pp. 5, http://wiki.novell.com/index.php/File_System_Primer.
Application No. PCT/US2009/039572, International Search Report and Written Opinion, Jul. 30, 2009.
Application No. PCT/US2009/039572, International Preliminary Report on Patentability, Oct. 14, 2010.
"Pivot3 RAIGE Storage Cluster", Pivot3 White Paper, Jun. 2007, pp. 17, Technology Overview.
Plank, James S., "A Tutorial on Reed-Solomon Coding for Fault-Tolerance in RAID-like Systems", University of Tennessee, Sep. 1997, pp. 19, Technical Report CS-96-332, http://www.cs.utk.edu/~plank/papers/CS-03-504.html.

Van Hensbergen, Eric, "Dynamic Policy Disk Caching for Storage Networking", IBM Research Report, Nov. 28, 2006, pp. 13, RC24123.
"S2A9550 Overview", DataDirect Networks Whitepaper, 2007, pp. 17, Chatsworth, California, US.
Wu, Michael, "eNVy: A Non-Volatile, Main Memory Storage System", Association of Computing Machinery, 1994, pp. 12, ASPLOS Vo. 10/94, San Jose, California, US.
U.S. Appl. No. 12/098,427, Office Action, Aug. 5, 2011.
"Method for Fault Tolerance in nonvolatile Storage", PriorArtDatabase, Feb. 3, 2005, pp. 6, Technical Disclosure, http://www.ip.com/pubview/PCOM000042269D.
"BiTMICRO Introduces E-Disk PMC Flash Disk Module", BiTMICRO, May 18, 2004, pp. 2, Military & Aerospace Electronics East 2004, http://www.bitmicor.com/press_news_releases_20040518_prt.php.
"High Speed, Elevated Board Stacking", Samtec, 2007, p. 1.
Benjauthrit, Boonsieng, "An Overview of Error Control Codes for Data Storage", DATATAPE Incorporated, Apr. 1996, pp. 7, 1996 International NonVolatile Memory Technology Conference.
"ASPMC-660", Asine, downloaded Nov. 18, 2009, pp. 3, http://www.asinegroup.com/products/aspmc660.html.
Cardarilli, G. C., "Design of Fault-tolerant Solid State Mass Memory", Consortium ULISSE, Nov. 1999, pp. 9, Italy.
Makulowich, John, "Strategies, Players and Emerging Markets", Washington Technology, Jun. 26, 1997, pp. 6, http://washingtontechnology.com/Articles/1997/06/26/Strategies-Players-and-Emeriging-Ma . . . .
U.S. Appl. No. 12/098,434, Office Action, Oct. 29, 2010.
Application No. PCT/US2009/039570, InternationalSearch Report and Written Opinion, Jul. 8, 2009.
Application No. PCT/US2009/039570, International Preliminary Report cin Patentability, Oct. 21, 2010.
Woodhouse, David, "JFFS: The Journalling Flash File System", Red Hat, Inc., Jul. 1, 2001, pp. 12.
Rosenblum, Mendel, The Design and implementation of a Log-structured File System, 1992, pp. 101.
Kleiman, S. R., "Vnodes: An Architecture for Multiple File System Types in Sun UNIX", Sun Microsystems, Jan. 1, 1986, pp. 10.
Leventhal, Adam, "Flash Storage Memory", Communications of the ACM, Jul. 2008, pp. 5, vol. 51, No. 7.
Mesnier, Mike, "Object-Based Storage", IEEE Comminications Magazine, Aug. 2003, pp. 7, Storage Area Networking, 0163-6804/04.
U.S. Appl. No. 12/981,394, Notice of Allowance, Oct. 12, 2011.
"SCSI Object-Based Storage Device Commands", Seagate Technology, Jul. 30, 2004, pp. 187, Project T10/1355-D Working Draft, Reference No. ISO/IEC 14776-391:200x ANSI INCITS.:200x.
"Introduction to Samsung's Linux Flash File System—RFS", Samsung Electronics, Nov. 2006, pp. 6, Application Note, Version 1.0.
"NAND Flash 101: An Introduction to NAND Flash and How to Design It in to Your Next Product", Micron, Nov. 2006, pp. 28, Technical Note, TN-29-19: NAND Flash 101.
U.S. Appl. No. 12/098,427, Office Action, Jun. 19, 2012.
U.S. Appl. No. 12/273,532, Notice of Allowance, Apr. 6, 2011.
U.S. Appl. No. 12/273,532, Notice of Allowance, Jul. 29, 2011.
U.S. Appl. No. 13/730,602, Office Action, Jan. 15, 2015.
U.S. Appl. No. 13/456,119, Notice of Allowance, Feb. 20, 2015.
U.S. Appl. No. 13/784,705, Office Action, May 22, 2015.
U.S. Appl. No. 13/296,834, filed Jun. 18, 2015.

* cited by examiner

606

118

| | | | | | |
|---|---|---|---|---|---|
| ECC CW 0 | ECC CW 4 | ECC CW 8 | ...... | ECC CW 92 | ⎫ Vertical Stripe 646A |
| ECC CW 1 | ECC CW 5 | ECC CW 9 | | ECC CW 93 | |
| ECC CW 2 | ECC CW 6 | ECC CW 10 | ...... | ECC CW 93 | |
| ECC CW 3 | ECC CW 7 | ECC CW 11 | | ECC CW 95 | ⎭ |
| ECC CW 96 | ECC CW 100 | ECC CW 104 | | ECC CW 184 | ⎫ Vertical Stripe 646B |
| ECC CW 97 | ECC CW 101 | ECC CW 105 | ...... | ECC CW 185 | |
| ECC CW 98 | ECC CW 102 | ECC CW 106 | | ECC CW 186 | |
| ECC CW 99 | ECC CW 103 | ECC CW 107 | | ECC CW 187 | ⎭ |
| ⋮ | | | | | |
| ECC CW 288 | ECC CW 292 | ECC CW 296 | ...... | ECC CW 380 | ⎫ Vertical Stripe 646N |
| ECC CW 289 | ECC CW 293 | ECC CW 297 | | ECC CW 381 | |
| ECC CW 290 | ECC CW 294 | ECC CW 298 | ...... | ECC CW 382 | |
| ECC CW 291 | ECC CW 295 | ECC CW 299 | | ECC CW 383 | ⎭ |
| 0 | 1 | 2 | | 24 | |

SYSTEMS AND METHODS FOR ADAPTIVE ERROR-CORRECTION CODING

CROSS-REFERENCE TO RELATED APPLICATIONS

This application is a continuation-in-part of, and claims priority to, U.S. patent application Ser. No. 13/784,705, entitled "Systems and Methods for Adaptive Storage," filed Mar. 4, 2013 for David Flynn et al., which claims priority to U.S. Provisional Patent Application Ser. No. 61/606,253, entitled "Adaptive Data Arrangement," filed Mar. 2, 2012 for David Flynn et al. and to U.S. Provisional Patent Application Ser. No. 61/606,755, entitled "Adaptive Data Arrangement," filed Mar. 5, 2012, for David Flynn et al., and is a continuation-in-part of, and claims priority to, U.S. patent application Ser. No. 13/296,834, entitled "Apparatus, System, and Method for Storage Space Recovery in Solid-State Storage," filed Nov. 15, 2011, for David Flynn et al., which is a continuation-in-part of, and claims priority to, U.S. patent application Ser. No. 11/952,101, entitled "Apparatus, System, and Method for Storage Space Recovery in Solid-State Storage," filed Dec. 6, 2007 for David Flynn, et al., which claims priority to U.S. Provisional Patent Application Ser. No. 60/873,111, entitled "Elemental Blade System," filed Dec. 6, 2006 for David Flynn, et al., and to U.S. Provisional Patent Application Ser. No. 60/974,470, entitled "Apparatus, System, and Method for Object-Oriented Solid-State Storage," filed Sep. 22, 2007 for David Flynn, et al., each of which is incorporated herein by reference.

TECHNICAL FIELD

This disclosure relates to data storage and, in particular, to data layout and/or arrangement on a solid-state storage array.

BACKGROUND

Solid-state storage devices may have different read time Tr, stream time Ts, and other characteristics, which may affect device performance in different data layout configurations. In addition, data layout configurations and, in particular, error-correction code (ECC) encoding may determine performance and data security characteristics of a storage device. However, many storage systems use static, fixed-size ECC encoding schemes, which are tied to the underlying structure of the storage media.

SUMMARY

Disclosed herein are embodiments of an apparatus, comprising an error-correcting code (ECC) write module configured to generate a plurality of ECC codeword symbols comprising data of a storage request, wherein the ECC codeword symbols are configured for storage within respective columns of a solid-state storage array, each column comprising one or more solid-state storage elements, and an adaptive write module configured to stream the ECC codeword symbols comprising the data of the storage request to respective columns of a set of two or more columns of the solid-state storage array.

The data of the storage request may comprise a data packet, a data segment, a block, and/or a sector. The ECC write module may be configured to generate a plurality of ECC codeword symbols comprising the data and the adaptive write module may be configured to distribute the ECC codeword symbols between a plurality of different solid-state storage elements.

The adaptive write module may be configured to stream the ECC codeword symbols to the solid-state storage array in a plurality of data rows, each data row comprising data for storage within a respective one of the columns. The apparatus may include a parity module configured to generate parity data corresponding to each of the data rows.

The adaptive write module may be configured to stream the ECC codeword symbols comprising the data of the storage request to a first independent channel comprising a subset of the columns of the array with ECC codeword symbols comprising data of another storage request to a different independent channel comprising a different subset of the columns of the array.

In some embodiments, the apparatus comprises a read module configured to read a plurality of ECC codeword symbols stored within a plurality of different solid-state storage elements. Each ECC codeword symbol may be read from a respective one of the solid-state storage elements. The apparatus may further include a data recovery module configured to reconstruct an unavailable ECC codeword symbol read from a first one of the solid-state storage elements using other ECC codeword symbols stored on others of the solid-state storage elements. The data recovery module may be configured to reconstruct the unavailable ECC codeword symbol by use of parity data corresponding to the unavailable codeword and other ECC codeword symbols.

The adaptive write module may be configured to stream a respective ECC codeword symbol to a plurality of solid-state storage elements in each of a plurality of stream cycles. The apparatus may further include a parity module configured to generate parity data corresponding to the ECC symbols being streamed to the plurality of solid-state storage elements in the stream cycle. The adaptive write module may be configured to stream the parity data with the ECC codeword symbols corresponding to the parity data.

The ECC write module may be configured to generate one-byte ECC codeword symbols, and the adaptive write module may be configured to stream a respective one of the ECC codeword symbols to each of a plurality of solid-state storage elements in each of a plurality of bus cycles. In some embodiments, the ECC write module is configured to generate multi-byte ECC codeword symbols, and the adaptive write module is configured to stream portions of the multi-byte ECC codeword symbols to respective solid-state storage elements in each of a plurality of stream cycles, such that the portions of each multi-byte ECC codeword symbol are streamed to a respective one of the solid-state storage elements.

Disclosed herein are embodiments of a method for adaptive error-correcting encoding. The disclosed methods may comprise one or more machine-executable operations and/or steps. The disclosed operations and/or steps may be embodied as program code stored on a computer readable storage medium. Accordingly, embodiments of the methods disclosed herein may be embodied as a computer program product comprising a computer readable storage medium storing computer usable program code executable to perform one or more method operations and/or steps.

Embodiments of the disclosed method may include determining a storage location of a plurality of error-correcting code (ECC) codewords comprising requested data, wherein the ECC codewords are stored within a group of two or more of a plurality of solid-state storage elements, identifying ECC codewords comprising data of one or more other requests stored within different groups of the solid-state storage elements, and/or scheduling a read operation configured to read the ECC codewords of the requested data and ECC codewords comprising data of the one or more other requests in a single read operation on the solid-state storage elements. The ECC codewords may comprise ECC codeword symbols, and the ECC codeword symbols comprising the requested data may be stored within respective solid-state storage elements of the group of two or more different solid-state storage elements. The method may further include verifying that the ECC codeword symbols comprise the requested data by verifying a mark on the ECC codeword symbols corresponding to relational information pertaining to the requested data.

In some embodiments, the method further includes queuing storage requests in an request buffer, and determining a storage location of ECC codewords of one or more other requests in the request buffer. Scheduling the read operation may comprise reordering one or more storage requests in the request buffer and/or indicating different addressing information for two or more of the solid-state storage elements. The method may further comprise reordering contents of a read buffer to reconstruct a data packet stored within the plurality of ECC codewords comprising the requested data.

Disclosed herein are embodiments of a system, comprising means for generating a plurality of sets ECC symbols, wherein each set of ECC symbols comprises data of different respective storage requests, means for arranging the sets of ECC symbols for storage within different independent channels, each channel comprising two or more solid-state storage elements, and/or means for storing the arranged sets of ECC symbols to the different independent channels, which may comprise means for storing each ECC symbol to within a respective one of the solid-state storage elements of a respective independent channel. The system may further include means for identifying an independent channel comprising a set of ECC symbols corresponding to requested data, and/or means for extracting the requested data from the set of ECC symbols read from the identified independent channel. In some embodiments, the system comprises means for combining two or more read requests pertaining to ECC symbols stored within different independent channels.

Some embodiments of the system may comprise means for reconstructing an uncorrectable ECC symbol read from one of the solid-state storage elements by use of a plurality of ECC symbols stored within others of the solid-state storage elements.

BRIEF DESCRIPTION OF THE DRAWINGS

FIG. 6G depicts one embodiment of a vertical stripe configuration on a solid-state storage array;

DETAILED DESCRIPTION

Figure 1:
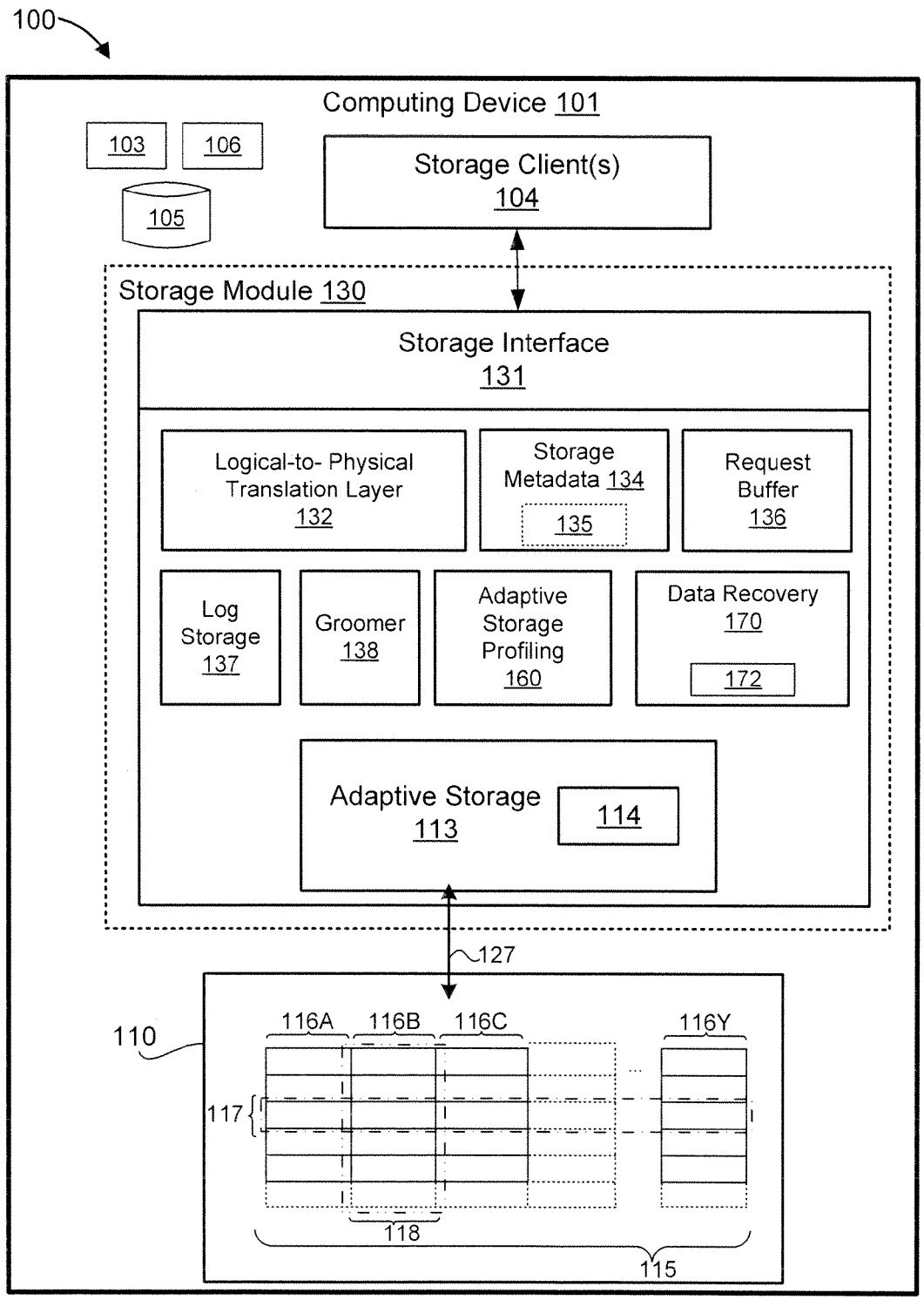
FIG. 1 is a block diagram of one embodiment of a system for adaptive storage.

FIG. 1 is a block diagram of one embodiment of a system 100 comprising a storage module 130 configured to manage a solid-state storage medium 110. The storage module 130 may comprise an adaptive storage module 113, a logical-to-physical translation layer 132, a storage metadata module 134, a log storage module 137, a groomer module 138, a profiling module, and a data recovery module 170. The storage module 130 may comprise software and/or hardware components.

Portions of the storage module 130 (and/or the modules and/or components thereof) may be implemented using software modules, such as drivers, services, and/or the like. Other portions of the storage module 130 (and/or the modules and/or components thereof) may be implemented using hardware resources, such as FPGAs, processors, ASICS, hardware controllers, storage controllers, and the like.

The solid-state storage medium 110 may comprise a non-volatile, solid-state storage medium, such as flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), Resistive Random-Access Memory (RRAM), Programmable Metallization Cell (PMC), Conductive-Bridging RAM (CBRAM), Magneto-Resistive RAM (MRAM), Dynamic RAM (DRAM), Phase change RAM (PRAM), or the like. The solid-state storage medium 110 may comprise a plurality of physical storage units (e.g., storage cells) configured for persistent data storage. The physical storage units may be arranged in groups, such as pages, which may be partitioned into storage divisions, such as erase blocks. The solid-state storage medium 110 may comprise pages of any suitable size. The page size of a solid-state storage medium 110 may range from 512 bytes to 32 kb.

The adaptive storage module 113 may be configured to write data to and/or read data from the solid-state storage medium 110 via a bus 127. The adaptive storage module 113 may comprise one or more hardware components, such as bus controllers, DMA controllers, storage controllers, storage media controllers, and the like. The adaptive storage module 113 may further comprise firmware, software modules, drivers, interface modules, and/or and the like.

The bus 127 may comprise a storage I/O bus for communicating data to/from the solid-state storage medium 110, and may further comprise a control I/O bus for providing addressing and other command and control information to the solid-state storage medium 110.

The storage module 130 may comprise and/or be implemented on a computing device 101. In some embodiments, portions of the storage module 130 may be internal to the computing device 101; for example, portions of the storage module 130 and/or solid-state storage medium 110 may be connected using a system bus, such as a peripheral component interconnect express (PCI-e) bus, a Serial Advanced Technology Attachment (serial ATA) bus, or the like. The disclosure is not limited in this regard; in some embodiments, components of the storage module 130 may be external to the computing device 101, and may be connected via a universal serial bus (USB) connection, an Institute of Electrical and Electronics Engineers (IEEE) 1394 bus (FireWire), an external PCI bus, Infiniband, or the like.

The computing device 101 may comprise a processor 103, volatile memory 106, and/or persistent storage 105. The processor 103 may comprise one or more general and/or special purpose processing elements. The processor 103 may be configured to execute instructions loaded into the volatile memory 106 from the persistent storage 105. Portions of one or more of the modules of the storage module 130 may be embodied as machine-readable instructions stored on the persistent storage 105. The instructions may be configured for execution by the processor 103 to implement one or more of the modules and/or methods described herein.

One or more storage clients 104 may access storage services provided by the storage module 130 through a storage interface 131. The storage interface 131 may comprise a block device interface, a virtualized storage interface, an object storage interface, a database storage interface, and/or other suitable interface and/or Application Programming Interface (API). The storage module 130 may further comprise a logical-to-physical translation layer 132 to map and/or associate identifiers of the storage client 104 with physical storage locations (e.g., physical addresses) on the solid-state storage medium 110. The logical-to-physical translation layer 132 may provide for "any-to-any" mappings between logical identifiers and physical storage locations, such that data may be written and/or updated "out-of-place" on the solid-state storage medium 110. As used herein, a physical address refers to an address (or other reference) capable of referencing a particular storage location on the solid-state storage medium 110. Accordingly, a physical address may be a "media address."

The storage module 130 may comprise a storage metadata module 134 configured to maintain storage metadata 135 pertaining to storage operations performed on the solid-state storage medium 110. The storage metadata 135 may include, but is not limited to: an index comprising any-to-any mappings between logical identifiers of a logical address space and physical storage locations on the solid-state storage medium 110, a reverse index pertaining to the contents of the solid-state storage medium 110, one or more validity bitmaps, reliability testing and/or status metadata, status information, such as error rate, retirement status, and so on. Portions of the metadata 135 may be stored on a volatile memory 106. Alternatively, or in addition, portions of the metadata 135 may be periodically stored on a persistent storage medium, such as the persistent storage 105, solid-state storage medium 110, or the like.

The storage module 130 may comprise a request buffer 136 configured to buffer storage requests received via the storage interface 131. The request buffer 136 may comprise an ordered buffer, such as a first-in-first-out (FIFO) or the like. The request buffer 136 may, therefore, be configured to maintain the order of incoming storage requests. As used herein, a storage request refers to one or more of a request to store, write, overwrite, modify, cache, delete, erase, read, and/or otherwise manage data by use of the storage module 130. The storage module 130 may be configured to service the storage requests in the request buffer 136. The storage module 130 may be configured to service the storage requests in the order they were received. Alternatively, the storage module 130 may be configured to reorder the storage requests to improve throughput and/or efficiency. The storage module 130 may be configured to reorder the storage requests to avoid data hazards, such as read-before-write, write-before-read, and so on.

The storage module 130 may comprise a log storage module 137 configured to store data in a "contextual format" on the solid-state storage medium 110. As used herein, a "contextual format" refers to a data format in which a logical interface of a data segment is associated with the data segment on the solid-state storage medium 110. For example, a contextual format may comprise a packet format that includes a header indicating one or more logical identifiers of a data segment, or the like. The contextual format may be used to reconstruct the mappings of the logical-to-physical translation layer 132 (and/or storage metadata 135), such as any-to-any mappings between logical identifiers and physical storage locations, reverse index metadata, and the like.

In some embodiments, the storage module 130 comprises a groomer module 138 configured to perform grooming operations on the solid-state storage medium 110. Grooming operations may include, but are not limited to: reclaiming storage resources, erasure, wear leveling, refreshing data stored on the solid-state storage medium 110, and so on. The groomer module 138 may operate outside of the path for servicing other, higher-priority storage operations and/or requests. Therefore, the groomer module 138 may operate as an autonomous, background process, which may be suspended and/or deferred while other storage operations are in process. Alternatively, the groomer module 138 may operate in the foreground while other storage operations are being serviced. The groomer 138 may wear-level the non-volatile storage medium 110, such that data is systematically spread throughout different storage locations, which may improve performance and data reliability, and avoid overuse and/or underuse of particular storage locations, thereby lengthening the useful life of the solid-state storage medium 110. Grooming an erase block (or logical erase block) may comprise relocating valid data (if any) to other storage locations, erasing the erase block, and/or initializing the erase block for storage operations (e.g., marking the erase block with a sequence indicator, sequence number, timestamp, or the like). The groomer module 138 may operate within a driver of the storage module 130. Alternatively, or in addition, portions of the groomer module 138 may be implemented on the adaptive storage module 113 (e.g., as hardware components, firmware, programmable hardware components, or the like).

In some embodiments, the solid-state storage medium 110 may comprise one or more arrays 115 of solid-state storage elements 116A-Y. As used herein, a solid-state storage array (or array) refers to a set of two or more independent columns 118. A column 118 may comprise a solid-state storage element 116A-Y that is communicatively coupled to the storage module 130 in parallel by the adaptive storage module 113 using, inter alia, the bus 127. Rows 117 of the array 115 may comprise physical storage units of the respective columns 118 (solid-state storage elements 116A-Y). As used herein, a solid-state storage element 116A-Y includes but is not limited to solid-state storage resources embodied as: a package, chip, die, plane, printed circuit board, and/or the like. The solid-state storage elements 116A-Y comprising the array 115 may be capable of independent operation. Accordingly, a first one of the solid-state storage elements 116A may be capable of performing a first storage operation while a second solid-state storage element 116B performs a different storage operation. For example, the solid-state storage element 116A may be configured to read data at a first physical address, while another solid-state storage element 116B reads data at a different physical address.

A solid-state storage array 115 may also be referred to as a logical storage element (LSE). As disclosed in further detail below, an array or logical storage element 115 may comprise logical storage units (rows 117). As used herein, a "logical storage unit" or row 117 refers to a logical construct combining two or more physical storage units, each physical storage unit on a respective column 118 of the array 115. A logical erase block refers to a set of two or more physical erase blocks, a logical page refers to a set of two or more pages, and so on. In some embodiments a logical erase block may comprise erase blocks within respective logical storage elements 115 and/or banks. Alternatively, a logical erase block may comprise erase blocks within a plurality of different arrays 115 and/or may span multiple banks of solid-state storage elements.

The storage module 130 may further comprise an adaptive storage module 113 configured to arrange data for storage on the solid-state storage array 115 according to an adaptive data layout. As used herein, an adaptive data layout refers to the layout of storage data segments within different portions of the solid-state storage array 115. As used herein, a data segment refers to a quantum of structured or unstructured data; a data segment may, therefore, include, but is not limited to: data pertaining to a storage request, data corresponding to one or more logical identifiers, one or more data blocks, a data structure, such as a data packet, container, or the like, a data set, such as a data range, extent, or the like, an ECC codeword, such as an ECC syndrome, an ECC symbol, an ECC chunk, or the like, unstructured data, structured data, a data record, or the like.

The adaptive storage module 113 may be configured to store data in a horizontal layout, which may comprise storing data segments horizontally within rows 117 of the array (e.g., across a plurality of the solid-state storage elements 116A-Y of the array 115). A vertical layout may comprise storing data segments within respective columns 118 of the array 115 (e.g., within a single solid-state storage elements 116A-Y). Other layouts may comprise storing data on subsets of the solid-state storage elements 116A-Y (e.g., sets of two, four, or more solid-state storage elements 116A-Y). The storage module 130 may comprise an adaptive storage profiling module 160 configured to determine an optimal data layout for the array 115 based on one or more of data read latency, stream latency, data access patterns, profiling information, desired data recovery characteristics, usage and/or the like.

In some embodiments, the storage module 130 further comprises a data recovery module 170. The data recovery module 170 may be configured to recover data stored on the solid-state storage medium 110. The storage module 130 may be configured to generate error recovery data, such as ECC data, parity data, and/or the like. The error recovery data may be stored on the solid-state storage medium 110. The ECC data may be used to detect and/or correct errors in data read from the array 115. Data comprising uncorrectable errors may be reconstructed by use of parity data. Uncorrectable errors may result from failure of a portion of a particular column 118 (e.g., failure of an erase block, plane, die, or other portion of a particular solid-state storage element 116A-Y). As disclosed in further detail herein, data corresponding to the failed column 118 may be reconstructed by use of data stored on other solid-state storage elements 116A-Y. In some embodiments, reconstructing data of a failed solid-state storage element 116A-Y may comprise reading one or more ECC codewords stored on other columns 118 of the array 115, correcting errors within the one or more other ECC codewords (e.g., decoding the ECC codewords), and using the corrected ECC codewords to reconstruct data of the failed element 116A-Y. The data recovery module 170 may comprise a parity substitution module 172 configured to reconstruct data of a failed column by use of error-corrected ECC codewords and/or parity data stored within the array 115. In some embodiments, data of the failed column may be reconstructed without decoding and/or correcting the other ECC codewords; if the other columns 118 have low error rates (and/or low levels of wear), the reconstruction module 170 may be configured to perform the parity substitution operations without first decoding and/or correcting the other ECC codewords.

Figure 2:
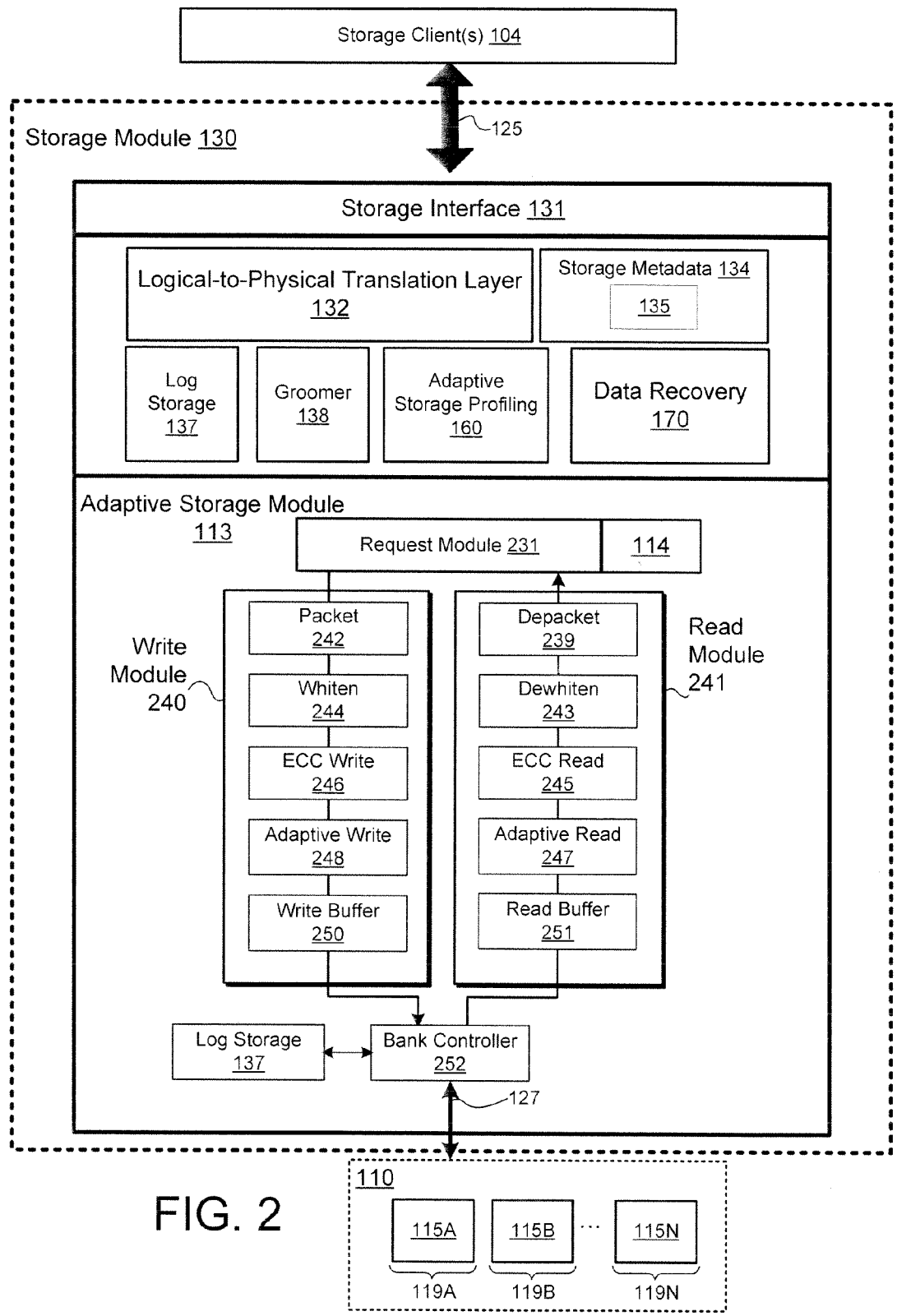
FIG. 2 is a block diagram of one embodiment of a storage module.

FIG. 2 is a block of one embodiment of a storage module 130 configured to manage data storage operations on a solid-state storage medium 110. In some embodiments, the solid-state storage medium 110 may comprise one or more independent banks 119A-N of solid-state storage arrays 115A-N. As disclosed above, each array 115A-N may comprise a plurality of solid-state storage elements communicatively coupled to the adaptive storage module 113 in parallel via a bus 127.

The adaptive storage module 113 may comprise a request module 231 configured to receive storage requests from the storage module 130 and/or other storage clients 104. The request module 231 may be configured to perform storage operations on the solid-state storage medium 110 in response to the requests, which may comprise transferring data to/from the storage module 130 and/or storage clients 104. Accordingly, the request module 231 may comprise one or more direct memory access (DMA) modules, remote DMA modules, bus controllers, bridges, buffers, and the like.

The adaptive storage module 113 may comprise a write module 240 configured to process data for storage on the solid-state storage medium 110. In some embodiments, the write module 240 comprises one or more modules configured to process and/or format data for storage on the solid-state storage medium 110, which may include, but are not limited to: a packet module 242, a whiten module 244, an ECC write module 246, an adaptive write module 248, and a write buffer 250. In some embodiments, the write module 240 may further comprise a compression module, configured to compress data for storage on the solid-state storage medium 110, one or more encryption modules configured to encrypt data for storage on the solid-state storage medium 110, and so on. The read module 241 may comprise one or more modules configured to process and/or format data read from the solid-state storage medium 110, which may include, but are not limited to: a read buffer 251, an adaptive read module 247, an ECC read module 245, a dewhiten module 243, and a depacket module 239.

In some embodiments, the write module 240 comprises a write pipeline configured to process data for storage in a plurality of pipeline stages or modules, as disclosed herein. Similarly, in some embodiments, the read module 241 may comprise a read pipeline configured to process data read from the solid-state storage array 115 in a plurality of pipeline stages or modules, as disclosed herein.

The packet module 242 may be configured to generate data packets comprising data to be stored on the solid-state storage medium 110. The write module 240 may be configured to store data in a contextual format, as disclosed above. The contextual format may comprise storing data in a packet format in which a logical interface of the data is associated with the data on the solid-state storage medium 110. In some embodiments, the packet format may include a packet header comprising one or more logical identifiers of the data contained within the packet, or the like. The contextual format may further comprise associating data packets with sequence information, to define, inter alia, a log-order of data packets on the solid-state storage medium 110. The sequence information may comprise sequence numbers, timestamps, or other indicators that indicate an order of the data packet relative to other data packets stored on the solid state storage medium 110. The storage module 130 may use the log-based, contextual format of data stored on the solid-state storage medium 110 to reconstruct portions of the storage metadata 135, which may include, but is not limited to: reconstructing any-to-any mappings between logical identifiers and physical storage locations maintained by the logical-to-translation layer 132, a forward index, a reverse index, and/or the like.

In some embodiments, the packet module 242 may be configured to generate packets of arbitrary lengths and/or sizes in accordance with the size of storage requests received via the request receiver module 231 and/or configuration preferences. The packet module 242 may be configured to generate packets of one or more pre-determined sizes. In one embodiment, in response to a request to write 24 k of data to the solid-state storage medium 110, the packet module 242 may be configured to generate 6 packets, each packet comprising 4 k of the data; in another embodiment, the packet module 242 may be configured to generate a single packet comprising 24 k of data in response to the request.

Figure 3:
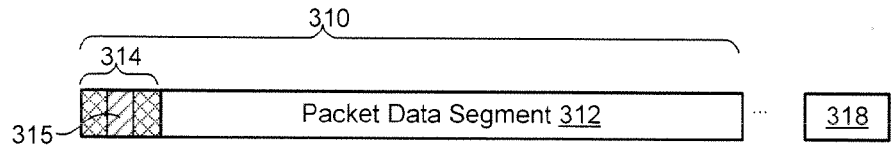
FIG. 3 depicts one embodiment of a packet.

FIG. 3 depicts one embodiment of a packet format. A packet 310 may comprise a packet data segment 312 and a header 314. As disclosed above, the packet data segment 312 may comprise an arbitrary amount of data to be stored on the solid-state storage medium 110. The header 314 may comprise contextual metadata pertaining to the packet 310. In some embodiments, the header 314 includes a logical identifier indicator 315, which may indicate one or more logical identifier(s) associated with the data segment. The header 315 may include other metadata, which may include, but is not limited to: a packet type metadata, a packet size and/or length metadata, access control metadata, and so on. The packet 310 may be associated with sequence information 318, which may determine a log order of the packet 310 relative to other packets on the solid-state storage medium 110. As depicted in FIG. 3, the sequence information 318 may be stored separately from the packet 310. In some embodiments, the sequence information 318 may be marked on the section of the solid-state storage medium 110 comprising the data packet 310 (e.g., erase block, logical erase block, row, or the like). Alternatively, or in addition, the sequence information 318 may be stored as part of the packet 310 (e.g., as a field within the header 314 of the packet 310).

The whiten module 244 may be configured to perform one or more whitening transformations on the data packets generated by the packet module 242. Data whitening may comprise decorrelating the data, which may provide wear-leveling benefits for certain types of storage media. In some embodiments, the whiten module 244 is configured to encrypt data for storage on the solid-state storage medium 110 in one or more of a media encryption key, a user encryption key, or the like.

The ECC write module 246 may be configured to encode data packets generated by the packet module 242 into respective ECC codewords. As used herein, an ECC codeword refers to data and corresponding error detection and/or correction information. The ECC write module 246 may be configured to implement any suitable ECC algorithm and may be configured to generate corresponding ECC information (e.g., ECC codewords). As used herein, ECC codewords include, but are not limited to: data segments and corresponding ECC syndromes, ECC symbols, ECC codeword symbols, ECC encoded data, ECC chunks, and/or other structured and/or unstructured ECC information and/or corresponding data. ECC codewords may comprise any suitable error-correcting encoding, including, but not limited to: block ECC encoding, convolutional ECC encoding, Low-Density Parity-Check (LDPC) encoding, Gallager encoding, Reed-Solomon encoding, Hamming codes, Multidimensional parity encoding, cyclic error-correcting codes, BCH codes, or the like. The ECC read module 245 may be configured to decode and/or correct ECC codewords generated by the ECC write module 246.

The ECC write module 246 may be configured to generate ECC codewords of a pre-determined size. Accordingly, a single packet may be encoded into a plurality of different ECC codewords and/or a single ECC codeword may comprise portions of two or more packets.

In some embodiments, the ECC write module 246 is configured to generate ECC codewords, each of which may comprise a data segment of length N and a syndrome of length S. For example, the ECC write module 246 may be configured to encode data segments into 240-byte ECC codewords, each ECC codeword comprising 224 bytes of data and 16 bytes of ECC data. In this embodiment, the ECC encoding may be capable of correcting more bit errors than the manufacturer of the solid-state storage medium 110 requires. In other embodiments, the ECC write module 246 may be configured to encode data in a symbolic ECC encoding, such that each data segment of length N produces a symbol of length X. The ECC write module 246 may encode data according to a selected ECC "strength." As used herein, the "strength" of an error-correcting code refers to the number of errors that can be detected and/or corrected by use of the error-correcting code. In some embodiments, the strength of the ECC encoding implemented by the ECC write module 246 may be adaptive and/or configurable. In some embodiments, the strength of the ECC encoding may be selected according to the reliability and/or error rate of the solid-state storage medium 110. As disclosed in further detail herein, the strength of the ECC encoding may be independent of the partitioning of the solid-state storage medium 110, which may allow the storage module 130 to select a suitable ECC encoding strength based on the conditions of the solid-state storage medium 110, user requirements, and the like, as opposed to static and/or pre-determined ECC settings imposed by the manufacturer of the medium 110.

Figure 4:
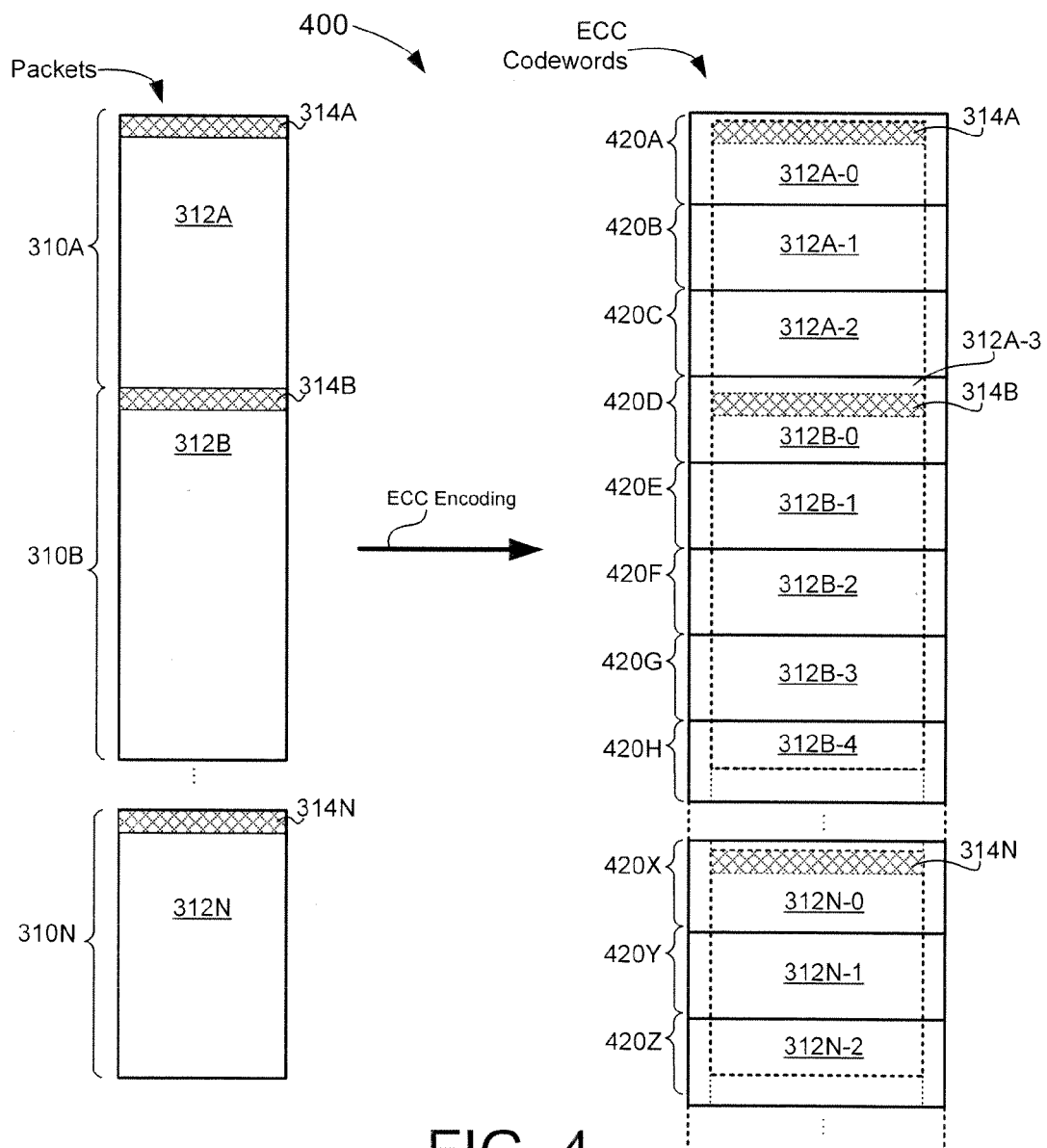
FIG. 4 depicts one embodiment of ECC codewords comprising one or more data segments.

FIG. 4 depicts one embodiment of data flow 400 between the packet module 242 and an ECC write module 246. For clarity, and to avoid obscuring the details of the depicted embodiment, other modules of the write module 240 are omitted (e.g., whiten module 244). The packet module 242 may be configured to generate packets 310A-310N in response to one or more requests to store data on the solid-state storage medium 110. The packets 310A-N may comprise respective packet data segments 312A, 312B, and 312N. The packets 310A-N may further comprise contextual metadata embodied in respective headers 314A, 314B, and 314N. The packets 310A-N may be processed by, inter alia, the ECC write module 246 to generate ECC codewords. In the FIG. 4 embodiment, the ECC codewords comprise ECC codewords 420A-420Z, each of which may comprise a portion of one or more of the packets 310A-N and a syndrome (not shown). In other embodiments, the ECC codewords may comprise ECC symbols or the like.

As illustrated in FIG. 4, the packets 310A-N may vary in size in accordance with the size of the respective packet data segments 312A-N and/or header information 314A-N. Alternatively, in some embodiments, the packet module 242 may be configured to generate packets 310A-N of a fixed, uniform size.

The ECC write module 246 may be configured to generate ECC codewords 420A-N having a uniform, fixed size; each ECC codeword 420A-N may comprise N bytes of packet data and S syndrome bytes, such that each ECC codeword 420A-N comprises N+S bytes. In some embodiments, each ECC codeword comprises 240 bytes, and includes 224 bytes of packet data (N) and 16 bytes of error correction code (S). The disclosed embodiments are not limited in this regard, however, and could be adapted to generate ECC codewords 420A-N of any suitable size, having any suitable ratio between N and S. Moreover, the ECC write module 242 may be further adapted to generate ECC symbols, or other ECC codewords, comprising any suitable ratio between data and ECC information.

As depicted in FIG. 4, the ECC codewords 420A-N may comprise portions of one or more packets 310A-N; ECC codeword 420D comprises data of packets 310A and 310B. The packets 310A-N may be spread between a plurality of different ECC codewords 420A-N: ECC codewords 420A-D comprise data of packet 310A; ECC codewords 420D-H comprise data of packet 310B; and ECC codewords 420X-Z comprise data of packet 310N.

Referring back to FIG. 2, the write module 240 may further comprise an adaptive write module 248 configured to buffer data to storage on one or more of the solid-state storage arrays 115A-N. As disclosed in further detail below, the adaptive write module 248 may be configured to store data within one or more columns 118 of a solid-state storage array 115. The adaptive write module 248 may be further configured to generate parity data corresponding to the layout and/or arrangement of the data. As disclosed in further detail below, the parity data may be configured to protect data stored within respective rows 117 of the solid-state storage array 115A-N, and may be generated in accordance with an adaptive storage layout implemented by the adaptive storage module 113.

In some embodiments, the write module 240 further comprises a write buffer 250 configured to buffer data for storage within respective page write buffers of the solid-state storage medium 110. The write buffer 250 may comprise one or more synchronization buffers to synchronize a clock domain of the adaptive storage module 113 with a clock domain of the solid-state storage medium 110 (and/or bus 127).

The log storage module 137 may be configured to select storage location(s) for data storage and/or may provide addressing and/or control information to the solid-state storage medium 110 via the bus 127. Accordingly, the log storage module 137 may provide for storing data sequentially at an append point within the physical address space of the solid-state storage medium 110. The physical address at which a particular data segment is stored may be independent of the logical interface (e.g., logical identifier) of the data segment. The logical-to-physical translation layer 132 may be configured to associate the logical interface of data segments (e.g., logical identifiers of the data segments) with the physical address(es) of the data segments on the solid-state storage medium 110. In some embodiments, the logical-to-physical translation layer 132 may leverage storage metadata 135 to perform logical-to-physical translations; the storage metadata 135 may include a forward index comprising arbitrary, any-to-any mappings between logical identifiers and physical addresses. The storage metadata 135 may be maintained in volatile memory, such as the volatile memory 106. In some embodiments, the storage metadata module 134 is configured to periodically store portions of the storage metadata 135 on a persistent storage medium, such as the solid-state storage medium 110, persistent storage 105, or the like.

The adaptive storage module 113 may further comprise a read module 241 that is configured to read data from the solid-state storage medium 110 in response to requests received via the request module 231. The read module 241 may be configured to process data read from the solid-state storage medium 110, and provide the processed data to the storage module 130 and/or a storage client 104 (by use of the request module 231). The read module 241 may comprise one or more modules configured to process and/or format data stored on the solid-state storage medium 110, which may include, but are not limited to: read buffer 251, an adaptive read module 247, ECC read module 245, a dewhiten module 243, and a depacket module 239. In some embodiments, the read module further includes a decompression module, configured to decompress compressed data stored on the solid-state storage medium 110, one or more decryption modules configured to decrypt encrypted data stored on the solid-state storage medium 110, and so on. Data processed by the read module 241 may flow to the storage module 130 and/or storage client 104 via the request module 231, and/or other interface or communication channel (e.g., the data may flow directly to/from a storage client via a DMA or remote DMA module of the storage module 130).

Read requests may comprise and/or reference the logical interface of the requested data, such as a logical identifier, a range and/or extent of logical identifiers, a set of logical identifiers, or the like. The physical addresses associated with data of the request may be determined based, at least in part, upon the logical-to-physical translation layer 132 (and/or the storage metadata 135), metadata pertaining to the layout of the data on the solid-state storage medium 110, and so on. Data may stream into the read module 241 via a read buffer 251. The read buffer 251 may read the contents of one or more page read buffers of the solid-storage storage elements 116A-N within the solid-state storage array 115A-N of one of the banks 119A-N. The read buffer 251 may comprise one or more synchronization buffers configured to synchronize a clock domain of the adaptive storage module 113 with a clock domain of the solid-state storage medium 110 (and/or bus 127).

The adaptive read module 247 may be configured to reconstruct one or more data segments from the contents of the read buffer 251. Reconstructing the data segments may comprise recombining and/or reordering contents of the read buffer (e.g., ECC codewords) read from various columns 118 in accordance with a layout of the data on the solid-state storage arrays 115A-N as indicated by the storage metadata 135. In some embodiments, reconstructing the data may comprise stripping data associated with one or more columns 118 from the read buffer, reordering data of one or more columns 118, and so on.

The read module 241 may comprise an ECC read module 245 configured to detect and/or correct errors in data read from the solid-state storage medium 110 using, inter alia, the ECC encoding of the data (e.g., as encoded by the ECC write module 246), parity data (e.g., using parity substitution), and so on. As disclosed above, the ECC encoding may be capable of detecting and/or correcting a pre-determined number of bit errors, in accordance with the strength of the ECC encoding. The ECC read module 245 may be capable of detecting more bit errors than can be corrected.

The ECC read module 245 may be configured to correct any "correctable" errors using the ECC encoding. In some embodiments, the ECC read module 245 may attempt to correct errors that cannot be corrected by use of the ECC encoding using other techniques, such as parity substitution, or the like. Alternatively, or in addition, the ECC read module 245 may attempt to recover data comprising uncorrectable errors from another source. For example, in some embodiments, data may be stored in a RAID configuration. In response to detecting an uncorrectable error, the ECC read module 245 may attempt to recover the data from the RAID, or other source of redundant data (e.g., a mirror, backup copy, or the like).

In some embodiments, the ECC read module 245 may be configured to generate an interrupt in response to reading data comprising uncorrectable errors. The interrupt may comprise a message indicating that the requested data is in error, and may indicate that the ECC read module 245 cannot correct the error using the ECC encoding. The message may comprise the data that includes the error (e.g., the "corrupted data").

The interrupt may be caught by the storage module 130 or other process. In some embodiments, the interrupt is received by the data recovery module 170, which, in response, may be configured to reconstruct the data using parity substitution, or other reconstruction technique, as disclosed herein. Parity substitution may comprise iteratively replacing portions of the corrupted data with a "parity mask" (e.g., all ones) until a parity calculation associated with the data is satisfied. The masked data may comprise the uncorrectable errors, and may be reconstructed using other portions of the data in conjunction with the parity data. Parity substitution may further comprise reading one or more ECC codewords from the solid-state storage array 115A-N (in accordance with an adaptive data structure layout on the array 115), correcting errors within the ECC codewords (e.g., decoding the ECC codewords), and reconstructing the data by use of the corrected ECC codewords and/or parity data. In some embodiments, the corrupted data may be reconstructed without first decoding and/or correcting errors within the ECC codewords.

Alternatively, data recovery module 170 may be configured to replace the corrupted data with another copy of the data, such as a backup or mirror copy, and then may use the replacement data of the requested data packet or return it to the read module 241. In another embodiment, the storage module 130 stores data in a RAID configuration, from which the corrupted data may be recovered, as described above.

As depicted in FIG. 2, the solid-state storage medium 110 may be arranged into a plurality of independent banks 119A-N. Each bank may comprise a plurality of solid-state storage elements arranged into respective solid-state storage arrays 115A-N, as disclosed above. The banks 119A-N may be configured to operate independently; the adaptive storage module 113 may configure a first bank 119A to perform a first storage operation while a second bank 119B is configured to perform a different storage operation. The adaptive storage module 113 may further comprise a bank controller 252 configured to selectively route data and/or commands between the adaptive storage module 113 and the banks 119A-N. In some embodiments, adaptive storage module 113 may be configured to read data from a bank 119A while filling the write buffer 250 for storage on another bank 119B and/or may interleave one or more storage operations between one or more banks 119A-N. Further embodiments of multi-bank storage operations and data pipelines are disclosed in U.S. Patent Application Publication No. 2008/0229079 (U.S. patent application Ser. No. 11/952,095), entitled "Apparatus, System, and Method for Managing Commands of Solid-State Storage Using Bank Interleave," filed Dec. 6, 2007 for David Flynn et al., which is hereby incorporated by reference in its entirety.

As disclosed above, the groomer module 138 may be configured to reclaim storage resources of the solid-state storage medium 110. The groomer module 138 may operate as an autonomous, background process, which may be suspended and/or deferred while other storage operations are in process. The log storage module 137 and groomer module 138 may manage storage operations so that data is systematically spread throughout a physical address space of the solid-state storage medium 110, which may improve performance and data reliability and avoid overuse and underuse of any particular storage locations, thereby lengthening the useful life of the solid-state storage medium 110 (e.g., wear-leveling, etc.). Accordingly, in some embodiments, the storage module 130 treats the physical address space of the solid-state storage medium 110 as a cycle. Data is incrementally appended to the solid-state storage medium 110 from an initial append point, which may correspond to a particular physical address within one or more of the banks 119A-N (e.g., physical address 0 of bank 119A). Upon reaching the end of the physical address space (e.g., physical address N of bank 119N), the append point reverts to the initial position (or next available storage location).

Operations to overwrite and/or modify data stored on the solid-state storage medium 110 may be performed "out-ofplace." The obsolete version of the data may remain on the storage medium 110 while the updated version of the data may be appended at the append point. Similarly, an operation to delete, erase, or TRIM data from the solid-state storage medium 110 may comprise indicating that the data is invalid (e.g., does not need to be retained on the solid-state storage medium 110). Marking data as invalid may comprise modifying a mapping between the logical identifier of the data and the physical address of the invalid data, marking the physical address as invalid in a reverse index, or the like.

The groomer module 138 may be configured to select selections of the solid-state storage medium 110 for recovery. As used herein, a "section" of the solid-state storage medium 110 may include, but is not limited to: an erase block, a logical erase block, a die, a plane, one or more pages, a portion of a solid-state storage element 116A-Y, a portion of a row 117 of a solid-state storage array 115, or the like. A section may be selected for grooming in response to various criteria, which may include, but are not limited to: age criteria (e.g., data refresh), error metrics, reliability metrics, wear metrics, resource availability criteria, an invalid data threshold, or the like. A grooming or storage recovery operation may comprise relocating valid data on the section (if any). The operation may further comprise preparing the section for reuse, which may comprise erasing the section, marking the section with a sequence indicator, such as the sequence indicator 318, and/or placing the section in a queue of storage sections that are available to store data. The groomer module 138 may be configured to schedule grooming operations with other storage operations and/or requests. In some embodiments, the adaptive storage module 113 may comprise a groomer bypass (not shown) configured to relocate data from a storage section by transferring data read from the section from the read module 241 directly into the write module 240 without being routed out of the adaptive storage module 113.

The adaptive write module 248 may be further configured to manage out-of-service conditions on the solid-state storage medium 110. As used herein, a section of the solid-state storage medium 110 that is "out-of-service" (OOS) refers to a section that is not currently being used to store valid data. The storage module 130 may be configured to monitor storage operations performed on the solid-state storage medium 110 and/or actively scan the solid-state storage medium 110 to identify sections that should be taken OOS. The storage metadata 135 may comprise OOS metadata that identifies OOS sections of the solid-state storage medium 110. The adaptive write module 248 may be configured to avoid OOS section by, inter alia, stream padding (and/or nonce) data to the write buffer such that padding data will map to the identified OOS sections. In some embodiments, the adaptive storage module 113 may be configured to manage OOS conditions by replacing OOS sections of the solid-state storage medium 110 with replacement sections. Alternatively, or in addition, a hybrid OOS approach may be employed. The padding approach to managing OOS conditions may be used in portions of the solid-state storage medium 110 comprising a relatively small number of OOS storage divisions; as the number of OOS sections increases, the solid-state adaptive storage module 113 may replace one or more of the OOS sections with replacements. Further embodiments of apparatus, systems, and methods for detecting and/or correcting data errors, and managing OOS conditions, are disclosed in U.S. Patent Application Publication No. 2009/0287956 (U.S. application Ser. No. 12/467,914), entitled "Apparatus, System, and Method for Detecting and Replacing a Failed Data Storage," filed May 18, 2009, and U.S. Patent Application Publication No. 2013/0019072 (U.S. application Ser. No. 13/354,215), entitled "Apparatus, System, and Method for Managing Out-of-Service Conditions," filed Jan. 19, 2012 for John Strasser et al., each of which is hereby incorporated by reference in its entirety.

As disclosed above, the solid-state storage medium 110 may comprise one or more solid-state storage arrays 115A-N. A solid-state storage array 115A-N may comprise a plurality of independent columns 118 (respective solid-state storage elements 116A-Y), which may be coupled to the adaptive storage module 113 in parallel via the bus 127. Accordingly, storage operations performed on an array 115A-N may be performed on each of the solid-state storage elements 116A-Y comprising the array 115A-N. Performing a storage operation on an array 115A-N may comprise performing the storage operation on each of the plurality of solid-state storage elements 116 comprising the array 115A-N: a read operation may comprise reading a physical storage unit (e.g., page) from a plurality of solid-state storage elements 116A-Y; a program operation may comprise programming a physical storage unit (e.g., page) on a plurality of solid-state storage elements 116A-Y; an erase operation may comprise erasing a section (e.g., erase block) on a plurality of solid-state storage elements 116A-Y; and so on. Accordingly, a program operation may comprise the write module 240 streaming data to program buffers of a plurality of solid-state storage elements 116A-Y (via the write buffer 250 and bus 127) and, when the respective program buffers are sufficiently full, issuing a program command to the solid-state storage elements 116A-Y. The program command may cause one or more storage units on each of the storage elements 116A-Y to be programmed in parallel.

Figure 5A:
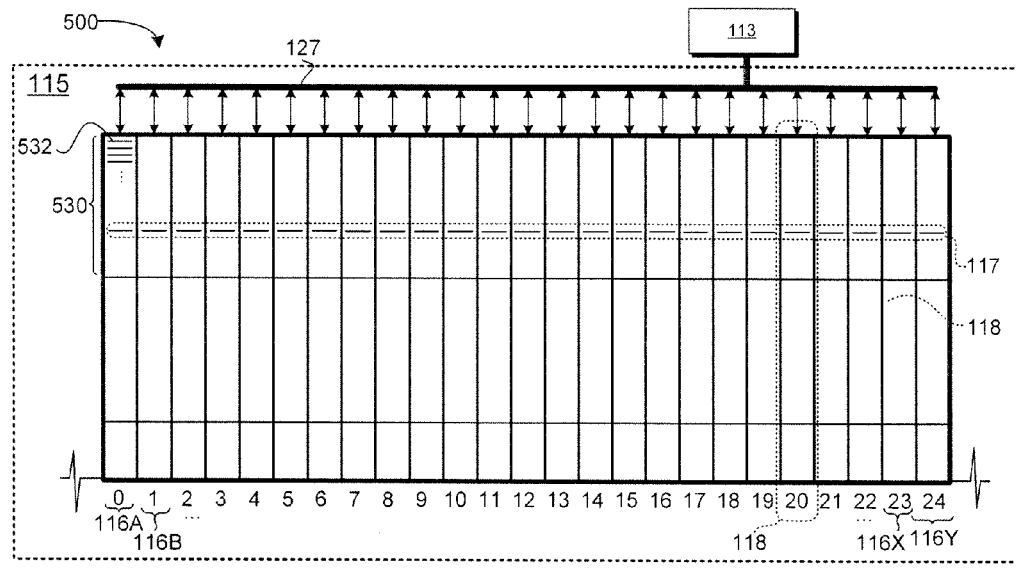
FIG. 5A is a block diagram depicting one embodiment of a solid-state storage array.

FIG. 5A depicts one embodiment 500 of a solid-state storage array 115. As disclosed above, the solid-state storage array 115 may comprise a plurality of independent columns 118, each of which may correspond to a respective solid-state storage element 116A-Y. The embodiment of a solid-state storage array 115 depicted in FIG. 5A comprises 25 columns 118 (e.g., solid-state storage element 0 116A through solid-state storage element 24 116Y). The solid-state storage elements 116A-Y comprising the array may be communicatively coupled to the adaptive storage module 113 in parallel by the bus 127. The bus 127 may be capable of communicating data, address, and/or control information to each of the solid-state storage elements 116A-Y. The parallel connection may allow the adaptive storage module 113 to manage the solid-state storage elements 116A-Y as a single, logical storage element (array 115), as described above.

The solid-state storage elements 116A-Y may be partitioned into sections, such as physical storage divisions 530 or physical erase blocks. Each erase block may comprise a plurality of physical storage units 532, such as pages. The physical storage units 532 within a physical storage division 530 may be erased as a group. Although FIG. 5A depicts a particular partitioning scheme, the disclosed embodiments are not limited in this regard, and could be adapted to use solid-state storage elements 116A-Y partitioned in any suitable manner.

As depicted in FIG. 5A, the columns 118 of the array 115 may correspond to respective solid-state storage elements 116A-Y. Accordingly, the array 115 of FIG. 5A comprises 25 columns 118. Rows of the array 117 may correspond to physical storage units 532 and/or 530 of a plurality of the columns 118.

Figure 5B:
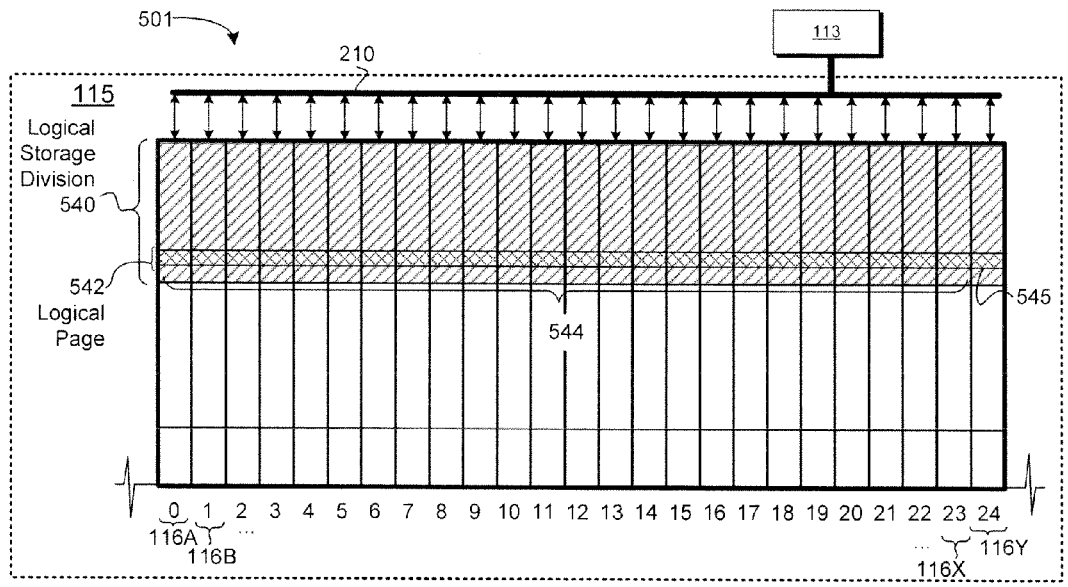
FIG. 5B is a block diagram depicting another embodiment of a solid-state storage array.

FIG. 5B is a block diagram 501 of another embodiment of a solid-state storage array 115. As disclosed above, the solid-state storage array 115 may comprise a plurality of rows 117, which may correspond to storage units on a plurality of different columns 118 within the array 115. The rows 117 of the solid-state storage array 115 may include logical storage divisions 540, which may comprise physical storage divisions on a plurality of the solid-state storage elements 116A-Y. In some embodiments, a logical storage division 540 may comprise a logical erase block, comprising physical erase blocks on each of the solid-state storage elements 116A-Y in the array 115. A logical page 542 may comprise physical storage units (e.g., pages) on a plurality of the solid-state storage elements 116A-Y.

Storage operations performed on the solid-state storage array 115 may operate on multiple solid-state storage elements 116A-Y: an operation to program data to a logical storage unit 542 may comprise programming data to each of 25 physical storage units (e.g., one storage unit per non-volatile storage element 116A-Y); an operation to read data from a logical storage unit 542 may comprise reading data from 25 physical storage units (e.g., pages); an operation to erase a logical storage division 540 may comprise erasing twenty-five physical storage divisions (e.g., erase blocks); and so on. Since the columns 118 are independent, storage operations may be performed across different sets and/or portions of the array 115. For example, a read operation on the array 115 may comprise reading data from physical storage unit 532 at a first physical address of solid-state storage element 116A and reading data from a physical storage unit 532 at a different physical address of one or more other solid-state storage elements 116B-N.

Arranging non-volatile storage elements 116A-Y into a solid-state storage array 115 may be used to address certain properties of the solid-state storage medium 110. Some embodiments may comprise an asymmetric solid-state storage medium 110; it may take longer to program data onto the solid-state storage elements 116A-Y than it takes to read data therefrom (e.g., 10 times as long). Moreover, in some cases, data may only be programmed to physical storage divisions 530 that have first been initialized (e.g., erased). Initialization operations may take longer than program operations (e.g., 10 times as long as a program, and by extension 100 times as long as a read operation). Managing groups of solid-state storage elements 116A-Y in an array 115 (and/or interleaved banks 119A-N as disclosed herein) may allow the storage module 130 to address the asymmetric properties of the solid-state storage medium 110. In some embodiments, the asymmetry in read, program, and/or erase operations is addressed by performing these operations on multiple solid-state storage elements 116A-Y in parallel. In the embodiment depicted in FIG. 5B, programming asymmetry may be addressed by programming 25 storage units in a logical storage unit 542 in parallel. Initialization operations may also be performed in parallel. Physical storage divisions 530 on each of the solid-state storage elements 116A-Y may be initialized as a group (e.g., as logical storage divisions 542), which may comprise erasing 25 physical erase blocks in parallel.

In some embodiments, portions of the solid-state storage array 115 may be configured to store data and other portions of the array 115 may be configured to store error detection and/or recovery information. Columns 118 used for data storage may be referred to as "data columns" and/or "data solid-state storage elements." Columns used to store data error detection and/or recovery information may be referred to as a "parity column" and/or "recovery column." The array 115 may be configured in an operational mode in which one of the solid-state storage elements 116Y is used to store parity data, whereas other solid-state storage elements 116A-X are used to store data. Accordingly, the array 115 may comprise data solid-state storage elements 116A-X and a recovery solid-state storage element 116Y. In this operational mode, the effective storage capacity of the rows (e.g., logical pages 542) may be reduced by one physical storage unit (e.g., reduced from 25 physical pages to 24 physical pages). As used herein, the "effective storage capacity" of a storage unit refers to the number of storage units or divisions that are available to store data and/or the total amount of data that can be stored on a logical storage unit. The operational mode described above may be referred to as a "24+1" configuration, denoting that 24 physical storage units 532 are available to store data, and one of the physical storage units 532 is used for parity. The disclosed embodiments are not limited to any particular operational mode and/or configuration, and could be adapted to use any number of the solid-state storage elements 116A-Y to store error detection and/or recovery data.

Figure 5C:
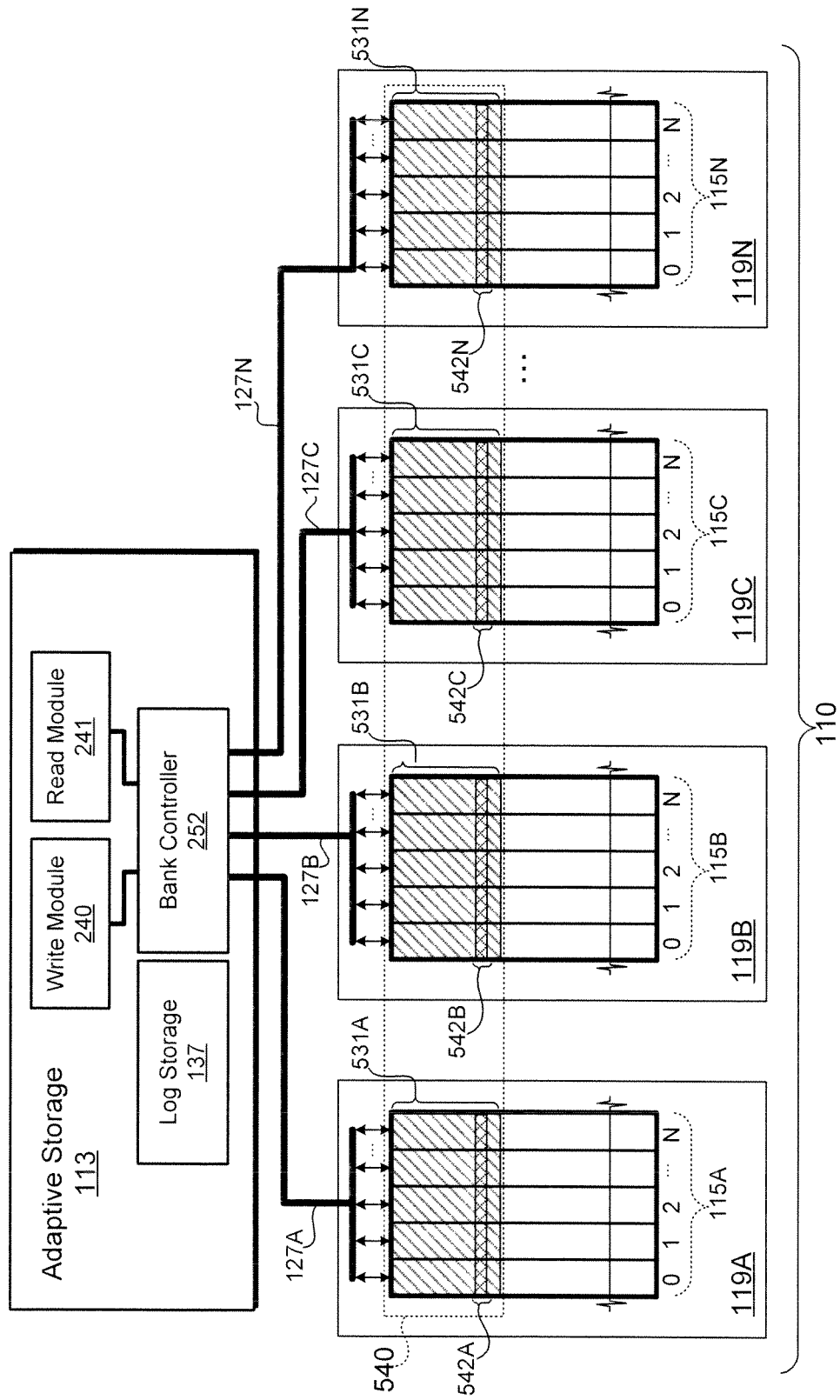
FIG. 5C is a block diagram depicting another embodiment of banks of solid-state storage arrays.

As disclosed above, the adaptive storage module 113 may be configured to interleave storage operations between a plurality of solid-state storage arrays 115A-N of independent banks 119A-N, which may further ameliorate asymmetry between erase, program, and read operations on the solid-state storage medium 110. FIG. 5C depicts one embodiment of an adaptive storage module 113 configured to manage logical erase blocks 540 that span multiple arrays 115A-N of multiple banks 119A-N. Each bank 119A-N may comprise one or more solid-state storage arrays 115A-N, which, as disclosed herein, may comprise a plurality of solid-state storage elements 116A-Y coupled in parallel by a respective bus 127A-N. The adaptive storage module 113 may be configured to perform storage operations on the storage elements 116A-Y of the arrays 119A-N in parallel and/or in response to a single command and/or signal.

Some operations performed by the adaptive storage module 113 may cross bank boundaries. The adaptive storage module 113 may be configured to manage groups of logical erase blocks 540 that include erase blocks of multiple arrays 115A-N within different respective banks 119A-N. Each group of logical erase blocks 540 may comprise erase blocks 531A-N on each of the arrays 115A-N. The erase blocks 531A-N comprising the logical erase block group 540 may be erased together (e.g., in response to a single erase command and/or signal or in response to a plurality of separate erase commands and/or signals). Performing erase operations on logical erase block groups 540 comprising large numbers of erase blocks 531A-N within multiple arrays 115A-N may further mask the asymmetric properties of the solid-state storage medium 110, as disclosed above.

The adaptive storage module 113 may be configured to perform some storage operations within boundaries of the arrays 115A-N and/or banks 119A-N. In some embodiments, the read, write, and/or program operations may be performed within rows 117 of the solid-state storage arrays 115A-N (e.g., on logical pages 542A-N within arrays 115A-N of respective banks 119A-N). As depicted in FIG. 5C, the logical pages 542A-N of the arrays 115A-N may not extend beyond single arrays 115A-N and/or banks 119A-N. The log storage module 137 and/or bank interleave module 252 may be configured to append data to the solid-state storage medium 110 by interleaving and/or scheduling storage operations sequentially between the arrays 115A-N of the banks 119A-N.

Figure 5D:
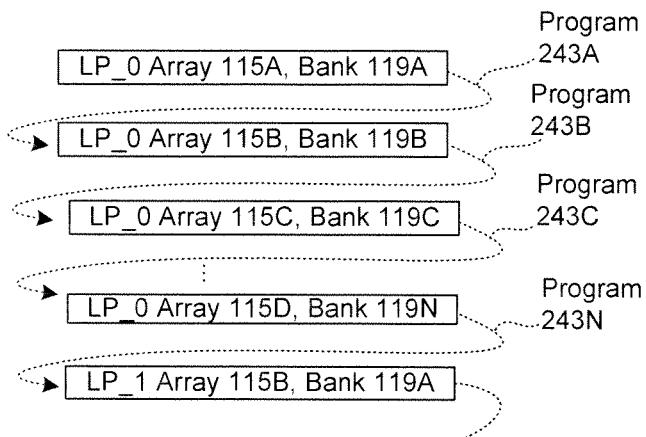
FIG. 5D depicts one embodiment of sequential bank interleave.

FIG. 5D depicts one embodiment of storage operations that are interleaved between solid-state storage arrays 115A-N of respective banks 119A-N. In the FIG. 5D embodiment, the bank interleave module 252 is configured to interleave programming operations between logical pages 542A-N (rows 117) of the arrays 115A-N within the banks 119A-N. As disclosed above, the write module 240 may comprise a write buffer 250, which may have sufficient capacity to fill program buffers of one or more logical pages 542A-N of an array 115A-N. In response to filling the write buffer 250 (e.g., buffering data sufficient to fill a portion of a logical page 542A-N), the adaptive storage module 113 may be configured to stream the contents of the write buffer 250 to program buffers of the solid-state storage elements 116A-Y comprising one of the banks 119A-N. The solid-state adaptive storage module 113 may then issue a program command and/or signal to the solid-state storage array 115A-N to store the contents of the program buffers to a specified logical page 542A-N. The log storage module 137 and/or bank interleave module 252 may be configured to provide control and addressing information to the solid-state storage elements 116A-Y of the array 115A-N using a bus 127A-N, as disclosed above.

The bank interleave module 252 may be configured to append data to the solid-state storage medium 110 by programming data to the arrays 115A-N in accordance with a sequential interleave pattern. The sequential interleave pattern may comprise programming data to a first logical page (LP_0) of array 115A within bank 119A, followed by the first logical page (LP_0) of array 115B within the next bank 119B, and so on, until data is programmed to the first logical page LP_0 of each array 115A-N within each of the banks 119A-N. As depicted in FIG. 5D, data may be programmed to the first logical page LP_0 of array 115A in bank 119A in a program operation 243A. The bank interleave module 252 may then stream data to the first logical page (LP_0) of the array 115B in the next bank 119B. The data may then be programmed to LP_0 of array 115B bank 119B in a program operation 243B. The program operation 243B may be performed concurrently with the program operation 243A on array 115A of bank 19A; the adaptive storage module 113 may stream data to array 115B and/or issue a command and/or signal for the program operation 243B, while the program operation 243A is being performed on the array 115A. Data may be streamed to and/or programmed on the first logical page (LP_0) of the arrays 115C-N of the other banks 119C-N following the same sequential interleave pattern (e.g., after data is streamed and/or programmed to LP_0 of array 115A of bank 119B, data is streamed and/or programmed to LP_0 of array 115C of bank 119C in program operation 243C, and so on). Following the programming operation 243N on LP_0 of array 115N within the last bank 119N, the bank interleave controller 252 may be configured to begin streaming and/or programming data to the next logical page (LP_1) of array 115A within the first bank 119A, and the interleave pattern may continue accordingly (e.g., program LP_1 of array 115B bank 119B, followed by LP_1 of array 115C bank 119C through LP_1 of array 115N bank 119N, followed by LP_2 of array 115A bank 119A, and so on).

Sequentially interleaving programming operations as disclosed herein may increase the time between concurrent programming operations on the same array 115A-N and/or bank 119A-N, which may reduce the likelihood that the adaptive storage module 113 will have to stall storage operations while waiting for a programming operation to complete. As disclosed above, programming operations may take significantly longer than other operations, such as read and/or data streaming operations (e.g., operations to stream the contents of the write buffer 250 to an array 115A-N via the bus 127A-N). The interleave pattern of FIG. 5D may be configured to avoid consecutive program operations on the same array 115A-N and/or bank 119A-N; programming operations on a particular array 115A-N may be separated by N–1 programming operations on other banks (e.g., programming operations on array 115A are separated by programming operations on arrays 115A-N). As such, programming operations on array 119A are likely to be complete before another programming operation needs to be performed on the array 119A.

Figure 5E:
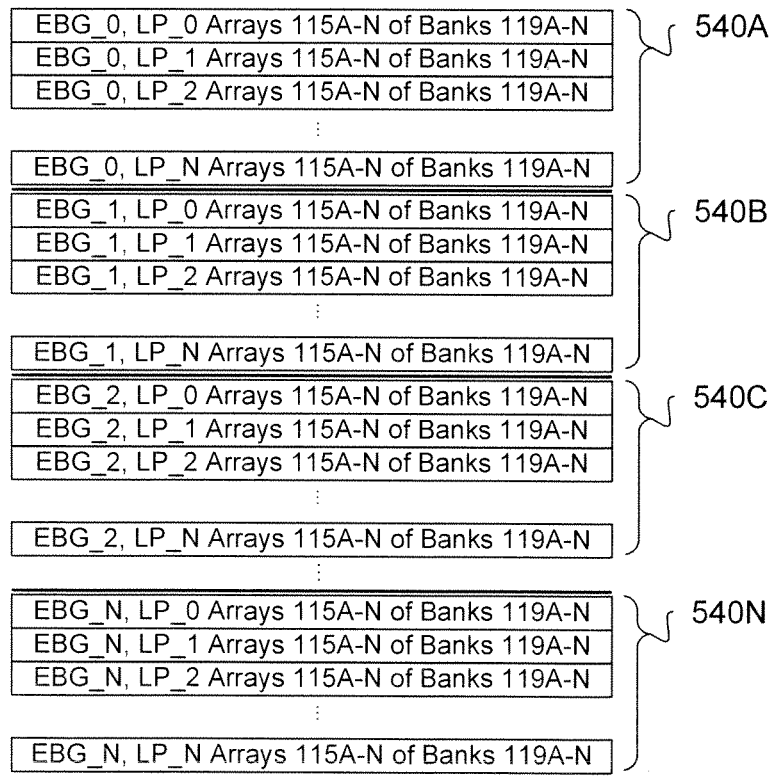
FIG. 5E depicts another embodiment of sequential bank interleave.

As depicted in FIG. 5D, the interleave pattern for programming operations may comprise programming data sequentially across rows (e.g., logical pages 542A-N) of a plurality of arrays 115A-N. As depicted in FIG. 5E, the interleave pattern may result in interleaving programming operations between arrays 115A-N of banks 119A-N, such that the erase blocks of each array 115A-N (erase block groups EBG_0-N) are filled at the same rate. The sequential interleave pattern programs data to the logical pages of the first erase block group EBG_0) in each array 115A-N before programming data to logical pages LP_0 through LP_N of the next erase block group (EBG_1), and so on (e.g., wherein each erase block comprises 0-N pages). The interleave pattern continues until the last erase block group EBG_N is filled, at which point the interleave pattern continues back at the first erase block group EBG_0.

The erase block groups of the arrays 115A-N may, therefore, be managed as logical erase blocks 540A-N that span the arrays 115A-N. Referring to FIG. 5C, a logical erase block group 540 may comprise erase blocks 531A-N on each of the arrays 115A-N within the banks 119A-N. As disclosed above, managing groups of erase blocks (e.g., logical erase block group 540) may comprise erasing each of the erase blocks 531A-N included in the group 540. In the FIG. 5E embodiment, erasing the logical erase block group 540A may comprise erasing EBG_0 of arrays 115A-N in banks 119A-N, erasing a logical erase block group 540B may comprise erasing EBG_1 of arrays 115A-N in banks 119A-N, erasing logical erase block group 540C may comprise erasing EBG_2 of arrays 115A-N in banks 119A-N, and erasing logical erase block group 540N may comprise erasing EBG_N of arrays 115A-N in banks 119A-N. Other operations, such as grooming, recovery, and the like may be performed at the granularity of the logical erase block groups 540A-N; recovering the logical erase block group 540A may comprise relocating valid data (if any) stored on EBG_0 on arrays 115A-N in banks 119A-N, erasing the erase blocks of each EBG_0 in arrays A-N, and so on. Accordingly, in embodiments comprising four banks 119A-N, each bank 119A-N comprising a respective solid-state storage array 115A-N comprising 25 storage elements 116A-Y, erasing, grooming, and/or recovering a logical erase block group 540 comprises erasing, grooming, and/or recovering one hundred physical erase blocks 530. Although particular multi-bank embodiments are described herein, the disclosure is not limited in this regard and could be configured using any multi-bank architecture comprising any number of banks 119A-N of arrays 115A-N comprising any number of solid-state storage elements 116A-Y.

Referring back to FIG. 1, the storage module 130 may be configured to store data segments in one or more different arrangements and/or layouts within a solid-state storage array 115. In some embodiments, data may be stored "horizontally" within rows 117 of the array 115 (e.g., horizontally within logical storage units 542 of the array 115). Accordingly, a datastructure, such as an ECC codeword or packet, may be spread across a plurality of the storage elements 116A-Y comprising the array 115. In some embodiments, data may be stored horizontally within one or more "channels" within the array 115. As used herein, a channel refers to a subset of one or more independent columns 118 of the array 115. Data may be arranged horizontally within the channels. An array 115 comprising N columns 118 used for storing data may be divided into a configurable number of independent channels X, each comprising Y columns 118 of the array 115.

In the FIG. 1 embodiment having a "24+1" configuration that comprises 24 columns 118 for storing data, the channel configurations may include, but are not limited to: 24 channels each comprising a single column 118; 12 channels each comprising two solid-state storage elements; eight channels each comprising three solid-state storage elements; six channels each comprising six columns 118; and so on. In some embodiments, the array 115 may be divided into heterogeneous channels, such as a first channel comprising 12 columns 118 and six other channels each comprising two columns 118.

Figure 6A:
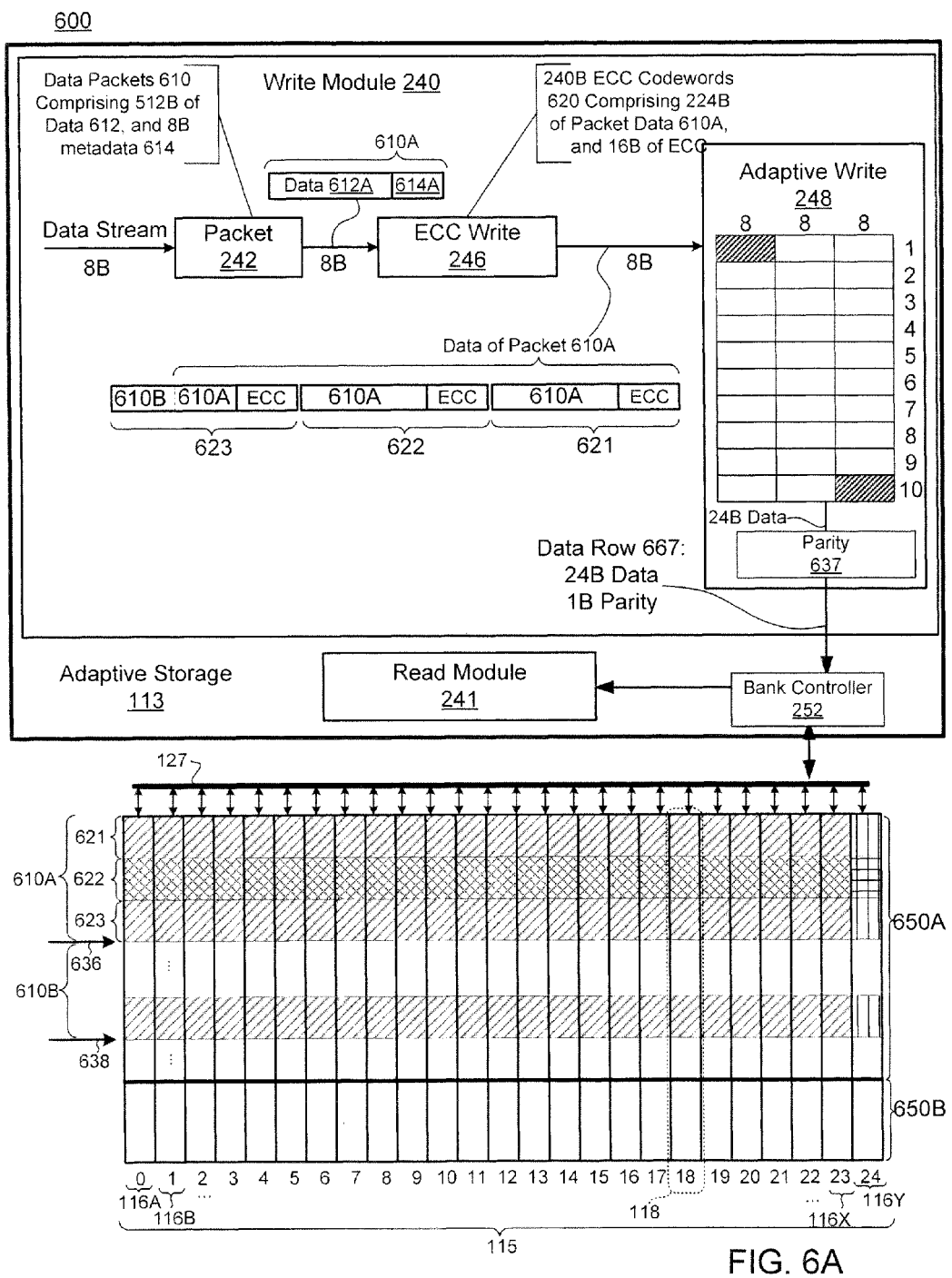
FIG. 6A is a block diagram of one embodiment of a system for adaptive data storage.

FIG. 6A is a block diagram of one embodiment of a system 600 for adaptive data storage. The system 600 may comprise a solid-state storage array 115 comprising 25 solid-state storage elements 116A-Y operating in a "24+1" configuration, in which 24 of the solid-state storage elements 116A-X are used to store data, and one storage element (116Y) is used to store parity data.

The write module 240 may comprise a packet module 242 configured to generate data packets comprising data for storage on the array 115, as disclosed above. In the FIG. 6A embodiment, the packet module 242 is configured to format data into a packet format 610, comprising a packet data segment 612 and metadata 614 (e.g., header). The header may comprise a logical identifier associated with the packet data segment 612, a sequence number, or the like, as disclosed above. In the FIG. 6A embodiment, the packet module 242 is configured to generate packets 610 of a fixed size (520-byte packet data segment 612 and 8 bytes of metadata 614).

The ECC write module 246 is configured to generate ECC datastructures (ECC codewords 620) comprising portions of one or more packets 610 as disclosed above. The ECC codewords 620 may be of a fixed size. In the FIG. 6A example, each ECC codeword 620 comprises 224 bytes of packet data and a 16-byte error-correcting code or syndrome. Although particular sizes and/or configurations of packets 610 and ECC codewords are disclosed herein, the disclosure is not limited in this regard and could be adapted to use any size packets 610 and/or ECC codewords 620. Moreover, in some embodiments, the size of the datastructures (e.g., packets 610 and/or ECC codewords 620) may vary. For example, the size and/or contents of the packets 610 and/or ECC codewords 620 may be adapted according to out-of-service conditions, as disclosed above.

Data of the packet 610A may be included in a plurality of ECC codewords 620 (e.g., ECC codewords 621, 622, and 623). The ECC codeword 621 may comprise 224 bytes of the packet 610A, the ECC codeword 622 may comprise another 224 bytes of the packet 610A, and the ECC codeword 623 may comprise the remaining 72 bytes of the packet 610A and 152 bytes of the next packet 610B.

The adaptive write module 248 may be configured to layout data horizontally within rows of the array 115. The adaptive write module 248 may be configured to buffer and/or arrange data segments (e.g., the ECC codewords 621, 622, and 623) into 24-byte segments. The adaptive write module 248 may be capable of buffering one or more ECC codewords 620. For example, the write buffer 320 may comprise 10 24-byte rows, which is sufficient to buffer a full 240-byte ECC codeword 620.

The adaptive write module 248 may be further configured to stream 24-byte segments to a parity module 637, which may be configured to generate a parity byte for each 24-byte segment. The adaptive write module 248 streams the resulting 25 bytes to the array 115 via the bank controller 252 and bus 127 (and/or write buffer 250, as disclosed above). The adaptive storage module 113 may be configured to stream data from the adaptive write module 248 to program buffers of the solid-state storage array 115 (e.g., stream to a program buffer of one of the solid-state storage elements 116A-Y). Accordingly, each cycle of bus 127 may comprise transferring a byte to the program buffer of a respective column 118; solid-state storage elements 116A-X receive data bytes and solid-state storage element 116Y receives the parity byte generated by the parity module 637. Data of the ECC codewords 620 may be byte-wise interleaved between the solid-state storage elements 116A-X; each solid-state storage element 116A-X receives 10 bytes of each 240-byte ECC codeword 620. Accordingly, the adaptive write module 248 may be configured to stream "data rows" 667 to the solid-state storage array 115. As used herein, a data row 667 refers to a data set comprising data for each of a plurality of columns 118 within the array 115. The data row 667 may comprise a byte of data for each column 0-23. The data row 667 may further comprise a parity byte corresponding to the data bytes (e.g., a parity byte corresponding to the data bytes for columns 0-23). The data row 667 may be streamed to respective program buffers of the solid-state storage elements 116A-Y on the bus 127. In the horizontal data configuration of FIG. 6A, streaming a 240-byte ECC codeword 620 to the array 115 may comprise streaming 10 separate data rows 667 to the array 115, each data row comprising 24 data bytes (one for each data solid-state storage element 116A-X) and a corresponding parity byte.

The storage location or offset 636 of the packet 610A within the logical page 650A may be determined based upon the horizontal layout of the data packet 610A. The offset 636 may identify the location of the ECC codewords 621, 622, and/or 623 comprising the packet 610A (and/or may identify the location of the last ECC codeword 623 comprising data of the packet 610A). Accordingly, in some embodiments, the offset may be relative to one or more datastructures on the array 115 (e.g., a packet offset and/or ECC codeword offset). Another offset 638 may identify the location of the last ECC codeword of a next packet 610 (e.g., packet 610B), and so on.

As depicted in FIG. 6A, each of the ECC codewords 621, 622, and 623 are horizontally spread across the storage elements 116A-Y comprising the logical page 650A (e.g., 10 bytes of the ECC codewords 621, 622, and 623 are stored on each solid-state storage element 116A-X). Accessing the packet 610A may, therefore, comprise accessing each of the ECC codewords 621, 622, and 623 (and each of the storage elements 116A-X).

Figure 6B:
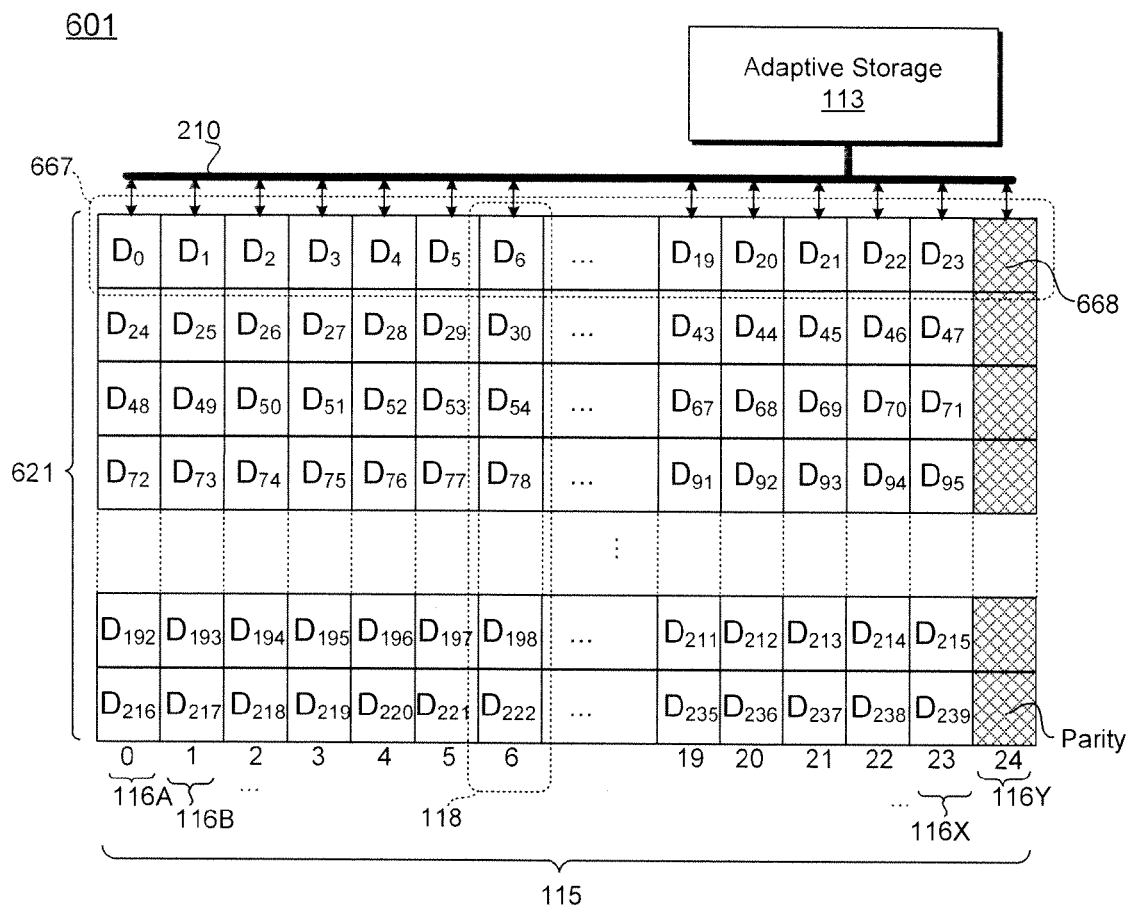
FIG. 6B depicts one embodiment of horizontal, adaptive data storage.

FIG. 6B depicts one embodiment of horizontal, adaptive data storage 601. The FIG. 6B embodiment depicts a horizontal layout 601 of the ECC codeword 621 on the array 115 of FIG. 6A. Data $D_0$ denotes a first byte of the ECC codeword 621, and data $D_{239}$ denotes the last byte (byte 240) of the ECC codeword 621. As illustrated in FIG. 6B, each column 118 of the solid-state storage array 115 comprises 10 bytes of the ECC codeword 621, and the data of the ECC codeword 621 is horizontally spread across a row 117 of the array 115 (e.g., horizontally spread across solid-state storage elements 116A-X of the array 115). FIG. 6B also depicts a data row 667 as streamed to (and stored on) the solid-state storage array 115. As illustrated in FIG. 6B, the data row 667 comprises bytes 0 through 23 of the ECC codeword D, each stored on a respective one of the columns 118. The data row 667 further comprises a parity byte 668 corresponding to the contents of the data row 667 (bytes $D_0$ through $D_{23}$).

Since the data is spread across the columns 0-23 (solid-state storage elements 116A-X), reading data of the ECC codeword 621 may require accessing a plurality of columns 118. Moreover, the smallest read unit may be an ECC codeword 620 (and/or packet 610). Reading a packet 310 stored horizontally on the solid-state storage array 115 may, therefore, incur significant overhead. Referring back to FIG. 6A, reading the packet 610A may require transferring data of the logical page 650A into respective read buffers of the storage elements 116A-X (e.g., storage elements 0 through 23). Transferring the contents of a page into the read buffer may incur a latency of Tr (read latency). As used herein, read time or read latency Tr refers to the time needed to transfer the contents of a physical storage unit (e.g., physical page) into a read buffer of a solid-state storage element 116A-Y. In the FIG. 6A embodiment, the read time Tr may, therefore, refer to the time required to transfer a physical page of each of the solid-state storage elements 116A-X into a respective read buffer. Accordingly, the read time Tr of a logical storage unit 650 may correspond to the "slowest" read time of the constituent storage elements 116A-X.

In the FIG. 6A embodiment, each ECC codeword comprises 240 bytes, and each packet comprises 520 bytes. The size of a logical page, however, may be much larger. For example, each page may comprise 2 kb (or more), and as such, a logical page may comprise 48 kb. Accordingly, reading a packet may require transferring 48 kb of data to access 520 bytes (or less) of data.

Upon transferring the data into the respective read buffers, data may be streamed into the read module 241 by way of the 24-byte storage bus 127 (and bank controller 252). The stream time (Ts) may refer to the time required to stream the ECC codeword 620 (or packet 610) into the pipeline 241. In the horizontal layout of FIG. 6A, the stream time Ts may be 10 cycles of the bus 127 because, as disclosed above, each column 118 comprises 10 bytes of the ECC codeword 620. Therefore, although the horizontal arrangement incurs a high retrieval overhead, the stream overhead is relatively low (only 10 clock cycles).

Given the data arrangement within the solid-state storage array 115, and the latencies disclosed herein, an input/output operations per second (IOPS) metric may be quantified. The IOPS to read an ECC codeword 620 may be expressed as:

$$IOPS_r = \frac{C}{(Tr + Ts)} \quad \text{Eq. 1}$$

In Equation 1, Tr is the read time of the solid-state storage elements 116A-Y, Ts is the stream time (e.g., the clock speed times the number of cycles required), and C is the number of independent columns used 118 to store the data. Equation 1 may be scaled by the number of independent banks 119A-N available to the adaptive storage module 113. In the horizontal data structure layout of FIGS. 6A and 6B, Equation 1 may be expressed as:

$$IOPS_r = \frac{24}{(Tr + 10*Sc)} \quad \text{Eq. 2}$$

In Equation 2, the number of columns is 24, and Sc is the cycle time of the bus 127. The cycle time is scaled by 10 since, as disclosed above, a horizontal 240-byte ECC codeword 620 may be streamed in 10 cycles of the bus 127.

The storage module may be configured to store data in different configurations, layouts, and/or arrangements on the solid-state storage medium 110. As disclosed above, in some embodiments, the adaptive write module 248 is configured to arrange data within respective independent columns, each comprising a subset of the columns 118 of the solid-state storage array 115 (e.g., subsets of the solid-state storage elements 116A-Y). Alternatively, or in addition, the adaptive write module 248 may be configured to store data vertically within respective "vertical stripes." The vertical stripes may have a configurable depth, which may be a factor of the page size of the solid-state storage elements 116A-Y comprising the array 115.

Figure 6C:
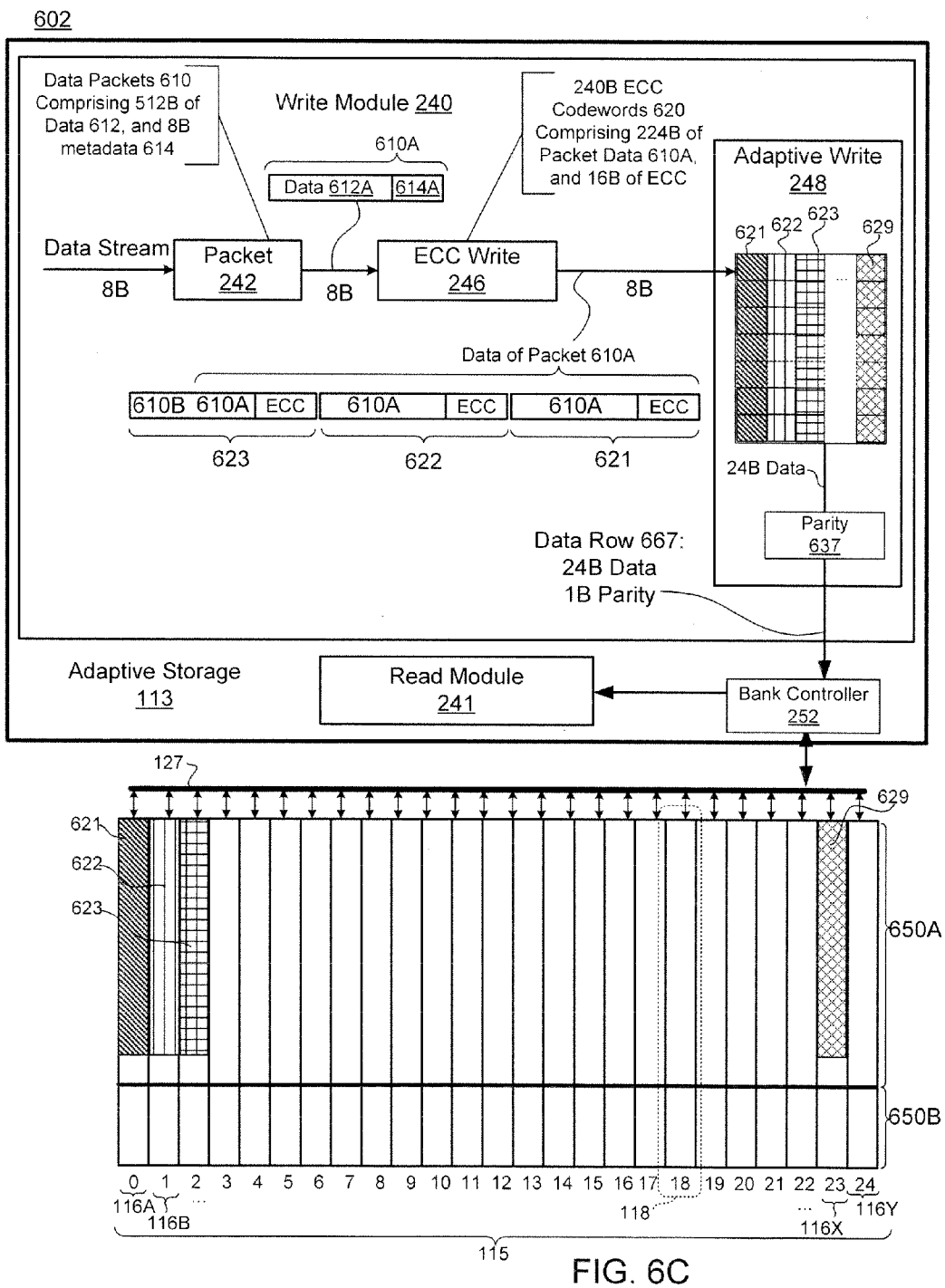
FIG. 6C is a block diagram of another embodiment of a system for adaptive data storage.

FIG. 6C depicts another embodiment of a system 602 for adaptive data layout. In the FIG. 6C embodiment, the adaptive write module 248 may be configured to store data in a vertical layout within the array 115. The adaptive write module 248 may be configured to buffer ECC codewords 620 for storage on respective columns 118 of the solid-state storage array 115 (including the ECC codewords 621, 622, and 623 disclosed herein). The ECC codewords 620 may be streamed to respective columns 118 of the array through a write buffer 250 (not shown). Accordingly, each cycle of the bus 127 may comprise streaming a byte of a different respective ECC codeword 610 to each of the columns 116A-X. The adaptive write module 248 may be further configured to generate parity data 637 corresponding to the different ECC codewords 610 for storage on a parity column (e.g., solid-state storage element 116Y). Accordingly, each stream cycle may comprise streaming a byte of a respective ECC codeword 610 to a respective column 118 along with a corresponding parity byte to a parity column 118.

As depicted in FIG. 6C, the adaptive write module 248 may be configured to buffer and rotate ECC codewords for vertical storage within respective columns 118 of the array 115: the ECC codeword 621 may stream to (and be stored vertically on) column 0 (solid-state storage element 116A), the ECC codeword 622 may be stored vertically on column 1 (solid-state storage element 116B), the ECC codeword 623 may be stored vertically on column 2 (solid-state storage element 116C), and so on (the ECC codeword 629 may be stored vertically in the column 23, solid-state storage element 116X). Column 24 (solid-state storage element 116Y) may be configured to store parity data corresponding to the ECC codewords, as disclosed above. Alternatively, the parity column 24 may be used to store additional ECC codeword data.

In some embodiments, the adaptive storage module 113 may comprise a plurality of packet modules 242 and/or ECC write modules 246 (e.g., multiple, independent write modules 240) configured to operate in parallel. Data of the parallel write modules 240 may flow into the adaptive write module 248 in a checkerboard pattern such that the data is arranged in the vertical format disclosed herein.

The vertical arrangement of FIG. 6C may store data of each ECC codeword 620 within a respective column 118 of the array 115. Accordingly, each data row 667 streamed to the array 115 may comprise a byte corresponding to a respective ECC codeword 620. The data row 667 may further comprise a corresponding parity byte; the data rows 667 may be configured to stream data of respective ECC codewords 660 to program buffers of respective data columns (e.g., solid-state storage elements 116A-Y), and a corresponding parity byte to a parity column (e.g., column 116Y). Accordingly, the data rows 667 may be stored with byte-wise parity information, each byte of a row 667, and stored within the solid-state storage elements 116A-X, may be reconstructed by use of the other bytes in the row 667 (and stored in other solid-state storage elements 116A-X) and the corresponding parity byte.

Figure 6D:
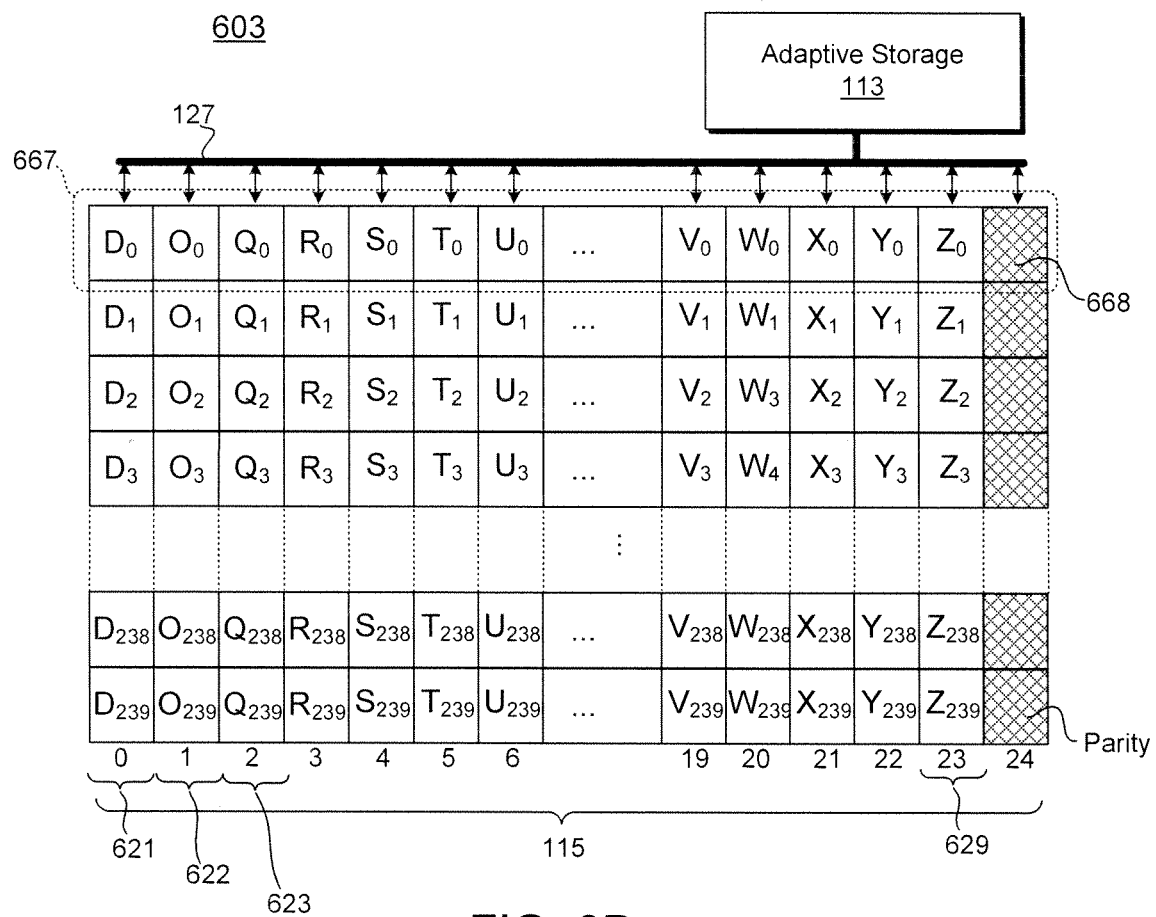
FIG. 6D depicts one embodiment of vertical, adaptive data storage.

FIG. 6D depicts one embodiment of vertical, adaptive data storage 603. The FIG. 6D embodiment illustrates a vertical storage configuration within the solid-state storage array 115.

As illustrated in FIG. 6D, data $D_0$ through $D_{239}$ of the ECC codeword 621 is stored vertically in column 0, Data $O_0$ through $O_{239}$ of ECC codeword 622 is stored vertically in column 1, Data $Q_0$ through $Q_{239}$ of ECC codeword 623 is stored vertically in column 2, and data $Z_0$ through $Z_{239}$ of ECC codeword 629 is stored vertically in column 23. The vertical storage configuration of other data of other ECC codewords 620 (R-Y) is also depicted.

FIG. 6D also depicts one embodiment of a data row 667 as streamed to, and stored on, the solid-state storage array 115. As illustrated in FIG. 6D, the data row 667 comprises a byte of each of a plurality of ECC codewords 620 (ECC codewords D, O, R, S, T, U . . . V, W, X, Y, and Z), each of which is streamed to, and stored within, a respective column 118 (respective solid-state storage element 116A-X). The data row 667 further comprises a parity byte 668 corresponding to the data within the data row 667. Accordingly, the parity byte 668 corresponds to byte 0 of ECC codewords D, O, R, S, T, U . . . V, W, X, Y, and Z.

The vertical configuration of FIGS. 6C and 6D may result in a different IOPS metric. The vertical arrangement of the ECC codewords 620 may reduce overhead due to read time Tr, but may increase the stream overhead Ts. As data is streamed from a logical storage element 116A-Y, each byte on the bus 127 may correspond to a different, respective data segment (e.g., different ECC codeword 620). As such, 24 different ECC codewords 620 may be streamed in parallel (as opposed to streaming a single ECC codeword 620 as in the horizontal arrangement example). Moreover, since each column may be independently addressable, each transferred logical page may comprise data of a separate request (e.g., may represent data of 24 different read requests). However, since each ECC codeword is arranged vertically, the stream time Ts for an ECC codeword 620 may be increased; the stream time of 240-byte ECC codewords 620 in a vertical configuration may be 240 cycles, as opposed to 10 cycles in the fully horizontal layout of FIGS. 6A and 6B. The IOPS metric for a single ECC codeword 620, therefore, may be represented as:

$$IOPS_r = \frac{1}{(T_r + 240 * S_c)} \quad \text{Eq. 3}$$

The reduced IOPS metric may be offset by the increased throughput (reduced read overhead) and/or different Tr and Ts latency times. These considerations may vary from device to device and/or application to application. Moreover, the IOPS metric may be ameliorated by the fact that multiple, independent ECC codewords 620 can be streamed simultaneously. Therefore, in some embodiments, the data layout used by the storage module 130 (and adaptive write module 248) may be configurable (e.g., by a user setting or preference, firmware update, or the like).

Figure 6E:
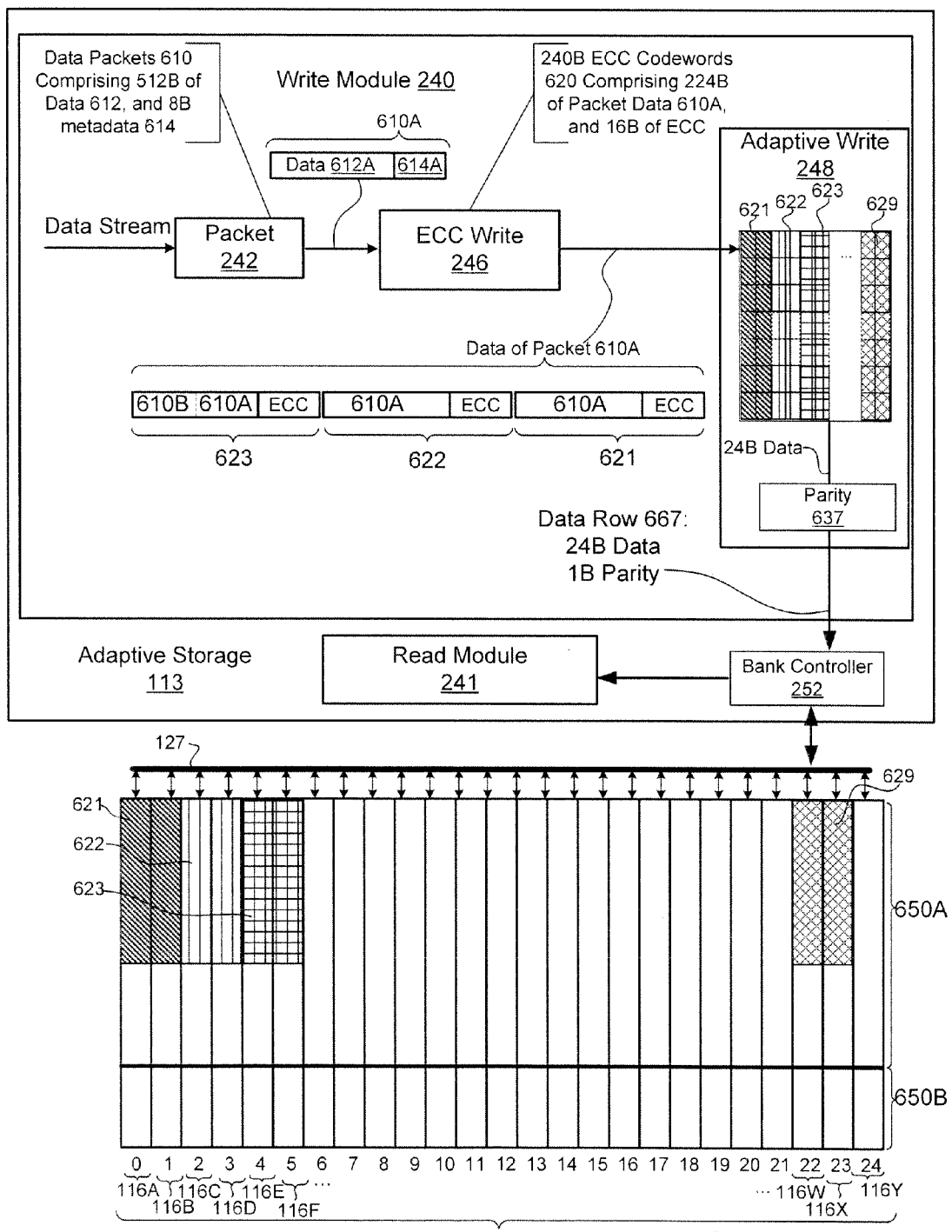
FIG. 6E is a block diagram of another embodiment of a system for adaptive data storage.

As disclosed above, in some embodiments, the adaptive write module 248 may be configured to layout and/or arrange data in an adaptive channel configuration. As used herein, an adaptive channel configuration refers to a data layout in which the columns 118 of the array 115 are divided into a plurality of independent channels, each channel comprising a set of columns 118 of the solid-state storage array 115. The channels may comprise subsets of the solid-state storage elements 116A-Y. In some embodiments, an adaptive channel configuration may comprise a fully horizontal data layout, in which data segments are stored within a channel comprising 24 columns 118 of the array 115, as disclosed in conjunction with FIGS. 6A and 6B. In other embodiments, the adaptive channel configuration may comprise a vertical configuration, in which data segments are stored within one of 24 different channels, each comprising a single column 118 of the array 115, as disclosed in conjunction with FIGS. 6C and 6D. In other embodiments, the adaptive storage module 248 may be configured to store data in other adaptive channel configurations and/or layouts on the solid-state storage array 115. FIG. 6E depicts another embodiment of a system 604 for adaptive data storage. In the FIG. 6E embodiment, the adaptive storage module 113 is configured to store data structures of adaptive channels comprising two solid-state storage elements 116A-Y (two independent columns 118 per channel). Accordingly, data segments may be stored within two columns 118 of the array. In the FIG. 6E embodiment, the adaptive write module 248 may be configured to buffer 12 ECC codewords 620 to stream to the array 115. Each of the 12 ECC codewords 620 may stream to a respective set of two columns 118 within the array 115.

In alternative adaptive channel configurations, the adaptive write module 248 may be configured to buffer 24/N ECC codewords 620, where N corresponds to the configuration of the adaptive channels used for each ECC codeword 620. ECC codewords 620 may be stored within channels comprising N independent columns 118. Accordingly, the horizontal arrangement of FIGS. 6A and 6B could be referred to as an adaptive channel configuration comprising 24 column channels, and the vertical data structure configuration of FIGS. 6C and 6D may be referred to as an adaptive channel configuration comprising single column channels. The adaptive storage module 113 may be configured to arrange data in any suitable hybrid arrangement, including heterogeneous virtual columns. For example, the adaptive write module 248 may be configured to buffer six (6) ECC codewords 620 in a four-column adaptive channel configuration (e.g., store ECC codewords 620 across each of four columns), buffer four ECC codewords 620 in a six-column adaptive channel configuration (e.g. store ECC codewords 620 across each of six columns), and so on.

In some embodiments, data structures may be arranged in adjacent columns 118 within the array 115 (e.g., a data structure may be stored in columns 0-4). Alternatively, columns may be non-adjacent and/or interleaved with other data structures (e.g., a data structure may be stored on columns 0, 2, 4, and 6 and another data structure may be stored on columns 2, 3, 5, and 7). The adaptive write module 248 may be configured to adapt the data arrangement to out-of-service conditions; if a column 118 (or portion thereof) is OOS, the adaptive storage module 113 may be configured to adapt the data arrangement accordingly (e.g., arrange data to avoid the OOS portions of the array 115, as disclosed above).

FIG. 6E depicts an embodiment of data layout within channels comprising two column of the array 115 (e.g., two solid-state storage elements 116A-X per channel). Accordingly, each data row 667 may comprise two bytes of each of twelve different ECC codewords 620 and a corresponding parity byte. The data row 667 may comprise two bytes of ECC codeword 621, two bytes of ECC codeword 622, two bytes of ECC codeword 623, and so on. On each cycle of the bus 127, two bytes of each ECC codeword 620 (e.g., ECC codewords 621, 622, 623, 629, and so on) are transferred to program buffers of respective solid-state storage elements 116A-X. Data of the ECC codeword D 621 may be streamed to a first channel comprising columns 0 and 1 (solid-state storage elements 116A-B), the ECC codeword 622 may be streamed to a second channel comprising columns 2 and 3 (solid-state storage elements 116C-D), the ECC codeword 623 may be streamed to a third channel comprising columns 4 and 5 (solid-state storage elements 116E-F), the ECC codeword 629 may be streamed to a last channel comprising columns 22 and 23 (solid-state storage elements 116W-X), and so on.

Figure 6F:
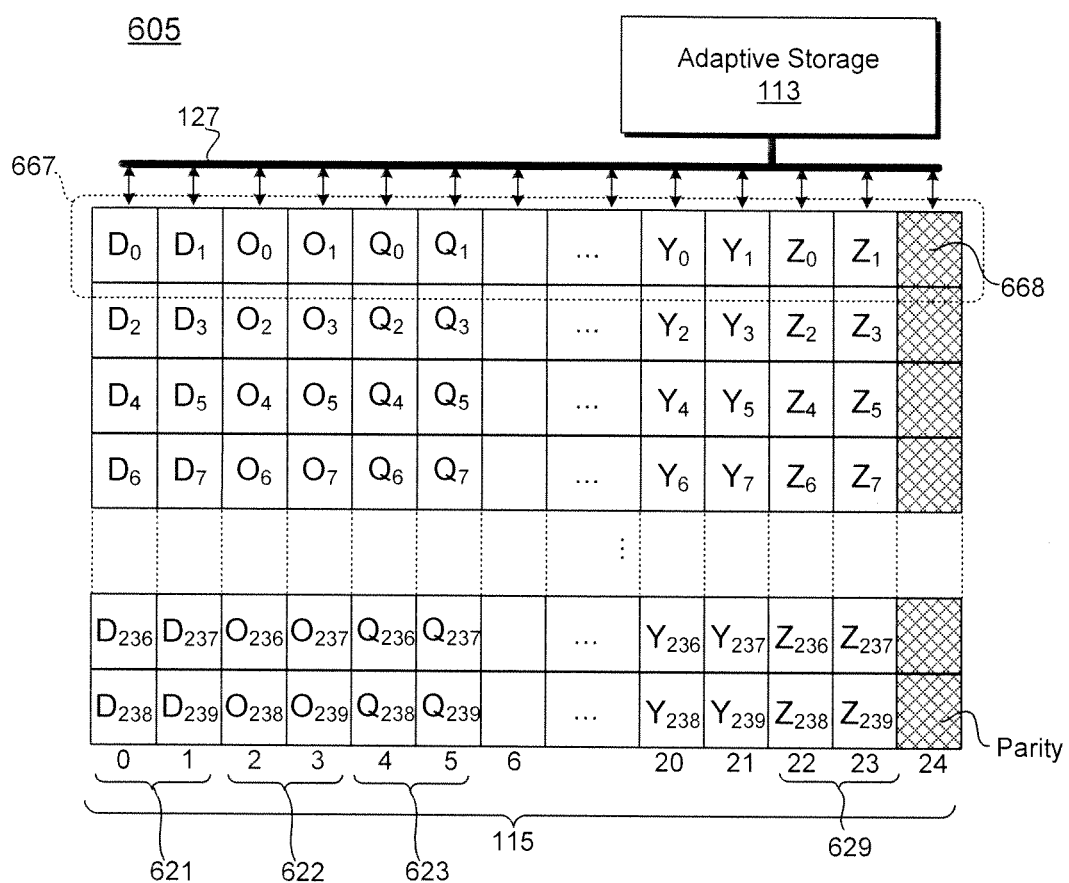
FIG. 6F depicts another embodiment of adaptive data storage on a solid-state storage array.

FIG. 6F depicts one embodiment 605 of a data structure configuration for the two column channel embodiment of FIG. 6E. As illustrated in FIG. 6F, data of ECC codeword D 621 may be stored within a channel comprising columns 0 and 1, data of ECC codeword 0 622 may be stored within a channel comprising columns 2 and 3, data of ECC codeword Q 623 may be stored within a channel comprising columns 4 and 5, and so on. FIG. 6F further depicts a data row 667. The data row 667 of FIG. 6F may include two bytes of each of 12 different ECC codewords D, O, Q . . . Y, and Z. The data row 667 may further comprise a parity byte 668 corresponding to the contents of the data row 667, as disclosed above.

The stream time Ts of an ECC codeword 620 in the FIG. 6E embodiment may be 120 cycles of the bus 127 (e.g., 240/N cycles). An IOPS metric of the two-column hybrid arrangement of FIG. 6E may be represented as:

$$IOPS_r = \frac{2}{(T_r + 120 * S_c)} \quad \text{Eq. 4}$$

The IOPS metric may be modified according to a number of data structures that can be read in parallel. The two-column channel configuration of FIG. 6E may enable 12 different ECC codewords (and/or packets) to be read from the array 115 concurrently.

The adaptive data structure configurations disclosed herein may affect error detection and/or data recovery operations. In a horizontal data alignment, data of each ECC codeword 620 may be spread across the columns 118 of the array 115 (e.g., 10 bytes on each of 24 solid-state storage elements 116A-X). Therefore, if an uncorrectable ECC error is encountered, identifying the source of the error may comprise performing an iterative parity substitution across each of the 24 storage elements 116A-X (e.g., reconstruct the ECC codeword 620 from parity data while omitting data of a respective storage element 116A-X until the source of the error is identified). Moreover, since the ECC codewords 620 cannot be corrected until data of the failed column is recovered, parity reconstruction may aggregate errors in other columns 118.

By contrast, when data is arranged vertically as in FIGS. 6C and 6D, the source of the error may be immediately determined without iterative parity substitution; since all of the data of the ECC codeword 620 is stored within a single solid-state storage element 116A-X, failure to validate an ECC codeword 620 by the ECC read module 245 indicates that the corresponding column 118 within the array 115 is the source of the uncorrectable error.

As disclosed above, a suitable data arrangement may be selected, at least in part, based upon the ECC algorithm in use (e.g., the size of the ECC codewords 620, ratio between data and syndrome, and so on). In some embodiments, the adaptive storage module 113 may be configured to implement a symbolic ECC algorithm. For example, the ECC write module 246 may be configured generate ECC codeword symbols (e.g., 8-bit ECC codeword symbols), which may be individually streamed to solid-state storage array 115, as disclosed herein. Since the ECC codeword symbols are configured for storage within respective columns 118 (by the adaptive write module 248), the adaptive storage module 113 may be capable of arranging ECC codeword symbols comprising particular data segments in any of the horizontal, vertical, hybrid, and/or vertical stripe configurations disclosed herein.

Alternatively, or in addition, the data arrangement may be selected according to other data structures within the ECC codeword symbols, such as data packets 610, or the like. For example, the adaptive storage module 248 may be configured to store ECC symbols of a packet 610 horizontally, vertically, in a hybrid channel configuration, and/or within vertical stripes, as disclosed herein. Other ECC codeword symbol sizes (e.g., 16-bit symbols, 32-bit symbols, and so on), may be arranged according to a horizontal, vertical, hybrid channel, and/or vertical stripe configuration, as disclosed herein.

In some embodiments, vertical data structure configuration may provide benefits for data reconstruction. In particular, vertical data structure layout and/or arrangement may avoid error aggregation issues. Referring back to FIG. 6D, the data recovery module 170 may be configured to reconstruct data of a vertically arranged ECC codeword 620 by reading ECC codewords 620 on other columns 118 of the array 115, correcting errors in the other ECC codewords 620 (if any) by, inter alia, decoding the other ECC codewords 620 using the ECC read module 245, and using the corrected and/or decoded ECC codewords and parity data of column 24 to reconstruct the ECC codeword 620 within the failed column 118. Use of corrected and/or decoded ECC codewords, as opposed to portions of uncorrected ECC codeword data 620, may prevent errors from being aggregated and/or included in the reconstructed ECC codeword.

In the FIG. 6D data structure configuration, if column 0 comprising ECC codeword D 621 fails, such that the ECC codeword D 621 cannot be read from the array, the reconstruction module 170 may be configured to reconstruct the ECC codeword 621 by reading ECC codewords 0 through Z from columns 1 through 23 (and parity data of column 24), correcting errors in the ECC codewords 0 through Z (if any) by use of the ECC read module 245, and reconstructing data of the ECC codeword D 621 using the corrected ECC codewords 0 through Z and the parity data of column 24. Accordingly, the data used to correct ECC codeword D 621 (ECC codewords 0 through Z) may be free from correctable errors, and as such, such errors may not be reflected in the reconstructed data comprising ECC codeword D 621.

Hybrid, independent channel data structure layouts may provide similar benefits. For example, identifying errors in a two-column hybrid may only require iterative substitution between two columns, errors in a four-column hybrid may only require iterative substitution between four columns, and so on. Referring back to FIG. 6F, identifying the source of an uncorrectable error in the ECC codeword D 621 may comprise iterative parity substitution between two columns 0 and 1.

Hybrid, independent channel configurations may also benefit from reduced error aggregation during data reconstruction. Referring to the two-column channel embodiment of FIGS. 6E and 6F, ECC codewords 620 may be stored within channels comprising two columns 118 of the array 115. Accordingly, reconstructing data of a failed column of one of the channels may comprise reading data of other ECC codewords 620 on other columns of the array 115, correcting errors within the other ECC codewords 620 (if any), and using the corrected ECC codewords 620, data of the valid column of the channel, and the parity data to reconstruct data of the failed column 118. For example, reconstructing data of failed column 0 comprising ECC codeword D 621 may comprise reading data of ECC codewords 0 through Z on columns 2 through 23; correcting errors within the ECC codewords 622, 623, through 629 (if any) by use of the ECC read module 245; and reconstructing data of column 0 by use of data read from column 1, the corrected ECC codewords of columns 2 through 23, and the parity data of column 24. The only source of potential uncorrected errors is the other columns within the channel with the failed column 0 (column 1). Accordingly, data reconstructing in the FIGS. 6E and 6F embodiment incorporates errors from only a single column, as opposed to aggregating errors from 23 other columns as in the horizontal data structure layout of FIGS. 6A and 6B.

The size of the data structures, such as the ECC codewords 620 and/or packets 610, may be adapted according to the data arrangement implemented by adaptive write module 248. For example, the size of the ECC codewords 620 may be selected to minimize wasted overhead when ECC codewords 620 are stored in a horizontal arrangement on 24 storage elements 116A-X. However, in other data arrangement embodiments, other data structure sizes may be selected. For example, in the vertical layout of FIGS. 6C and 6D, the size of the ECC codeword 620 may be adapted according to the "depth" of the columns (e.g., the page size of each solid-state storage element). Hybrid, independent channel configurations may involve similar sizing considerations. In some embodiments, the size of the ECC codewords 620 (e.g., the ratio of data to syndrome) may be used to determine a suitable data arrangement. For example, given a particular ECC codeword size, a data arrangement that minimizes wasted overhead, while providing an acceptable IOPS metric, may be identified based on, inter alia, the depth of physical storage units of the solid-state storage medium 110.

Table 1 illustrates various configurations of adaptive channel data layout embodiments used with different data structure sizes (240- and 960-byte ECC codewords 620), as disclosed herein:

| Adaptive Data Configuration | Independent Channels, Codewords/Read | $T_s$: 240-Byte Data Structures | $T_s$: 960-Byte Data Structures |
|---|---|---|---|
| 1 of 24 (vertical, FIGS. 6C and 6D) | 1 | 240 | 960 |
| 2 of 12 (hybrid, FIGS. 6E and 6F) | 2 | 120 | 480 |
| 3 of 8 | 3 | 80 | 320 |
| 4 of 6 | 4 | 60 | 240 |
| 2 of 3 and 3 of 6 | 5 | 48 | 192 |
| 6 of 4 | 6 | 40 | 160 |
| 4 of 3 and 3 of 4 | 7 | 34 | 137 |
| 8 of 3 | 8 | 30 | 120 |
| 4 of 3 and 5 of 2 and extra 2 of 1 | 9 | 27 | 107 |
| 4 of 3 and 6 of 2 | 10 | 24 | 96 |
| 4 of 3 and 5 of 2 and 2 of 1 | 11 | 22 | 87 |
| 12 of 2 | 12 | 20 | 80 |
| 4 of 3 and 3 of 2 and 6 of 1 | 13 | 18 | 74 |
| 4 of 3 and 2 of 2 and 8 of 1 | 14 | 17 | 69 |
| 4 of 3 and 1 of 2 and 10 of 1 | 15 | 16 | 64 |
| 4 of 3 and 12 of 1 | 16 | 15 | 60 |
| 3 of 3 and 14 of 1 and extra 1 of 1 | 17 | 14 | 56 |
| 3 of 3 and 15 of 1 | 18 | 13 | 53 |
| 2 of 3 and 18 of 1 | 20 | 12 | 48 |
| 1 of 3 and 20 of 1 and extra 1 of 1 | 21 | 11 | 46 |
| 1 of 3 and 21 of 1 | 22 | 11 | 44 |
| 1 of 2 and 22 of 1 | 23 | 10 | 42 |
| 24 of 1 (horizontal, FIGS. 6A and 6B) | 24 | 10 | 40 |

As disclosed herein, storage of data structures in vertical configurations may improve error detection, error correction, and/or data reconstruction performance. However, horizontal storage configurations may provide performance benefits in certain situations (e.g., reduce stream time). Accordingly, in some embodiments, the storage module may be configured to store data structures in an adaptive vertical stripe configuration. As used herein, a vertical stripe configuration refers to storing data structures vertically within vertical stripes having a predetermined depth. Multiple vertical stripes may be stored within rows 117 of the array 115. The depth of the vertical stripes may, therefore, determine read-level parallelism, whereas the vertical ECC configuration may maximize error detection, error correction, and/or data reconstruction benefits.

FIG. 6G depicts one embodiment of a vertical stripe data configuration 606 within a logical page 542 (row 117) of a solid-state storage array 115. As disclosed above, a vertical stripe may comprise vertically arranged data structures within respective columns 118 of the array 115. The vertical stripes 646A-N have a configurable depth or length. In the FIG. 6G embodiment, the vertical stripes 646A-N are configured to have a depth sufficient to store four ECC codewords. In some embodiments, the depth of the vertical stripes 646A-N corresponds to an integral factor of ECC codeword size relative to a page size of the solid-state storage medium 110.

In the FIG. 6G embodiment, the page size of the solid-state storage medium 110 may be 16 kb, each page may be configured to hold four vertical stripes 646A-N, and each vertical stripe may be configured to hold four 1 kb vertically aligned ECC codewords. The disclosed embodiments are not limited in this regard, however, and could be adapted to use any solid-state storage medium 110 having any page size in conjunction with any ECC codeword size and/or vertical stripe depth.

The depth of the vertical stripes 646A-N and the size of typical read operations may determine, inter alia, the number of channels (columns) needed to perform read operations (e.g., determine the number of channels used to perform a read operation, stream time Ts, and so on). For example, a 4 kb data packet may be contained within five ECC codewords, including ECC codewords 3 through 7. Reading the 4 kb packet from the array 115 may, therefore, comprise reading data from two columns (columns 0 and 1). A larger 8 kb data structure may span 10 ECC codewords (ECC codewords 98-107), and as such, reading the 8 kb data structure may comprise reading data from three columns of the array (columns 0, 1, and 2). Configuring the vertical stripes 646A-N with an increased depth may decrease the number of columns needed for a read operation, which may increase the stream time Ts for the individual read, but may allow for other independent read operations to be performed in parallel. Decreasing depth may increase the number of columns needed for read operations, which may decrease stream time $T_s$, but result in decreasing the number of other, independent read operations that can be performed in parallel.

Figure 6H:
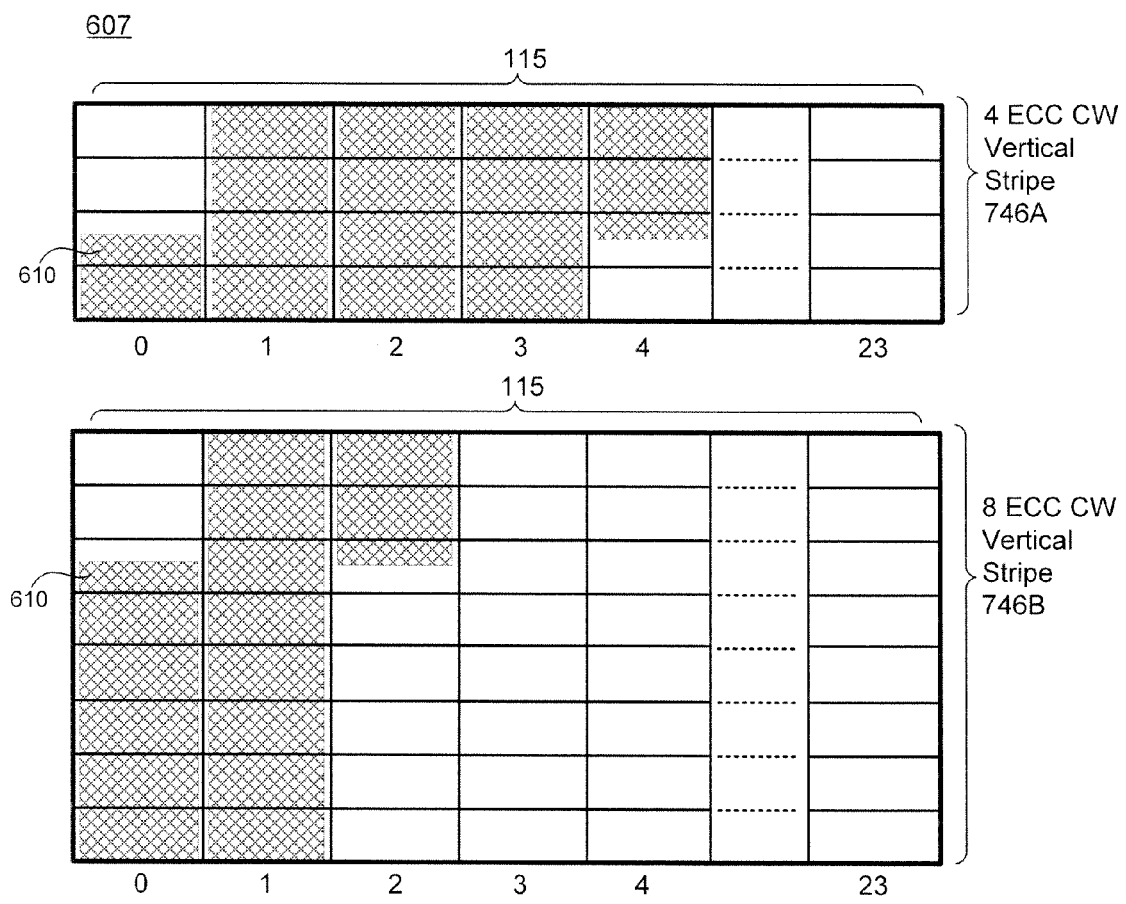
FIG. 6H depicts another embodiment of a vertical stripe configuration on a solid-state storage array.

FIG. 6H depicts embodiments of vertical stripes 607, each having a different respective depth. The vertical stripes 607 may comprise 1 kb, vertically aligned ECC codewords as disclosed above in conjunction with FIG. 6G. A 16 kb data structure 610 (packet) may be stored within a 4 kb deep vertical stripe 746. The data structure 610 may be contained within 17 separate ECC codewords spanning five columns of the array 115 (columns 0 through 5). Accordingly, reading the data structure 610 may comprise reading data from an independent channel comprising six columns. The stream time Ts of the read operation may correspond to the depth of the vertical stripe 746A (e.g., the stream time of four ECC codewords).

The depth of the vertical stripe 746B may be increased to 8 kb, which may be sufficient to hold eight vertically aligned ECC codewords. The data structure 610 may be stored within 17 ECC codewords, as disclosed above. However, the modified depth of the vertical stripe 746B may result in the data structure occupying three columns (columns 0 through 2) rather than six. Accordingly, reading the data structure 610 may comprise reading data from an independent channel comprising three columns, which may increase the number of other, independent read operations that can occur in parallel on other columns (e.g., columns 3 and 4). The stream time Ts of the read operation may double as compared to the stream time of the vertical stripe 746A.

Figure 6I:
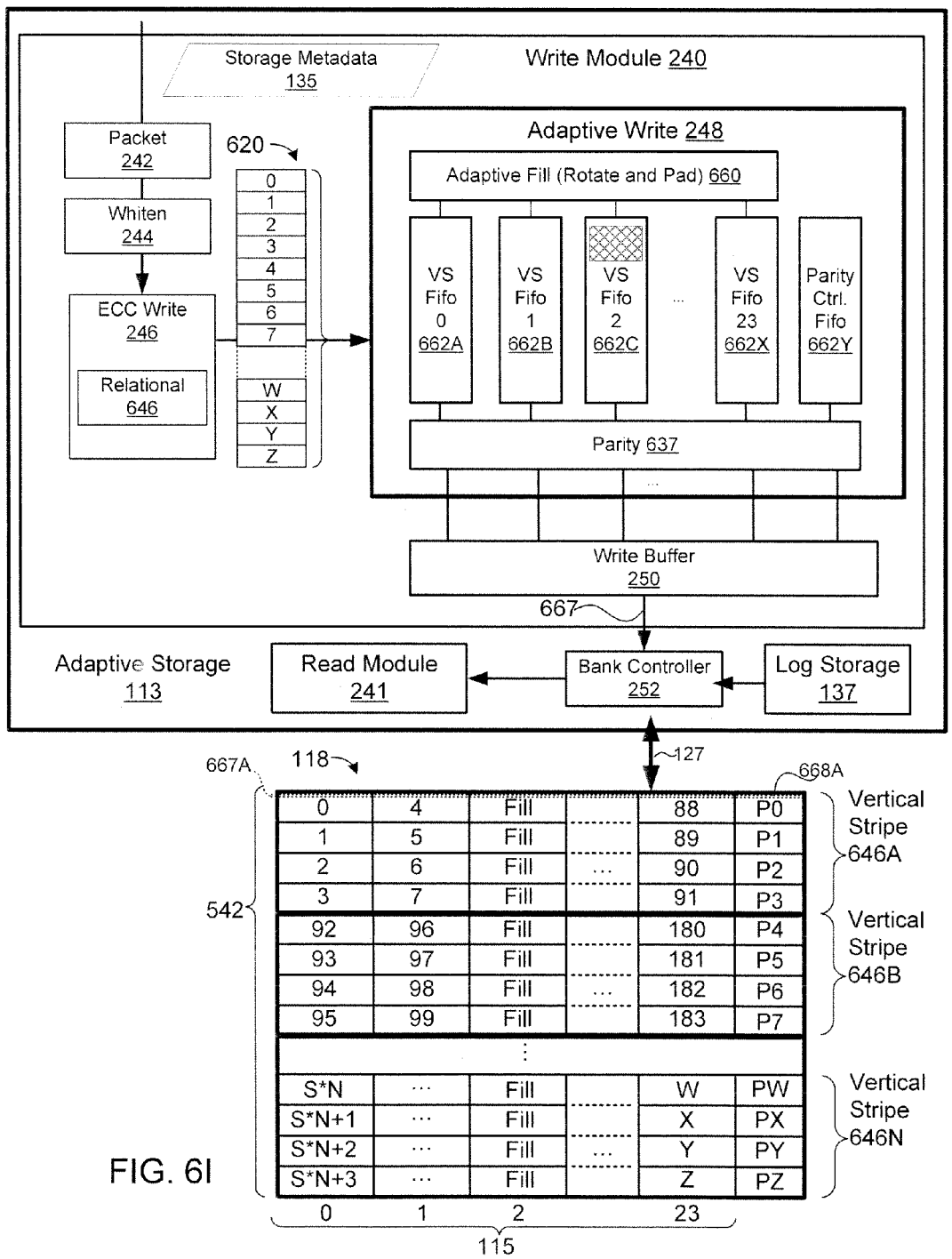
FIG. 6I is a block diagram of another embodiment of a system for adaptive data storage.

FIG. 6I is a block diagram of another embodiment of a system 608 for adaptive data storage. In the FIG. 6I embodiment, the adaptive write module 248 may be configured to store data in a vertical stripe configuration within logical pages 542 of the solid-state storage array 115. The write module 240 may comprise one or more processing modules, which, as disclosed above, may include, but are not limited to, a packet module 242, a whiten module 244, and an ECC write module 246. The ECC write module 246 may be configured to generate ECC codewords 620 (ECC codewords 0 through Z) in response to data for storage on the solid-state storage array 115, as disclosed above. The ECC codewords 620 may flow into the adaptive write module 248 serially via a 128-bit data path of the write module 240. As disclosed in further detail herein, the ECC write module 246 may further comprise a relational module 646 configured to include relational information in one or more of the ECC codewords 620.

The adaptive write module 248 may be configured to buffer the ECC codewords 620 for storage in vertical stripes, as disclosed herein. The adaptive write module 248 may comprise an adaptive fill module 660 that is configured to rotate the serial stream of ECC codewords 620 into vertical stripes by use of, inter alia, one or more cross point switches, FIFO buffers 662A-X, and the like. The FIFO buffers 662A-X may each correspond to a respective column of the array 115. The adaptive fill module 660 may be configured to rotate and/or buffer the ECC codewords 620 according to a particular vertical code word depth, which may be based on the ECC codeword 620 size and/or size of physical storage units of the array 115.

The adaptive write module 248 may be further configured to manage OOS conditions within the solid-state storage array 115. As disclosed above, an OOS condition may indicate that one or more columns 118 of the array 115 are not currently in use to store data. The storage metadata 135 may identify columns 118 that are OOS within various portions (e.g., rows 117, logical erase blocks 540, or the like) of the solid-state storage array 115. In the FIG. 6I embodiment, the storage metadata 135 may indicate that column 2, of the current logical page 542, is OOS. In response, the adaptive fill module 660 may be configured to avoid column 2 by, inter alia, injecting padding data into the FIFO buffer of the OOS column (e.g., FIFO buffer 662C).

In some embodiments, the adaptive write module 248 may comprise a parity module 637 that is configured to generate parity data in accordance with the vertical strip data configuration. The parity data may be generated horizontally, on a byte-by-byte basis within rows 117 of the array 115 as disclosed above. The parity data P0 may correspond to ECC codewords 0, 4, through 88; the parity data P1 may correspond to ECC codewords 1, 5, through 89, and so on. The adaptive write module 248 may include a parity control FIFO 662Y configured to manage OOS conditions for parity calculations (e.g., ignore data within OOS columns for the purposes of parity calculation).

The vertical stripe data configuration generated by the adaptive write module 248 (and parity module 637) may flow to write buffers of the solid-state storage elements 116A-Y within the array 115 through the write buffer and/or bank controller 252, as disclosed above. In some embodiments, data rows 667 generated by the adaptive write module 248 may comprise one byte for each data column in the array 115 (columns 116A-X). Each byte in a data row 667 may correspond to a respective ECC codeword 620 and may include a corresponding parity byte. Accordingly, each data row 667 may comprise horizontal byte-wise parity information from which any of the bytes within the row 667 may be reconstructed, as disclosed herein. A data row 667A may comprise a byte of ECC codeword 0 for storage on column 0, a byte of ECC codeword 4 for storage on column 1, padding data for column 1, a byte of ECC codeword 88 for storage on column 23, and so on. The data row 667 may further comprise a parity byte 668A for storage on column 24 (or other column), as disclosed above.

The data may be programmed onto the solid-state storage array 115 as a plurality of vertical stripes 646A-N within a logical page 542, as disclosed above (e.g., by programming the contents of program buffers to physical storage units of the solid-state storage elements 116A-Y within the array 115). In the FIG. 6I embodiment, the indexing S*N may correspond to vertical stripes configured to hold S ECC codewords in an array 115 comprising N columns for storing data.

Figure 6J:
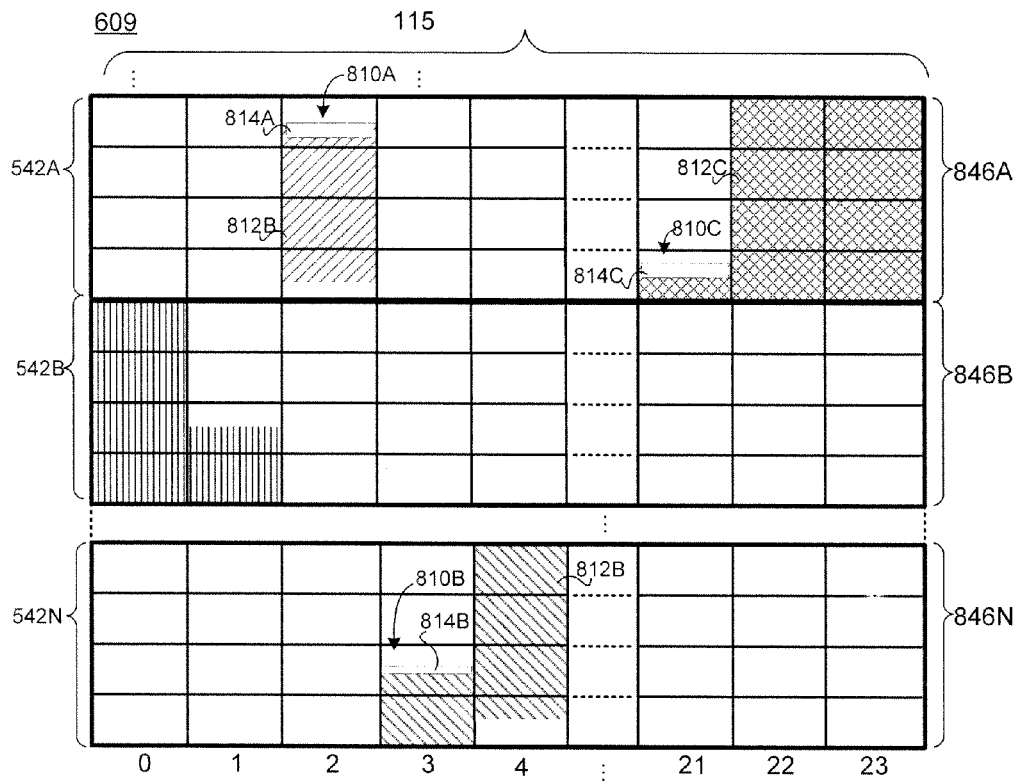
FIG. 6J depicts another embodiment of a vertical stripe configuration on a solid-state storage array.

As disclosed herein, data structures, such as data packets, may be stored within respective container data structures (ECC codewords), which may be spread across different columns 118 and/or rows 117 of the solid-state storage array 115. FIG. 6J depicts one embodiment 609 of a solid-state storage array 115 comprising a data structure (packet 810C) that is stored within a plurality of vertical stripes 846A-B. As illustrated in FIG. 6G, the adaptive write module 248 may be configured to arrange ECC codewords comprising the data structure 810C, such that portions of the data structure 810C are stored within the vertical stripe 846A and other portions are stored in a different vertical stripe 846B (ECC codewords comprising the packet 810C may wrap between different vertical stripes). In addition, portions of the data structure 810C may be stored on different rows 117 of the array 115 (e.g., within different logical pages 542A and 542B). In some embodiments, data structure 810C may span logical erase blocks and/or banks 119A-N; the logical page 542A may be within a different logical storage division 540 and/or different bank 119A-N than the logical page 542B. Moreover, header information stored with the data structures (e.g., headers 814A, 814B, and/or 814C) may be stored in separate ECC codewords than other portions of the corresponding packets 812A, 812B, and/or 812C).

In some embodiments, the ECC codewords comprising a particular data structure (e.g., data structure 810) may comprise relational information, which may allow the storage module to verify that different ECC codewords read from various different portions of the array 115 correspond to the same data structure 810C, despite the fact that the header information is distributed between different ECC codewords stored on different portions of the array 115. Referring back to FIG. 6I, the ECC write module 246 may comprise a relational module 646 configured to include relational information in the ECC codewords 620 generated thereby. The relational information may be configured to provide for identifying and/or verifying that certain ECC codewords 620 are related (e.g., provide for verifying that particular ECC codewords 620 comprise data of the same data structure 810C). The relational information may comprise any identifying data. In some embodiments, the relational information may be derived from the header 814C of the packet, such as the logical identifier(s) associated with the data structure 810C.

The relational information pertaining to data structures processed by the ECC write module 246 may, therefore, be determined based on storage metadata 135 associated with the data, header information, or the like.

The relational module 646 may be configured to mark the ECC codewords 620 with relational information in any suitable format and/or using any suitable mechanism. Marking may comprise adding information to the ECC codewords 620 (e.g., in one or more fields). In some embodiments, the relational module 646 may be configured to mark ECC codewords 620 through Steganography and/or watermarking. Watermarking may comprise performing an XOR operation between relational information (e.g., a bitmask of one or more logical identifier(s) associated with the corresponding data structure) and the ECC codewords 620. As disclosed herein, an ECC datastructure 620 may comprise portions of multiple different data structures; such ECC codewords 620 may include relational information associated with each data structure contained therein. Accordingly, in some embodiments, the relational module 646 may be configured to mark an ECC codeword 620 with multiple instances of relational information (e.g., multiple watermarks).

Figure 6L:
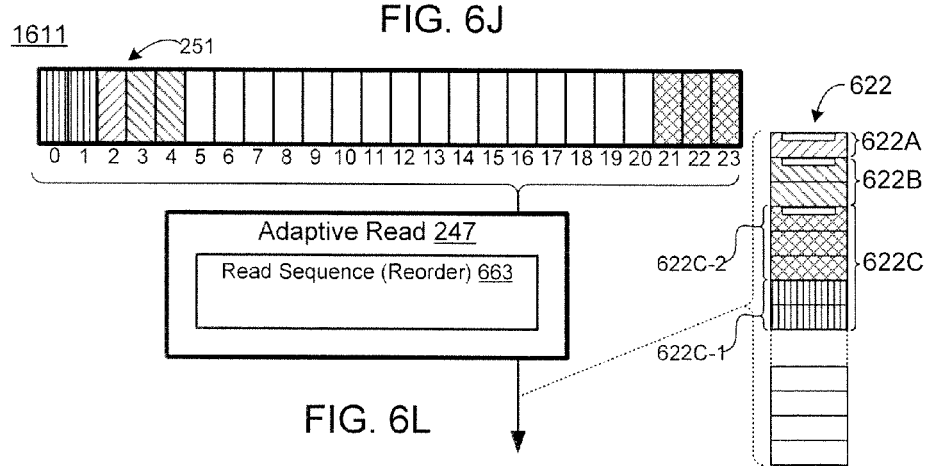
FIG. 6L is a block diagram of another embodiment of a system for adaptive data storage.
Figure 6K:
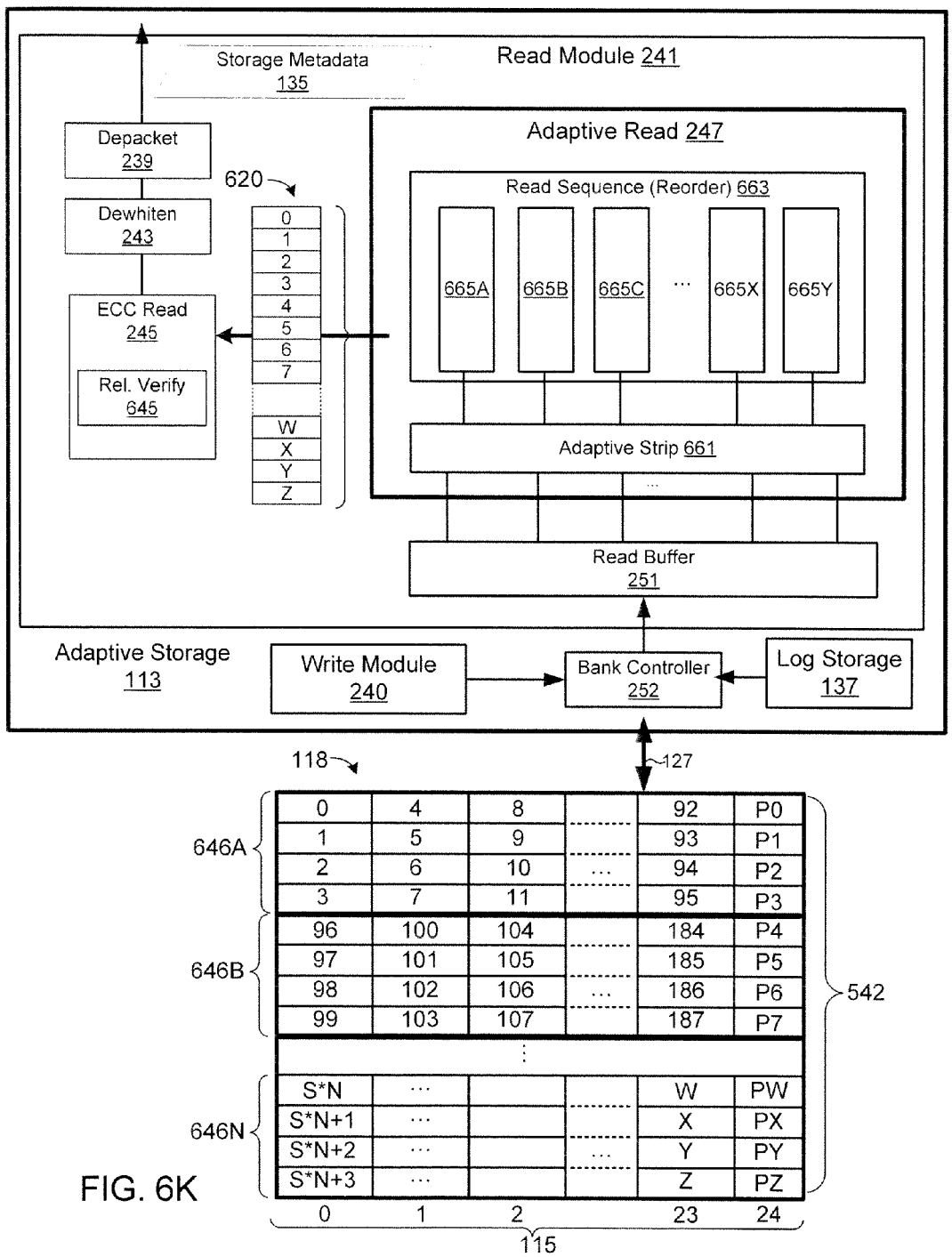
FIG. 6K is a block diagram of another embodiment of a system for adaptive data storage.

FIG. 6K is a block diagram of another embodiment of a system 1610 for adaptive data storage. The system 1610 illustrates one embodiment of a read module 241 configured to read data stored in a vertical stripe configuration on a solid-state storage array 115. The read module 241 may comprise an adaptive read module 247 configured to read data from rows of the array 115 (e.g., read data stored in vertical stripes 646A-N within logical pages 542 of the array 115). Data may be read into a read buffer 251 by use of the bus 127, bank controller 252, and/or log storage module 137.

The adaptive read module 247 may comprise an adaptive strip module 661 configured to remove and/or avoid data of columns that are OOS (based on the storage metadata 135, as disclosed above), which may comprise removing the data from an incoming data stream by use of a cross-point switch, or the like.

The read sequence module 663 may be configured to reorder and/or recombine ECC codewords 620 in sequence, which may comprise rotating vertical stripes read from the array 115 by use of respective buffers 665A-Y, as disclosed above (e.g., rotating and combining ECC codewords read from respective columns 118 of the array 115). The sequenced ECC codewords 620 may flow to other processing modules of the read module 241.

In some embodiments, the ECC read module 245 may comprise a relational verification module 645 configured to verify relational information on the ECC codewords 620 (e.g., verify and/or authenticate one or more markings on the ECC codewords 620). Verifying relational information may comprise performing an XOR operation between the ECC codewords 620 and respective logical identifier(s) associated with the data structures contained therein. Verifying relational information of an ECC codeword 620 that comprises portions of multiple packets may comprise performing multiple XOR operations, each corresponding to logical identifier(s) of a packet contained therein. The logical identifier information used to perform relational verification may be received via the storage metadata 135 and/or as part of a read request. In some embodiments, requests to read data on the solid-state storage array 115 may be accompanied by the logical identifier(s) associated with the request, which may be translated into physical addresses by use of, inter alia, the storage metadata 135. This logical identifier information may be used to perform relational verification on the corresponding ECC codewords 620. The logical identifier(s) of other data structures within a particular ECC codeword 620 that are not part of the read request (if any) may be determined by use of, inter alia, a reverse index, or the like, of the storage metadata 135.

If the relational verification module 645 fails to verify relational information of an ECC codeword 620, the solid-state adaptive storage module 113 may issue an interrupt, indicating that the data could not be read. In response, the data recovery module 170 may attempt to acquire the data from another source and/or from another portion of the solid-state storage array 115. In embodiments in which the relational module 646 watermarks ECC codewords 620 with logical identifier information, the relational verification module 645 may be configured to verify the relational information by performing an equivalent XOR operation. If the relational information differs between the XOR operation performed during storage and the XOR operation performed when the data is read, the corresponding ECC codeword(s) 620 may be corrupted, and the ECC read module 245 will detect uncorrectable errors there; in response, the storage module 130 may issue a read failure interrupt, as disclosed above.

FIG. 6L depicts one embodiment of data flow 1611 of a read sequence operation. The data flow 1611 depicted in FIG. 6L may be implemented by the adaptive read module 247 as disclosed herein. Referring to FIG. 6J, storage module 130 may receive requests to read data packets 810A, 810B, and 810C. The read sequence module 663 and/or log storage module 137 may configure the adaptive storage module 113 to read data from the columns 118 comprising the requested data (by use of the logical-to-physical translation layer 132). The adaptive storage module 113 may be configured to read the data packets 810A, 810B, and 810C in a single read operation on the array 115, which may comprise providing different addressing information to different sets of columns 118. In the FIG. 6J embodiment, columns 0 and 1 may be configured to read data from logical page 542B, column 2 may be configured to read data from logical page 542A, columns 3 and 4 may be configured to read data from logical page 542N, and columns 21-23 may be configured to read data from logical page 542A. The different addressing information may be sent to the independent columns 118 via the bus 127, as disclosed above.

The read operation may comprise transferring the contents of the specified logical pages into the read buffer 251. FIG. 6L depicts one embodiment of a read buffer comprising data of packets 810A, 810B, and 810C. Columns 0 through 23 of the buffer 251 may correspond to columns 118 of the array 115 and, as such, may comprise data read from read buffers of the respective solid-state storage elements 116A-Y comprising the array 115. The contents of columns 5 through 20 are not shown in FIG. 6L to avoid obscuring the details of the depicted embodiment. These columns could, however, comprise data corresponding to other data structures, OOS mask data, or no-op data, read from the corresponding solid-state storage elements 116F-V.

The read sequence module 663 may be configured to determine which portions of the buffer 251 comprise valid data (based on the logical-to-physical translation information, OOS metadata, and so on), and may reorder and/or mask the contents of the read buffer 251 to generate a sequence of ECC codewords 620 comprising the requested data. The read sequence module 663 may be further configured to order the data structures in accordance with an order of the request requests within, inter alia, the request buffer 136. The ECC codeword sequence 622 may comprise an ordered sequence of ECC codewords 622A comprising data structure 810A, followed by the ECC codewords 622B comprising data structure 810B, and the ECC codewords 622C comprising data structure 810C. As illustrated in FIG. 6C, the contents of columns 0 and 1 of logical page 542B (ECC sequence 622C-1) may be ordered after the contents of columns 21-23 (ECC sequence 622C-2) in the sequence 622.

The ECC write module 246 may be configured to generate ECC data of various types and/or in various formats. In some embodiments, the ECC write module 246 is configured to generate ECC codewords 620 comprising N bytes of data and S bytes of ECC information (syndrome S). As disclosed herein, the layout of ECC codewords 620 on the solid-state storage array 115 may determine performance and/or data recovery characteristics of the storage module 130. In some embodiments, as illustrated in FIGS. 6A, 6B, 6E, and 6F, data of ECC codewords 620 may be spread across multiple columns 118 of the array 115, and as such, determining the source of an uncorrectable error in an ECC codeword 620 (and reconstructing the corresponding data from other columns 118 of the array and/or parity data) may comprise iterative parity substitution, which may result in error aggregation.

Figure 6M:
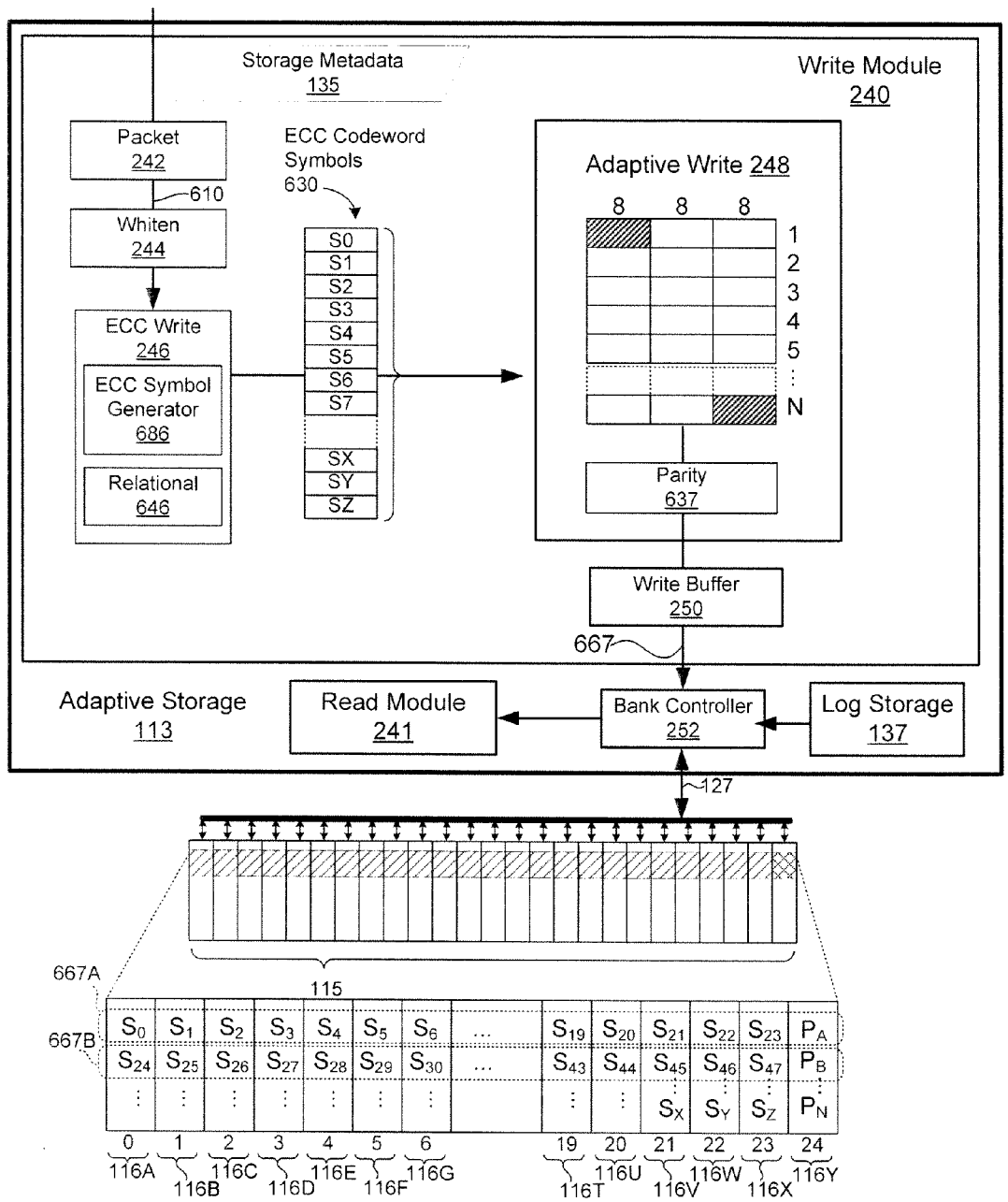
FIG. 6M is a block diagram of another embodiment of a system for adaptive data storage.

FIG. 6M is a block diagram of another embodiment of a system 1612 for adaptive storage. In the FIG. 6M embodiment, the ECC write module 246 may be configured to generate ECC codeword symbols 630 (by use of an ECC symbol generator module 686). As disclosed above, an ECC codeword symbol 630 refers to an ECC codeword corresponding to a particular type or class of ECC algorithm. A symbolic ECC algorithm may comprise encoding data, such as a packet 610, as a plurality of ECC codeword symbols 630, as opposed to data segments of length N and corresponding syndromes of length S, as disclosed above. The ECC algorithms implemented by the ECC write module 246 (and/or ECC symbol generator 686) may include, but are not limited to, a Reed-Solomon ECC, a block ECC, a convolutional ECC, concatenation code (e.g., combinations of two or more codes), a non-binary code, or any other suitable symbol-based ECC algorithm. Therefore, as used herein, a symbolic ECC algorithm refers to an ECC encoding scheme in which a data segment D is encoded into a plurality of discrete, fixed-length ECC codeword symbols 630 (e.g., X separate, discrete ECC codeword symbols 630), wherein the size of each of the discrete, fixed-length ECC codeword symbols 630 (S length) is less than a size of the encoded data segment D. In some embodiments, each ECC codeword symbol 630 may be a single byte in length. The total size and/or length of the ECC codeword symbols 630 comprising the data segment D may be expressed as X*(S length), and the ratio of the size of the data segment D to the total size of the ECC codeword symbols 630, X*(S length), may determine, inter alia, the strength of the ECC encoding (e.g., the number of errors that can be detected and/or corrected by use of the ECC encoding). As illustrated in FIG. 6M, the ECC write module 246 may further comprise a relational module 646 configured to mark ECC codeword symbols 630 with relational information (e.g., logical identifier(s) associated with data encoded within the ECC codeword symbols 630), as disclosed above.

The ECC write module 246 may be configured to generate ECC codeword symbols 630 for storage in a particular layout and/or arrangement within the solid-state storage array 115. In the FIG. 6M embodiment, the ECC codeword symbols 630 may be configured for storage within respective columns 118 of the array 115 (e.g., within respective solid-state storage elements 116A-Y); each ECC codeword symbol 630 may comprise a single byte. In the FIG. 6M embodiment, a data packet 610 is encoded into a plurality of symbols S0 through SZ. An N byte packet 610 may be encoded into N+S ECC codeword symbols 630. The ratio of N to N+S may determine the strength of the ECC encoding, which, as disclosed above, may determine, inter alia, the number of errors that can be detected and/or corrected by use of the ECC encoding.

The adaptive write module 248 may be configured to arrange the ECC codeword symbols 630 within respective columns 118 of the solid-state storage array 115. The adaptive write module 248 may be configured to store the ECC codeword symbols 630 horizontally within the solid-state storage array 115, as disclosed above in conjunction with FIGS. 6A and 6B. The adaptive write module 248 may be further configured to insert padding data into the write buffer 250 in accordance with OOS conditions within the array 115 (and as indicated by the storage metadata 135).

The write module 240 may be configured to stream data rows 667 comprising 25 bytes to the array 115 (to program buffers of the solid-state storage elements 116A-Y). Accordingly, in each stream cycle, a complete one-byte ECC codeword symbol 630 may be streamed to each of the solid-state storage elements 116A-X (elements 0-23) along with a corresponding parity byte (to solid-state storage element 116Y, or other storage element 116A-Y). As illustrated in FIG. 6M, the data row 667A streamed to the array 115 in a first bus cycle comprises ECC codeword symbols 630 S0 through S23 for storage on respective solid-state storage elements 116A-X. The data row 667A further comprises a corresponding parity byte PA. The next data row 667B comprises ECC codeword symbols 630 S24 through S47 and corresponding parity byte PB, and so on. Although FIG. 6M depicts single-byte ECC codeword symbols 630, the disclosure is not limited in this regard and could be adapted to use other, multi-byte sized ECC codeword symbols 630, as disclosed in further detail herein.

As illustrated in FIG. 6M, although the ECC codeword symbols S0 through SZ are streamed horizontally across the array 115 (as in FIGS. 6A and 6B), the individual ECC codeword symbols 630 are configured to be stored within respective columns 118. Accordingly, the ECC codeword symbols 630 comprising the packet 610 may be read with a high degree of parallelism, utilizing all 24 columns of the array 115. However, since the ECC codeword symbols 630 are stored within respective columns 118, the performance of error detection and/or data reconstruction operations may be significantly improved.

In some embodiments, the ECC write module is configured to generate differently sized ECC codeword symbols 630 in accordance with the configuration of the solid-state storage array 115, bus 127, adaptive storage module 248, and/or the like. For example, if bus 127 were to have a width of 48 bytes (two bytes per storage element 116A-X), the ECC codeword symbols 630 may be configured to be two bytes in size, with each column of the array 115 receiving a two-byte ECC codeword symbol 630 on each stream cycle (e.g., into each of two or more program buffers).

Figure 6N:
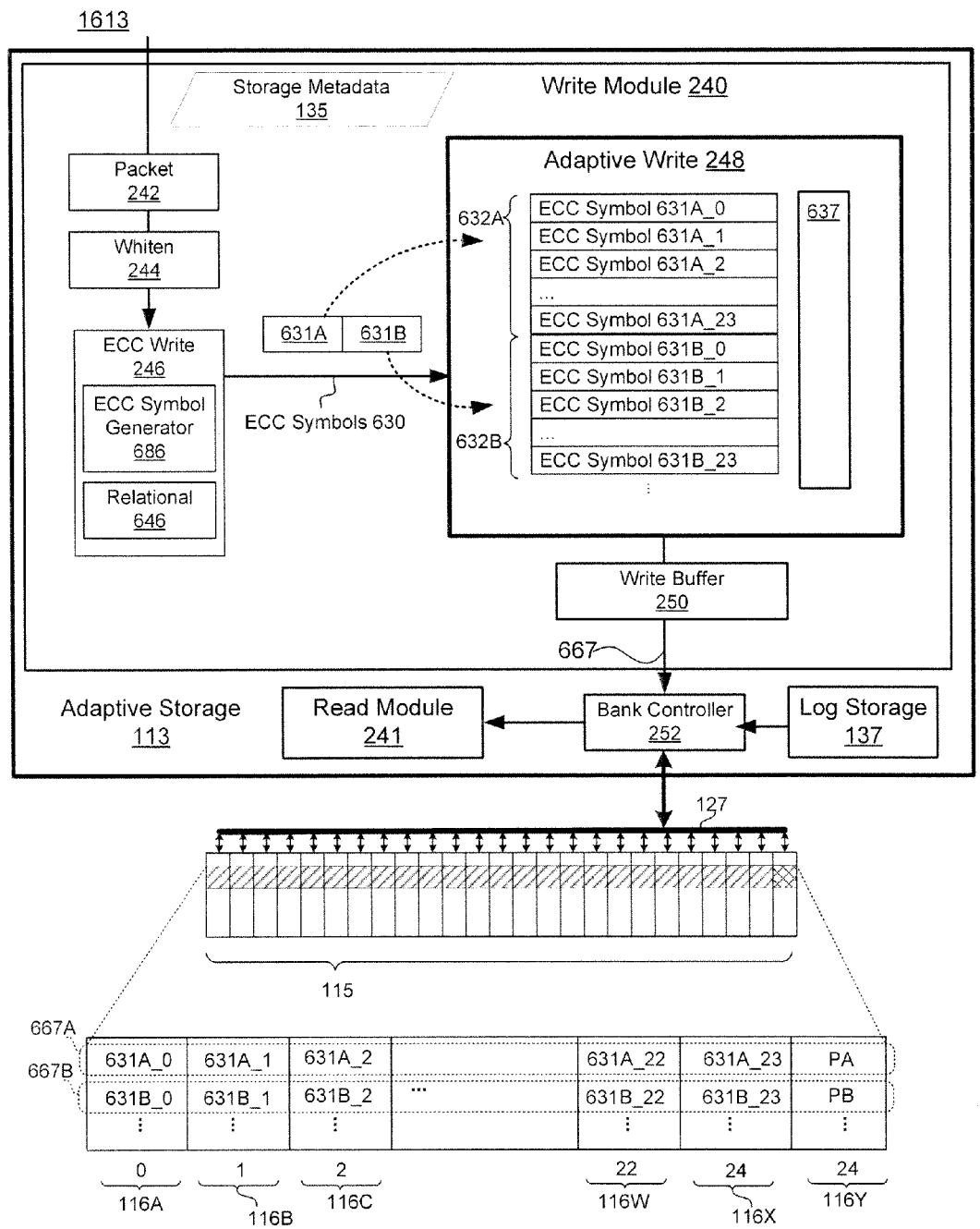
FIG. 6N is a block diagram of another embodiment of a system for adaptive data storage.

FIG. 6N is a block diagram of another embodiment of a system 1613 for adaptive storage. The ECC write module 246 may be configured to generate two-byte ECC codeword symbols 630. The adaptive write buffer 248 may be configured to arrange the two-byte ECC codeword symbols 630 within respective columns 118 of the array, such that both bytes of each two-byte ECC codeword symbol 630 are stored within the same solid-state storage element 116A-Y.

In FIG. 6N, the ECC codeword symbols 630 are represented as a first portion 631A comprising a first byte of the ECC codeword symbol 630, and a second portion 631B comprising a second byte of the ECC codeword symbol 630. The adaptive write module 248 may be configured to buffer the first portions 631A (in a first buffer 632A) and 24 of the second portions 631B (in a second buffer 632B). Contents of the first buffer 632A may be streamed to the array 115 in a first data row 667A, and contents of the second buffer 632B may be streamed to the array 115 in a second data row 667B. The first data row 667A may comprise the first byte of the ECC codeword symbols 631A_0 through 631A_23, and the second data row 667B may comprise the second byte of the ECC codeword symbols 631B_0 through 631B_23. As disclosed above, each data row 667A-B may comprise byte-wise parity information. Data row 667A may comprise parity byte PA corresponding to ECC codeword symbol bytes 631A_0 through 631A_23, and data row 667B may comprise parity byte PB corresponding to ECC codeword symbol bytes 631B_0 through 631B_23. As illustrated FIG. 6M, each multi-byte ECC codeword symbol 630 is stored within a respective column 118 of the array 115; each solid-state storage element 116A-X comprises a complete two-byte ECC codeword symbol 630.

Although particular configurations of ECC codeword symbols 630 are disclosed herein, the disclosure is not limited in this regard, and could be adapted to generate ECC codeword symbols of any suitable size for storage in any suitable configuration. In some embodiments, for example, the adaptive write module 248 may be configured to arrange ECC codeword symbols 630 comprising three, four, or more bytes within respective columns 118 of the array 115. Moreover, although FIGS. 6M and 6N depict a horizontal data layout, the disclosure is not limited in this regard. In other embodiments, the adaptive write module 248 may be configured to store ECC codeword symbols 630 of different data segments and/or storage requests within respective independent channels, in a vertical configuration, and/or in a vertical stripe configuration, as disclosed above.

Figure 6O:
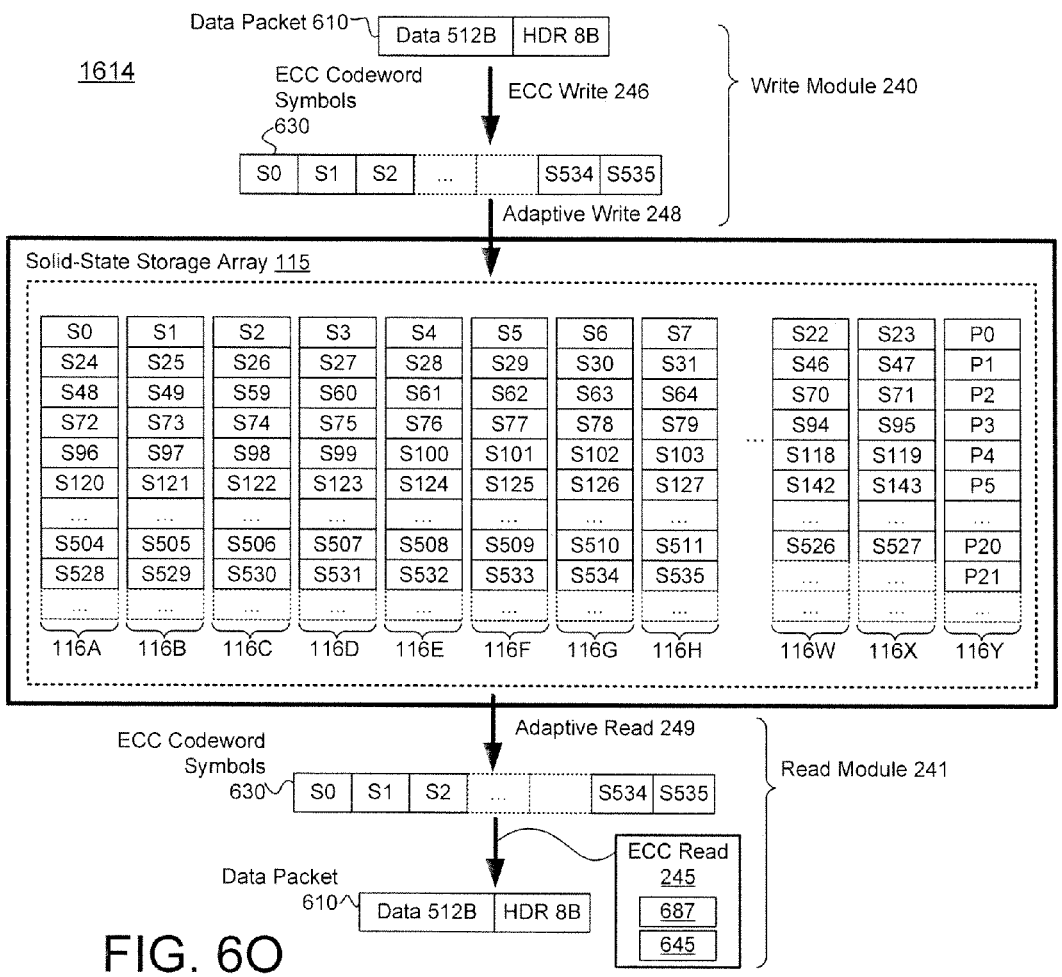
FIG. 6O is a block diagram depicting another embodiment of data flow in an adaptive storage system.

The storage module 130 may leverage the ECC codeword symbols 630 configured for storage within columns of the array 115 to implement efficient recovery operations. FIG. 6O depicts one embodiment of data flow 1614 in an adaptive storage system. As illustrated in FIG. 6O, the write module 240 may be configured to store ECC codeword symbols 630 comprising a data packet 610 on the solid-state storage array 115. The data packet 610 may comprise a 512-byte packet data segment 312 and an eight-byte header 314. The ECC write module 246 may be configured to encode the data packet 610 into 536 one-byte ECC codeword symbols 630 (S0 through S535). The adaptive write module 248 may be configured to arrange the ECC codeword symbols 630 S0 through S535 horizontally within the array 115 (e.g., in a channel comprising 24 solid-state storage elements 116A-X, and a parity column 116Y). In other embodiments, the adaptive write module 248 may be configured to arrange the ECC codeword symbols 630 S0 through S535 within an independent channel comprising a subset of the columns 118 (one or more solid-state storage elements 116A-Y), in a vertical strip configuration, or the like, as disclosed herein.

The read module 241 may be configured to read the data packet 610 in response to a request. The read module 241 may be configured to determine a storage location of the ECC codeword symbols 630 comprising the data packet 610 by use of, inter alia, the logical-to-physical translation layer 132 and/or storage metadata 135, as disclosed herein. The ECC codeword symbols 630 S0 through S535 may be arranged in a horizontal data configuration and, as such, the read module 241 may read 24 of the ECC codeword symbols 630 S0 through S535 in parallel (in each cycle of the bus 127). Reading the ECC codeword symbols 630 S0 through S535 may comprise issuing one or more read commands to the solid-state storage array 115. In some embodiments, the read command(s) may be issued to the columns 118 in parallel. The read command(s) may cause the solid-state storage element(s) 116A-Y to transfer the contents of a specified physical storage location (e.g., a page, sector, or the like) into a read buffer of the respective storage element(s) 116A-Y. The contents of the solid-state storage element read buffer(s) may be streamed into the read module 241 in one or more bus cycles, as disclosed herein. Each stream cycle may comprise transferring a respective data row 667A-U into the read module 241, each of which may comprise a one-byte ECC codeword symbol 630 S0-S535 read from a respective one of the solid-state storage elements 116A-X. In other embodiments comprising multi-byte ECC codeword symbols 630, each bus cycle may transfer a portion of an ECC codeword symbol stored within a respective column 116A-X, which may be reconstructed by the adaptive read module 247, as disclosed herein. The ECC read module 245 may be configured to validate and/or decode the ECC codeword symbols 630 S0 through S535, which may comprise detecting and/or correcting errors therein (if any). The ECC read module 245 may be further configured to validate relational information of the ECC codeword symbols (using a relational verification module 645), as disclosed herein.

As illustrated in FIG. 6O, the ECC codeword symbols 630 S0-S535 stored within a particular column 118 may be validated independently of the data stored in other columns 116. The source of uncorrectable errors may, therefore, be identified without performing iterative parity substitution operations between columns 118 of the array 115 (e.g., the source of the error is the solid-state storage element 116A-X from which the uncorrectable ECC codeword symbol 630 was read). The source of correctable errors may be similarly identified and attributed to respective solid-state storage elements 116A-Y.

As disclosed above, the read module 241 may comprise an adaptive read module 247 configured to read the ECC codeword symbols 630 S0-535 from the array 115. The adaptive read module 247 may be configured to remove and/or strip data (if any) corresponding to OOS columns 118 of the array. In some embodiments, the adaptive read module 247 is further configured to reorder ECC codeword symbols 630 streamed into the read module 241 via the buffer 251 in accordance with the layout of the ECC codeword symbols 630, as disclosed above in conjunction with FIG. 6L.

The ECC read module 245 may be configured to validate and/or decode the ECC codeword symbols 630 S0-S535. The ECC read module 245 may comprise an ECC symbol validation module 687 configured to validate and/or decode the ECC codeword symbols 630 S0-S535 in accordance with the symbolic ECC algorithm implemented by the ECC write module 246 (and/or ECC generator module 686). The ECC read module 245 may further comprise a relational verification module 645 configured to validate relational information of the ECC codeword symbols 630 S0-S535, as disclosed above. Decoding and/or validating the ECC codeword symbols 630 S0-S535 may, therefore, comprise reconstructing the data packet 610, which may be provided to a storage client 104.

One or more of the ECC codeword symbols 630 S0-S535 comprising the data packet 610 may be unavailable due to, inter alia, errors that cannot be corrected by the ECC encoding implemented by the adaptive storage module 113. The data recovery module 170 may be configured to reconstruct unavailable ECC codeword symbols 630 using other ECC codeword symbols 630 stored within the array 115 and/or parity data (parity data PA-PU). Reconstructing an unavailable ECC codeword symbol 630 may comprise accessing one or more data rows 667A-N associated with the unavailable ECC codeword symbol 630, validating and/or decoding other ECC codeword symbols 630 within the data rows 667A-N, and reconstructing data of the unavailable ECC codeword symbol using the corrected ECC codeword symbols 630 and parity data (e.g., using parity substitution). The use of corrected ECC codeword symbols 630 may prevent errors from other columns 118 from being included in the reconstructed ECC codeword symbol 630 and, as such, may improve data reconstruction performance. Alternatively, the data recovery module 170 may be configured to reconstruct an unavailable ECC codeword symbol by use of uncorrected and/or un-decoded ECC codeword symbols. The use of uncorrected and/or un-decoded ECC codeword symbols may reduce computational overhead, which may improve performance in low-error-rate embodiments. The data recovery module 170 may be further configured to take portions of the array 115 OOS in response to one or more of identifying an unavailable ECC codeword symbol read from the column 118, in response to detecting more than a threshold number of unavailable ECC codeword symbols read from the column 118; one or more ECC codeword symbols exceeding an acceptable rate of correctable errors; and/or the like.

Figure 6P:
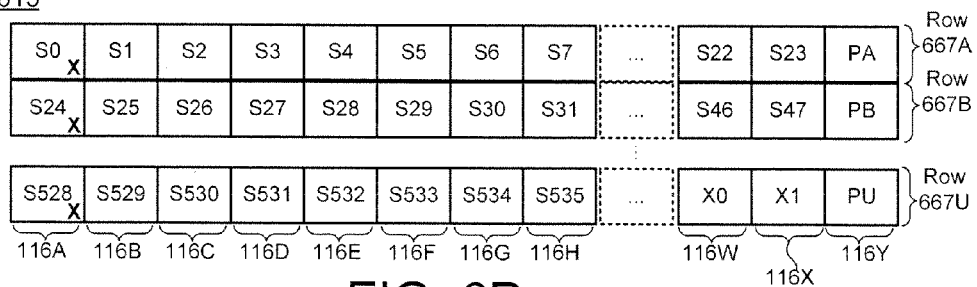
FIG. 6P is a block diagram depicting ECC codeword symbol reconstruction.

FIG. 6P depicts one embodiment of data layout 1615 within a solid-state storage array 115 comprising unavailable ECC codeword symbols S0, S24, through S528 comprising portions of the data packet 610 of FIG. 6O, which may be due to, inter alia, failure of a portion of solid-state storage element 116A. As disclosed above, the unavailable ECC codeword symbols S0, S24, through S528 may be associated with respective data rows 667A-667U, each comprising one or more other ECC codeword symbols 630 stored on other columns 118 of the array 115 (solid-state storage elements 116B-X). In some embodiments, the data rows 667A-U may further comprise respective parity data PA through PU. The data recovery module 170 may be configured to reconstructed the ECC codeword symbols S0, S24, through S528 using byte-wise parity substitution within the data rows 667A-U. As disclosed above, byte-wise parity substitution may comprise reconstructing a byte of data stored within a failed column 118 by use of bytes stored in other columns 118 and/or a corresponding parity byte.

In some embodiments, the data recovery module 170 is configured to a) read data rows 667A-U, b) validate and/or decode the ECC codeword symbols 630 within the respective data rows 667A-U, and c) reconstruct the unavailable ECC codeword symbols 630 S0, S24, through S528 using parity substitution between the validated and/or decoded ECC codeword symbols 630 and the corresponding parity byte PA-PA. Reconstructing ECC codeword symbol 630 S0 may comprise a) accessing ECC codeword symbols 630 S1 through S23 within row 667A, b) correcting the ECC codeword symbols 630 S1 through S23 (by use of the ECC read module 245), and c) performing a parity substitution operation to reconstruct ECC codeword symbol 630 S0. The ECC codeword symbols 630 S24 through S528 may be reconstructed in corresponding byte-wise parity substitution operations. As depicted in FIG. 6P, reconstructing the ECC codeword symbol 630 S528 may incorporate corrected ECC codeword symbols 630 of one or more other data packets and/or data segments (symbols X0 and X1). Accordingly, in some embodiments, reconstructing an unavailable ECC codeword symbol 630 of a data packet 620 may comprise accessing and/or validating one or more ECC codeword symbols 630 of other data packets 620 and/or incorporating parity data pertaining to ECC codeword symbols 630 of other data packets (e.g., the parity data P21 may comprise information pertaining to symbols X0 and X1).

In some embodiments, the ECC algorithm implemented by the adaptive write module 113 may be capable of reconstructing unavailable data. For example, a symbolic ECC algorithm may be capable of reconstructing one or more unavailable ECC codeword symbols 630 by use of other ECC codeword symbols and/or without the use of parity data (e.g., PA-PU). Accordingly, in some embodiments, the adaptive write module 248 may be configured to omit parity data from the data rows 667A-U, which may allow the full 25 solid-state storage elements 116A-Y to be used to store ECC codeword symbol data. In such embodiments, reconstructing an unavailable ECC codeword symbol 630 may comprise a) reading a plurality of ECC codeword symbols 630 from one or more data rows 667A-U within the array 115, b) validating and/or decoding the ECC codeword symbols 630 (if possible), and c) reconstructing the unavailable ECC codeword symbols 630 using the other ECC codeword symbols 630 in accordance with the ECC algorithm.

Figure 6Q:
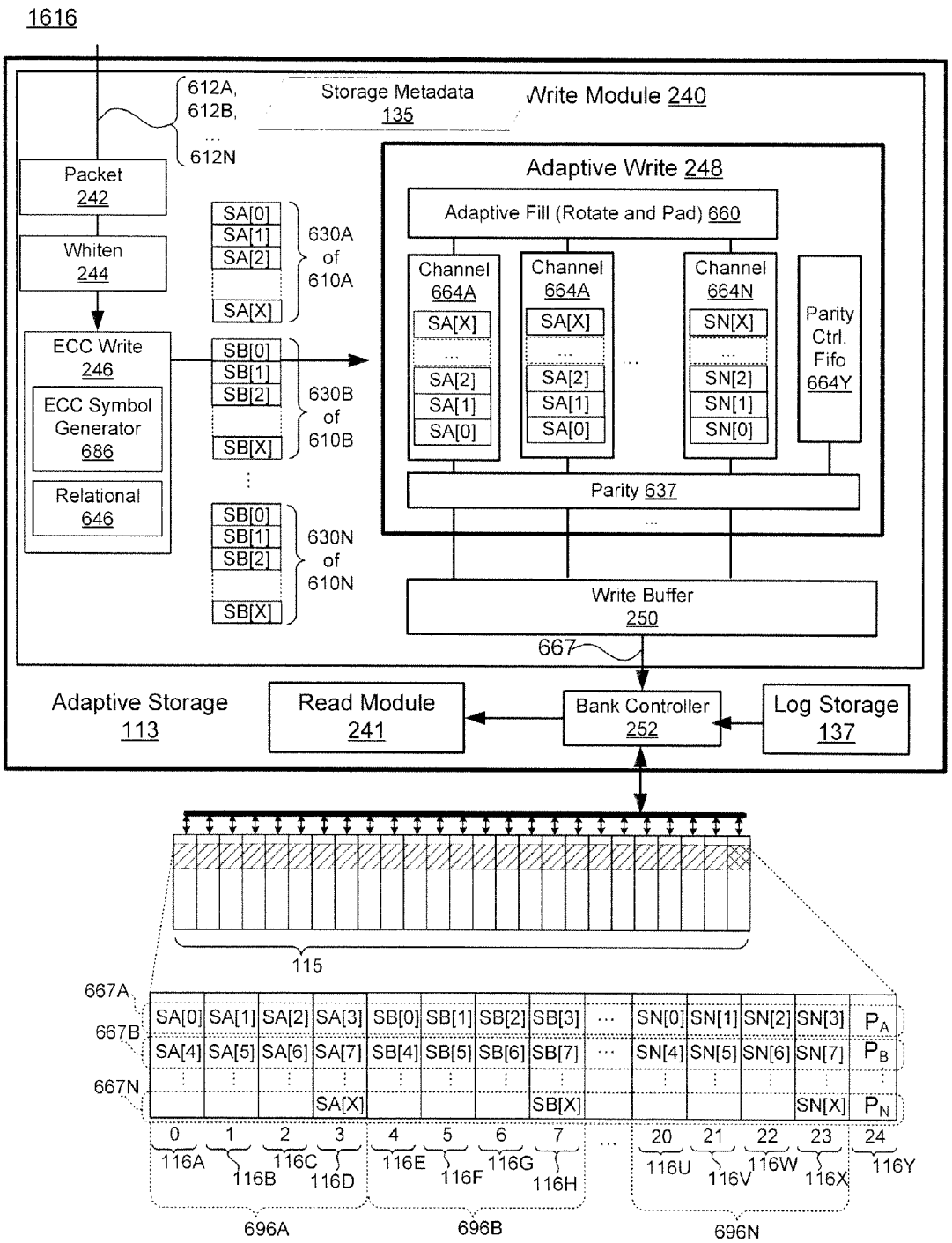
FIG. 6Q is a block diagram of another embodiment of a system for adaptive storage.

As disclosed above, although the embodiments illustrated in FIGS. 6N-P describe a horizontal data configuration of ECC codeword symbols 630, the disclosure is not limited in this regard; the disclosed embodiments could be adapted to store data encoded as ECC codeword symbols 630 in any suitable configuration including, but not limited to, horizontal; vertical; hybrid, independent channel; vertical stripe; and/or the like. FIG. 6Q is a block diagram of another embodiment of a system 1616 for adaptive storage. The FIG. 6Q embodiment may be configured to store data encoded as ECC codeword symbols 630 within adaptive, independent channels 696A-N, each of which may comprise one or more columns of the array 115 (e.g., sets of one or more solid-state storage elements 116A-Y).

The adaptive storage module 113 may be configured to process multiple data streams for storage on the array 115, each of which may correspond to a different respective storage request. In the FIG. 6Q embodiment, the write module 240 is configured to process N data streams in parallel, including data segments 612A, 612B, through 612N. The data segments 612A-N may be processed by one or more modules of the write module 240, as disclosed above, which may comprise generating respective packets 610A, 610B, through 610N. The data segments 612A-N may be processed in parallel, which may comprise processing the data using multiple instantiations of the packet module 242, whiten module 244, and so on; a wide data path; or the like. Alternatively, the data segments 612A-N may be processed serially, and may be buffered for parallel storage within respective channels 696A-N using, inter alia, the adaptive write module 248.

The ECC write module 246 (and/or set of ECC write modules 246) may be configured to generate respective sets of ECC codeword symbols 630A-N corresponding to each of the data packets 610A-N (by use of the ECC symbol generator module 686). Each data packet 610A-N may comprise X+1 ECC codeword symbols 630A-N. As disclosed above, the ratio between the size of the data packets 610A-N and the corresponding sets of ECC codeword symbols 630A-N may determine, inter alia, the strength of the ECC algorithm (the number of errors that can be detected and/or corrected by use of the ECC algorithm). In the FIG. 6Q embodiment, the ECC write module 246 is configured to generate one-byte ECC codeword symbols 630A-N. The ECC write module 246 may be further configured to mark the ECC codeword symbols 630A-N with relational information (using the relational module 646), as disclosed above.

The sets of ECC codeword symbols 630A-N corresponding to the packets 610A-N may flow to the adaptive write module 248, which may be configured to arrange the sets of ECC codeword symbols 630A-N in one of a horizontal configuration; a vertical configuration; a hybrid, independent channel configuration; a vertical stripe configuration; or the like. In the FIG. 6Q embodiment, the adaptive write module 248 is configured to arrange the sets of ECC codeword symbols 630A-N in a hybrid, independent channel configuration, wherein each channel 696A-N comprises four columns 118 of the array 115. The adaptive write module 248 may be configured to buffer the sets of ECC codeword symbols in respective channel buffers 664A-N (FIFO buffers). Each channel buffer 664A-N may be four bytes wide, such that four of each set of ECC codeword symbols 630A-N streams to the array 115 in each bus cycle.

The adaptive fill module 660 may be configured to manage OOS conditions within the array 115, as disclosed above. The adaptive write module 248 may further comprise a parity module 637 configured to generate parity data corresponding to each data row 667 streamed to the array. The parity control FIFO 664 may be configured to manage parity calculations in accordance with OOS conditions within the array 115 (as indicated by the storage metadata 135).

As illustrated in FIG. 6Q, the adaptive write module 248 is configured to divide the solid-state storage array 115 into a set of independent channels 696A-N, each of which comprises a set of four columns 118: channel 696A comprises solid-state storage elements 116A-D, channel 696B comprises solid-state storage elements 116E-H, channel 696N comprises solid-state storage elements 116U-X, and so on. The set of ECC codeword symbols 630A comprising packet 610A are configured for storage in channel 696A, the set of ECC codeword symbols 630B comprising packet 610B are configured to storage in channel 696B, the ECC codeword symbols 630N comprising packet 610N are configured to storage in channel 696N, and so on. As disclosed above, the independent channel configuration of FIG. 6Q may increase the stream time of data packets 610A-N as compared to the horizontal ECC codeword symbol configuration of FIGS. 6N-O (due to the increased parallelism for individual reads available in horizontal data configurations). However, dividing the array 115 into independent channels may allow the read module 241 to perform different read operations within the different channels concurrently, which may increase performance in certain use cases (in accordance with the stream time, read time, and/or IOPS metrics disclosed above).

As shown in FIG. 6Q, each data row 667A-N may comprise ECC codeword symbols 630A-N of a plurality of different data segments (packets 610A-N), and the ECC codeword symbols 630A-N comprising the respective packets 610A-N may be spread across two or more solid-state storage elements 116A-X (in accordance with the hybrid, independent channel configuration implemented by the adaptive write module 248). The adaptive write module 248 may be further configured to arrange the individual ECC codewords 630A-N for storage within respective columns 118 of the array 115, which, as disclosed above, may be leveraged to improve data reconstruction performance. In the FIG. 6Q embodiment, reconstructing the ECC codeword symbol SA[0] of column 118 may comprise: a) accessing other ECC codeword symbols 630 within the data row 667A with the unavailable ECC codeword symbol SA[0] (ECC codeword symbols SA[1]-SA[3], SB[0]-SB[3], through SN[0]-SN[3], correcting the other ECC codeword symbols, and reconstructing SA[0] by use of the corrected ECC codeword symbols and the corresponding parity data PA. As disclosed in further detail below, read operations in the hybrid, independent channel configuration of FIG. 6Q may comprise reading different portions of the array within different channels 696A-N (e.g., reading data of a first data row 667A within channel 696A while reading data of a second data row 667B in channel 696B). The adaptive storage module 113 may comprise an adaptive schedule module 114 configured to schedule concurrent read operations within the independent channels 696A-N (as disclosed in further detail below). Accordingly, accessing the other ECC codeword symbols 630 in the data row 667A may comprise performing one or more additional read operations, as disclosed herein in conjunction with FIG. 8.

Referring back to FIG. 1, the storage module 130 may comprise a request buffer 136 configured to receive storage requests from one or more storage clients 104. The storage requests may be queued in the request buffer 136 and serviced and/or executed by the storage module 130. In some embodiments, the storage module 130 comprises an adaptive schedule module 114 configured to determine an optimal schedule for storage operations based on, inter alia, the adaptive data configuration on the solid-state storage array 115. As used herein, an "optimal" schedule refers to a schedule that maximizes an objective criteria. In some embodiments, the objective criteria may be maximization of parallelism while maintaining data ordering constraints and/or avoiding hazards, such as read before write, write before read, or the like.

Figure 7:
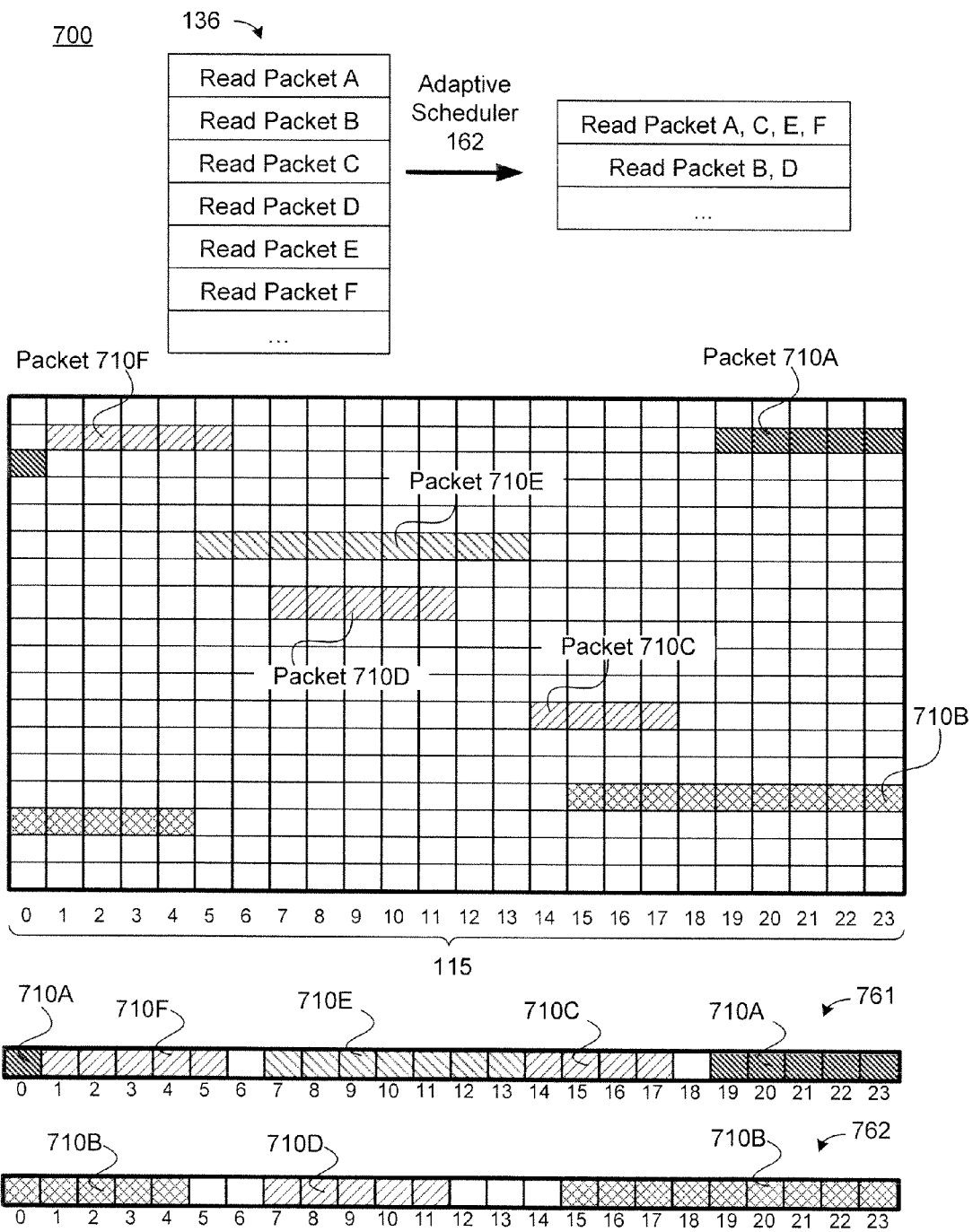
FIG. 7 depicts one embodiment of a system for adaptive scheduling.

FIG. 7 depicts one embodiment of adaptive scheduling performed by the adaptive schedule module 114. The adaptive schedule module 114 may be configured to schedule storage operations in accordance with the adaptive configuration of data structures on a solid-state storage array 115. As illustrated in FIG. 7, an ordered sequence of requests to read packets A, B, C, D, E, and F may be received at the storage module and buffered in the request buffer 136. The adaptive schedule module 114 may be configured to analyze the requests in the buffer 136, determine a layout of data corresponding to the requests on the solid-state storage array 115, and combine and/or schedule the requests to maximize read parallelism, while avoiding data hazards.

The adaptive schedule module 114 may determine that the read requests correspond to the data layout depicted in FIG. 7, by use of, inter alia, the logical-to-physical translation layer 132 and storage metadata 135. The adaptive schedule module 114 may be further configured to identify column and/or channel conflicts between read requests, which may comprise identifying which read requests require use of columns that are needed by other read requests. As illustrated in FIG. 7, data packets 710A-F stored within overlapping columns of the array 115 may be considered to conflict with respect to read scheduling. In the FIG. 7 embodiment data packet 710A overlaps with (conflicts with) packet 710B, packet 710B overlaps with packets 710A and 710C, packet 710E overlaps with packets 710D and 710F, and so on. The adaptive schedule module 114 may identify channel conflicts by use of column bitmaps, or other technique. The adaptive schedule module 114 may be further configured to identify read requests that can be performed in parallel (e.g., read requests that do not conflict and/or require access to the same columns of the array 115). Non-conflicting read requests may be combined and/or aggregated into a single, composite read request. In the FIG. 7 embodiment, the requests to read packets A, C, E, and F may be combined into a single read operation 761. The requests to read packets B and D may be combined into another read operation 762. Data of the read operations 761 and 762 may be processed by the read module 241, which may comprise reordering, ECC decoding, dewhitening, and/or depacketizing the data, as disclosed herein. As illustrated in FIG. 7, the combined read requests may change the order of read operations (perform the read of packets C, E, and F before packet B). The adaptive schedule module 114 may be configured to combine, schedule and/or reorder operations to prevent data hazards, such as read-before-write and/or write-before write. Alternatively, the adaptive schedule module 114 may be configured to maintain the order of the requests in the buffer 136, which may limit the degree of parallelism that can be achieved through request scheduling and aggregation.

As disclosed herein, errors within ECC codewords may be detected and/or corrected by the ECC read module 245 as data is read from the solid-state storage array 115. Some ECC codewords, however, may comprise more errors than can be corrected by the ECC algorithm. As disclosed above, in response to detecting an uncorrectable ECC codeword, the adaptive storage module 113 may issue an interrupt to the data recovery module 170, which may attempt to recover the data using, inter alia, parity data stored on the solid-state storage array. In some cases, uncorrectable errors may be caused by the failure of a portion of the solid-state storage array 115. Such errors may occur within specific columns, and as such, error conditions may result in losing the data of portions of a column 118 within the array 115.

Figure 8:
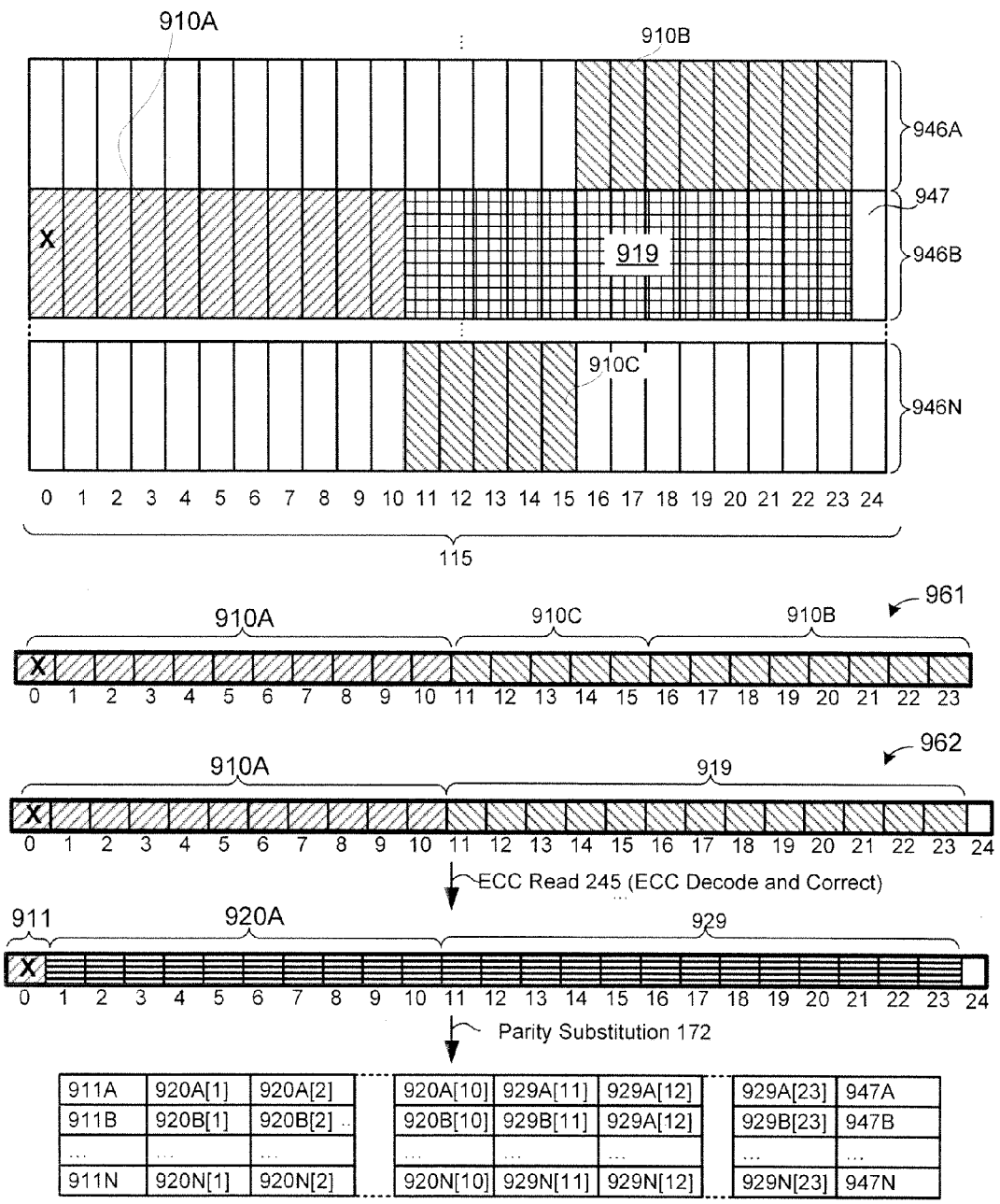
FIG. 8 depicts one embodiment of a system for adaptive data reconstruction.

FIG. 8 is a block diagram of one embodiment of a system 800 for reconstructing data stored on a failed column of a solid-state storage array 115 using, inter alia, parity substitution. Data of packet 910A may be read from the array 115 in a read operation. Data of the packet 910A may be stored within vertical stripe 946B. The read operation 961 may include reading other data packets 910B and 910C within other logical pages 946A and 946N. Data of the other packets 910B and 910C may not comprise uncorrectable errors, and may be processed through the read module 241, as disclosed above.

The ECC codewords in column 0 of the vertical stripe 946B, comprising data of packet 910A, may comprise errors that cannot be corrected by the ECC read module 245. In response, the adaptive storage module 113 may issue an interrupt to the data recovery module 170. The data recovery module 170 may be configured to determine the source of the uncorrectable error by use of the logical-to-physical translation layer 132, and to reconstruct data of column 0 in the vertical stripe 946B by use of, inter alia, other ECC codewords and/or the parity data stored within the vertical stripe 946B.

The data recovery module 170 may be configured to issue another read operation 962 to read the other ECC codewords 919 within the vertical stripe 946B. The read operation 962 may further comprise reading parity data 947B of the vertical stripe 946B. The data acquired in the read operation 962 may be processed by the adaptive read module 248, which may comprise stripping padding data (if any) from the read buffer 251, as disclosed above. The ECC read module 245 may be configured to identify and/or correct errors in the ECC codewords 910A and 919, which may comprise decoding the ECC codewords 910A and 919 and/or generating corrected ECC codewords 920A and 929.

The data recovery module 170 may comprise a parity substitution module, which may be configured to reconstruct the ECC codewords 911A-N in column 0 by use of the corrected ECC codewords 920A-N corresponding to columns 1 through 10, corrected ECC codewords 929A-N corresponding to columns 11-23, and parity data 947A-N: ECC codeword 911A may be reconstructed by use of corrected ECC codewords 920A[1 through 10], corrected ECC codewords 929A[11 through 23], and parity data 947A; ECC codeword 911B may be reconstructed by use of corrected ECC codewords 920B[1 through 10], corrected ECC codewords 929B[11 through 23], and parity data 947B; and so on. As disclosed above, use of the corrected ECC codewords 919A-N and 929A-N may prevent error aggregation during parity substitution operations.

In some embodiments, parity substitution module 172 may be configured to perform a byte-wise parity substitution operation corresponding to the byte-wise parity generation embodiments disclosed in conjunction with FIGS. 6A-F, 6I, and 6K. Following reconstruction of the ECC codewords of column 0, data packet 910A may processed by the read module 241 and returned to the requester, as disclosed herein, which may comprise discarding the other ECC codewords 919 and 929 read from the vertical stripe 946B.

Figure 9:
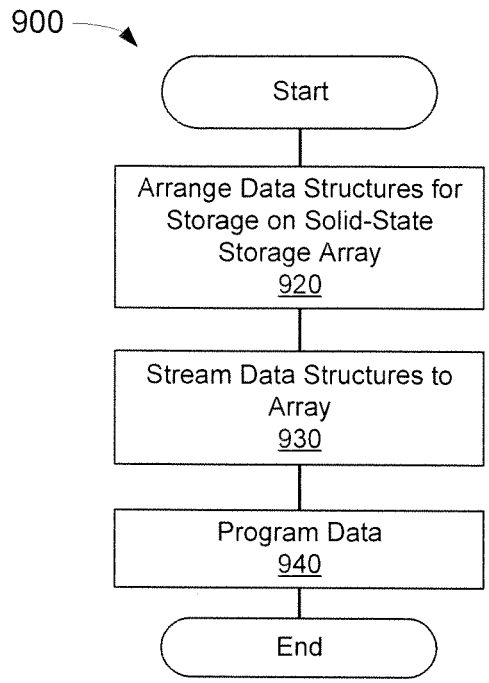
FIG. 9 is a flow diagram of one embodiment of a method for adaptive storage on a solid-state storage array.

FIG. 9 is a flow diagram of one embodiment of a method 900 for adaptive data storage. The method 900, and the other methods disclosed herein, may comprise steps configured for execution by a machine, such as a computing device 101, storage module 130, and/or adaptive storage module 113 as disclosed herein. Steps of the disclosed methods may be embodied as a computer program product, including a computer-readable storage medium comprising instructions configured for execution by a computing device to perform one or more method steps.

The method 900 may start and/or be initialized, which may comprise initializing communication resources, loading computer-executable instructions, and so on.

Step 920 may comprise arranging data for storage on a solid-state storage array 115. The solid-state storage array 115 may comprise a plurality of independent columns 118 (e.g., solid-state storage elements 116A-Y), which may be communicatively coupled to an adaptive storage module 113 in parallel by, inter alia, a bus 127.

In some embodiments step 920 may further comprise generating data structures for storage on the array 115. Step 920 may comprise generating one or more packets 310 comprising data for storage on the array 115, by use of a packet module 242. The packets 310 may comprise contextual metadata pertaining to the data, such as one or more logical identifiers associated with the data, and so on, as disclosed above. Step 920 may further comprise whitening the data packets, by use of a whiten module 244. Step 920 may comprise generating one or more ECC codewords comprising the packets. The ECC codewords may comprise ECC codewords, ECC codewords, ECC codeword symbols, or the like. In some embodiments, step 920 further comprises including relational information in the ECC codewords, which may comprise watermarking the ECC codewords within a bitmask (or other data) derived from a logical identifier associated with the data packets.

Arranging the data at step 920 may comprise buffering one or more data structures, such that the data structures layout within portions of the solid-state storage array 115. Arranging the data structures at step 920 may, therefore, comprise configuring the data structures to layout in a horizontal, vertical, and/or hybrid configuration within the solid-state storage array 115. Step 820 may comprise a 24-byte by 10-byte buffer of the horizontal embodiment of FIG. 6A. Alternatively, step 920 may comprise arranging the data structures for a vertical data structure layout, as disclosed in conjunction with FIG. 6C; step 920 may comprise using a buffer capable of buffering 24 240-byte ECC codewords 620 (or other data structures) for storage on respective columns of the logical storage element. Step 920 may further comprise arranging the data structures in a hybrid, independent channel configuration as disclosed in conjunction with FIG. 6E; step 920 may comprise buffering data structures in a write buffer capable of buffering 24/N 240-byte ECC codewords 620 where N is the number of independent columns of the hybrid storage arrangement. The data structures may comprise ECC codewords 620. The arrangement of step 920 may comprise configuring data of the same ECC codeword for storage on two of more different independent columns 118 of the array 115. Alternatively, the arrangement of step 920 may comprise configuring data of the ECC codewords 620 for storage within respective columns 118 of the array 115.

Alternatively, or in addition, buffering the data structures at step 920 may comprise configuring the data structures to layout within vertical stripes of the solid-state storage array 115. Step 920 may comprise buffering the data in accordance with a selected vertical stripe depth and/or length, which may correspond to an integral factor of data structures and/or page size of the solid-state storage medium 110. Step 920 may, therefore, comprise streaming ECC codewords 620 into vertical FIFO buffers 662A-X as disclosed in conjunction with FIG. 6I. The vertical stripe configuration may comprise storing ECC codewords 620 within respective columns 118 of the array 115. However, data structures contained within the ECC codewords 620 (e.g., packets) may be configured for storage on two or more different columns 118.

In some embodiments, step 920 further comprises adapting the data layout to avoid portions of the array 115 that are OOS. Step 920 may comprise injecting padding data into the buffer(s) to mask OOS columns 118 of the array (in accordance with the storage metadata 135), as disclosed above.

Step 930 may comprise streaming the data arranged at step 920 to the solid-state storage array 115, as disclosed above. Step 830 may comprise byte-wise streaming bytes to program buffers of a plurality of independent columns 118 of the array 115. Step 930 may further comprise generating byte-wise parity information for storage on a parity column of the array 115, as disclosed above.

Step 940 may comprise programming the contents of the program buffers streamed at step 930 onto a logical page of the solid-state storage array 115. Step 940 may comprise issuing a program command to the solid-state storage array 115 via the bus 127. In response to the command, each of the plurality of independent columns 118 of the array may be configured to perform a program operation concurrently and/or in parallel with other columns 118 within the array 115. Steps 920-940 may further comprise updating the logical-to-physical translation layer 132 to indicate the physical storage locations of the data structures stored on the array 115. The physical storage locations may indicate the bank 119A-N, array 115A-N, logical page 542, offset, and the like, of the data structures. The logical-to-physical translation metadata may comprise any-to-any associations between logical addresses, such as logical identifiers, and addresses of physical storage locations within the array 115.

Figure 10:
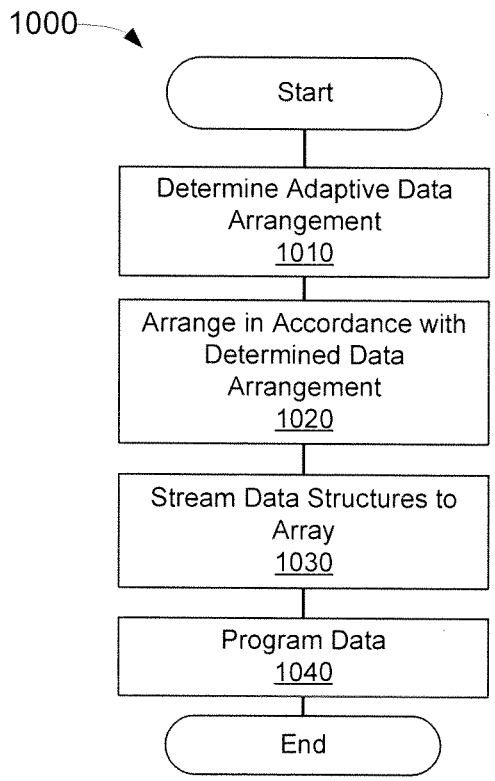
FIG. 10 is a flow diagram of another embodiment of a method for adaptive storage on a solid-state storage array.

FIG. 10 is a flow diagram of another embodiment of a method 1000 for adaptive data storage. The method 1000 may start and/or be initialized as disclosed above.

Step 1010 may comprise determining an adaptive data arrangement for use within a solid-state storage array 115. The determination of step 1010 may be based on, inter alia, a read time Tr of the solid-state storage medium 110, a stream time Ts of the adaptive storage module 113, data access characteristics of storage clients 104, desired IOPS characteristics, data reconstruction characteristics, and so on. The determination of step 1010 may comprise selecting between one or more of a) a horizontal data arrangement that reduces stream time Tr, but reduces availability of read-parallelism, b) a vertical data arrangement that increases read-parallelism, but may increase stream time Tr, c) a hybrid, independent channel configuration, and/or d) a vertical stripe configuration having a particular vertical stripe depth.

Step 1010 may comprise generating a profile of data storage operations by, inter alia, the adaptive storage profiling module 160. As used herein, profiling data operations refers to gathering information (e.g., storage metadata 135) pertaining to the storage operations performed by storage clients 104 through the storage interface 131. Profiling data may comprise data access patterns, characteristics of the solid-state storage medium 110, bus 127, and so on, which may be used to determine an optimal adaptive data structure layout on the solid-state storage array 115. The adaptive storage profiling module 160 may be configured to gather such profiling information and/or generate recommendations regarding data layout in response to the profiling information. For example, applications that exhibit a large number of data accesses to relatively small data segments and/or packets may be suited to a vertical configuration; a hybrid, independent channel configuration (e.g., two- or four-column channel configuration); and/or a vertical stripe configuration. In another example, the storage medium 110 may exhibit relatively high stream times as compared to read times Tr, and as such, a horizontal and/or wide channel configuration may result in improved performance.

The determination of step 1010 may be based on data reconstruction characteristics of various adaptive data layouts. Over time, the solid-state storage medium 110 may become less reliable and, as such, a data structure configuration that provides better data reconstruction performance may be preferred over other configurations. For example, highly vertical configurations, including the vertical stripe configurations, may reduce error aggregation during parity reconstruction operations as compared to horizontal data layouts and, as such, may provide improved data reconstruction performance.

In some embodiments, step 1010 may comprise determining an adaptive data layout by use of an objective function. The objective function may be configured to quantify the performance of different adaptive data layout configurations in view of the profiling data gathered by the adaptive storage profiling module 160 and/or other considerations (e.g., data reconstruction characteristics). The adaptive data configuration that provides the highest utility per the objective function may be identified as the optimal data configuration for the particular set of profiling data and/or other considerations.

Step 1010 may further comprise automatically configuring the storage module 130 to implement the determined adaptive data arrangement. Alternatively, step 1010 may comprise providing information pertaining to the determined adaptive data arrangement to a user, administrator, or other entity, which may determine whether any changes should be implemented.

Steps 1020, 1030, and 1040 may comprise arranging data for storage on the solid-state storage array 115 in accordance with the determined adaptive data arrangement, streaming the data structures to the array 115, and programming the data to the array 115, as disclosed above.

Figure 11:
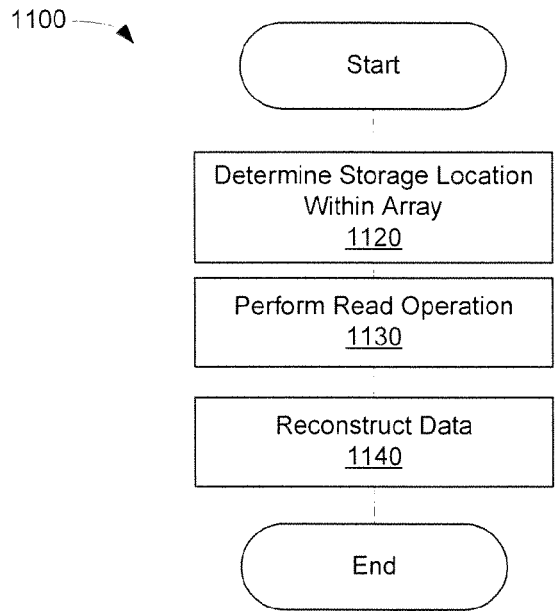
FIG. 11 is a flow diagram of another embodiment of a method for adaptive storage on a solid-state storage array.

FIG. 11 is a flow diagram of another embodiment of a method 1100 for adaptive data storage. Step 1120 may comprise determining the storage location of requested data within the array 115. Step 1120 may comprise determining the storage location by use of a logical-to-physical translation layer 132, which may include storage metadata 135, such as a forward index, map, or the like. The storage location may indicate an adaptive layout configuration of the data structure on the array 115 which, as disclosed herein, may include, but is not limited to, a horizontal configuration; a vertical configuration; a hybrid, independent channel configuration; a vertical stripe configuration; or the like.

Step 1130 may comprise reading the data from the determined storage locations and/or in accordance with the determined data structure configuration. The read operation may comprise reading data from one or more independent columns 118 comprising the array 115 (e.g., reading data from one or more solid-state storage elements 116A-Y), as disclosed herein. Step 1130 may comprise providing columns 118 of the array 115 with respective physical addresses (as determined at step 1120). The physical address may be the same (or equivalent) for each of the solid-state storage elements 116A-Y (e.g., in a horizontal data arrangement). Alternatively, the physical addresses may differ (e.g., for vertical; hybrid, independent channel; and/or certain vertical stripe configurations). Step 1130 may incur a read latency Tr, as described above.

Step 1130 may further comprise streaming the ECC codewords from read buffer(s) of the array into an adaptive storage module 113. Streaming the data structures may comprise streaming sufficient data to reconstruct a data structure, such as a plurality of ECC codewords 620 comprising one or more packets comprising the requested data. Each cycle of the bus 127 may be configured to transfer a single byte from each column 118 of the array. The number of bus cycles needed to transfer the requested ECC codewords may depend on the arrangement of the data: data arranged horizontally may require 10 cycles to transfer a 240-byte ECC codeword from 24 columns 118; data arranged vertically may require 240 cycles to transfer the same 240-byte ECC codeword from a single column 118; data arranged in a hybrid, independent channel arrangement may require 240/N cycles, where N is the number of independent, horizontal columns in the arrangement; and data arranged in vertical stripes may require 240 cycles. In the vertical; hybrid, independent channel; and vertical stripe configurations, however, multiple ECC codewords may be streamed concurrently.

Step 1140 may comprise reconstructing the requested data by use of the adaptive storage module 130 (e.g., an adaptive read module 247). Step 1140 may comprise buffering data read from the array 115, reordering the data, stripping padding data corresponding to OOS columns 118 (if any), and so on as disclosed herein. Step 1140 may further comprise performing ECC error detection and/or correction on ECC codewords 620 comprising the data packet, by use of the ECC read module 245. ECC processing may further comprise verifying relational information associated with the ECC codewords, such as a watermark on the ECC codewords, which may be derived from one or more logical identifiers associated with the requested data. Step 1140 may further comprise dewhitening the data packets, by use of the dewhiten module 243 and depacketizing the data by use of the depacket module 239, as disclosed herein.

Figure 12:
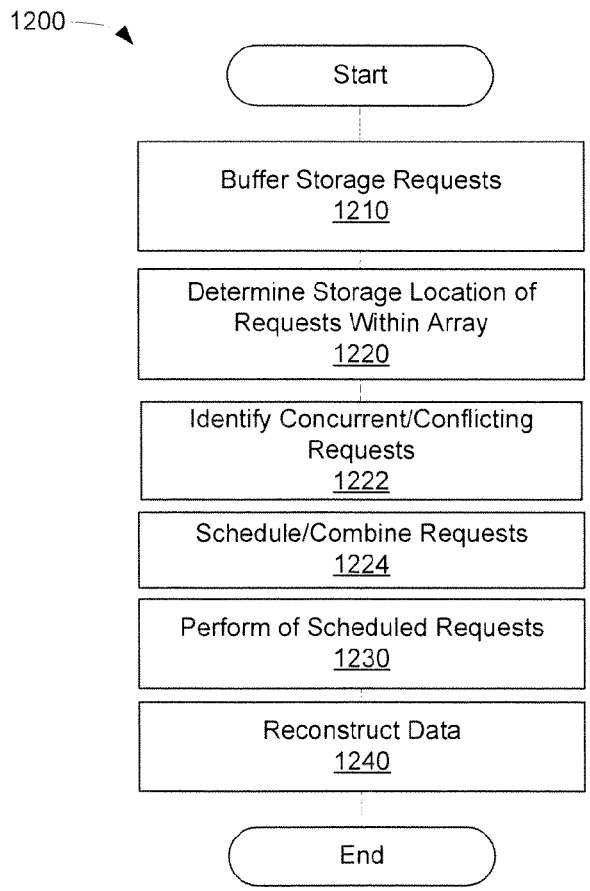
FIG. 12 is a flow diagram of one embodiment of a method for adaptive scheduling of storage requests.

FIG. 12 is a flow diagram of another embodiment of a method 1200 for adaptive request scheduling. Step 1210 may comprise buffering storage requests within a request buffer 136 of the storage module 130. The requests may be ordered within the buffer 136.

Step 1220 may comprise determining storage location(s) corresponding to the requests within the array 115, as disclosed above.

Step 1222 may comprise identifying storage requests that can be executed concurrently (e.g., do not conflict). As disclosed above, a storage request conflict refers to storage requests that cannot be performed concurrently within the same bank 119 and/or array 115. A storage request conflict may result from data structures associated with the requests overlapping within the array 115, such that the storage requests pertain to data stored within one or more of the same columns 118 within the array 115. Storage requests that can be executed concurrently may refer to storage requests that pertain to data stored on different independent columns 118 of the array 115.

Step 1224 may comprise scheduling and/or combining the requests in accordance with the concurrencies and/or conflicts identified at step 1222. Step 1224 may comprise combining requests that can be performed concurrently (e.g., do not conflict). Combining requests may comprise reordering requests within the buffer (e.g., changing the order of the requests within the buffer 136), as disclosed above, in order to combine concurrent requests and/or avoid request conflicts. Accordingly, step 1224 may comprise determining that the scheduled storage requests and/or storage request combinations do not create data hazards, such as read-before-write hazards, write-before-read hazards, or the like. In some embodiments, step 1224 may be limited to combining requests without changing request ordering, to ensure that data hazards do not occur.

Step 1230 may comprise performing the scheduled requests, which may comprise performing one or more combined read operations, as disclosed herein. Step 1240 may comprise reconstructing data of the requests by use of a read module 241, adaptive read module 247, and so on, as disclosed herein.

Figure 13:
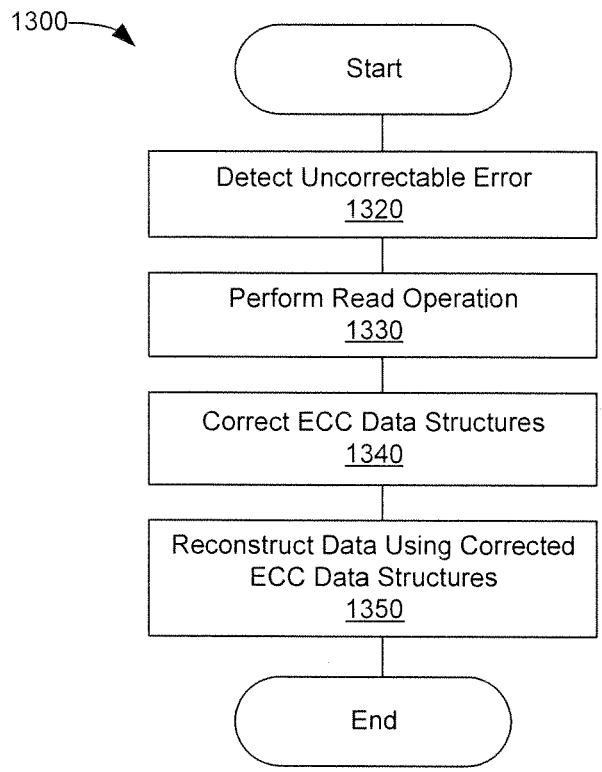
FIG. 13 is a flow diagram of one embodiment of a method for adaptive data recovery.

FIG. 13 is a flow diagram of one embodiment of a method 1300 for adaptive data reconstruction. Step 1320 may comprise detecting an uncorrectable error in an ECC codeword. Step 1320 may comprise detecting the error by use of an ECC read module 245 of the read module 241. Step 1320 may further comprise issuing an interrupt to a data recovery module 170, as disclosed herein. In some embodiments, step 1320 further comprises determining the source of the uncorrectable error, which may include identifying the column 118 (e.g., particular solid-state storage element 116A-Y) from which the uncorrectable data was read. Determining the source of the error may comprise referencing storage metadata 135, such as the logical-to-physical translation between the data and physical storage location. Alternatively, identifying the source of the error may comprise iterative parity substitution, as disclosed above.

Step 1330 may comprise performing a read operation to read ECC codewords within the same vertical stripe as the uncorrectable error, as disclosed above in conjunction with FIG. 8. Alternatively, step 1330 may comprise performing a read operation to read ECC codewords within other columns 118 of a vertical data configuration and/or within other channels of a hybrid, independent channel configuration. Step 1330 may further comprise reading parity data corresponding to the vertical stripe, vertical, and/or hybrid, independent channel configuration, as disclosed herein.

Step 1340 may comprise correcting ECC codewords in the vertical stripe and/or other columns 118. Correcting the ECC codewords may comprise processing the ECC codewords using the ECC read module 245 and/or relational verification module 645, as disclosed above. In some embodiments, step 1340 may be omitted, and the reconstruction step 1350 may proceed without first decoding and/or correcting the ECC codewords of the other columns 118.

Step 1350 may comprise reconstructing the uncorrectable data by use of the corrected ECC codewords and parity data. Step 1350 may comprise a byte-wise parity substitution operation between the corrected ECC codewords and the parity data. In hybrid, independent channel configurations, step 1350 may further comprise determining the source of the uncorrectable error using iterative parity substitution within the independent channel comprising the uncorrectable error. In a two-channel configuration, iterative parity substitution may comprise determining which of the two channels is the source of the error. Other hybrid, independent channel configurations may involve additional iterations, in accordance with the width of the channels.

Step 1350 may further comprise reconstructing the data by, inter alia, decoding the ECC codewords, including the reconstructed ECC codewords, dewhitening, and depacketizing the data, as disclosed above.

Figure 14:
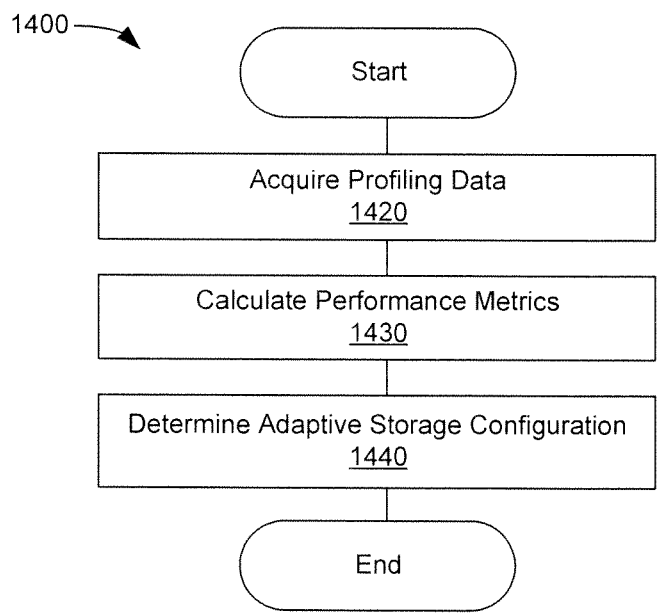
FIG. 14 is a flow diagram of one embodiment of a method for determining an adaptive data storage configuration.

FIG. 14 is a flow diagram of one embodiment of a method 1400 for determining an adaptive storage configuration. Step 1420 may comprise acquiring profiling data 1420. Step 1420 may comprise accessing profiling data generated by the storage module 130; stored, in a log storage format, on the solid-state storage medium 110; and/or the like. The profiling data may include an ordered history of storage operations and/or requests received at the storage module 130.

Step 1430 may comprise determining performance metrics of one of more adaptive data storage configurations. Step 1430 may comprise replaying and/or simulating the history of storage requests in one or more different adaptive storage configurations, which may include, but are not limited to, a horizontal configuration; a vertical configuration; a hybrid, independent channel configuration; a vertical stripe configuration (of various vertical stripe depths); and/or the like. Step 1430 may comprise simulating storage operations under the different adaptive data configurations, which may include determining the contents of various portions of the solid-state storage array 115 under the different adaptive data configurations, scheduling read operations according to the adaptive layout (using the adaptive schedule module 114), and/or the like. The performance metrics may be based on one or more of a desired IOPS metric, a read time Ts, a stream time Ts, and so on, as disclosed above.

Step 1440 may comprise determining an adaptive storage configuration. Step 1440 may comprise determining an optimal adaptive storage configuration based on the performance metrics and/or one or more objective functions. The determination of step 1440 may include various metrics and/or considerations, including the performance metrics calculated at step 1430, data reconstruction characteristics of various data layout configurations, and so on. Step 1440 may further comprise providing an indication of the determined storage configuration (to a user, administrator, or other entity), automatically configuring the adaptive storage module 113 to operate in accordance with the determined adaptive storage configuration, and/or the like.

Figure 15:
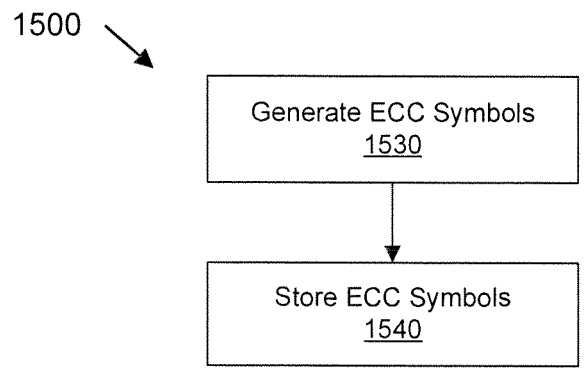
FIG. 15 is a flow diagram of one embodiment of a method for adaptive data storage using ECC codeword symbols.

FIG. 15 is a flow diagram of one embodiment of a method 1500 for adaptive data storage using ECC codeword symbols. Step 1530 may comprise generating ECC codeword symbols 630 in response to receiving data for storage on the solid-state storage array 115. Step 1530 may comprise compressing, packetizing, whitening, and/or encrypting data of the request, as disclosed herein. Step 1530 may comprise encoding the processed data into a plurality of ECC codeword symbols 630 using an ECC symbol generator module 686. The ECC symbol generator module 686 may be configured to generate N+S bytes of ECC codeword symbol data in response to N bytes of processed data. The ECC codeword symbols 630 may be configured for storage within respective columns 118 of the array 115 (e.g., respective solid-state storage elements 116A-Y). The ECC codeword symbols may be a single byte or multiple bytes. The ECC codeword symbols 630 generated at step 1530 may, therefore, be sized in accordance with the configuration solid-state storage array 115, a configuration of the bus 127 (e.g., width of the bus 127), adaptive data layout configuration of the adaptive write module 240, and/or the like. In some embodiments, step 1530 may further comprise marking the ECC codewords with relational information, as disclosed above.

Step 1540 may comprise storing the ECC codeword symbols 630 generated at step 1530 within respective columns 118 of the array 115. Step 1540 may comprise arranging the ECC codeword symbols 630 (buffering the symbols) such that the ECC codeword symbols 630 are streamed to program buffers of respective solid-state storage elements 116A-Y within the array 115. Step 1540 may comprise buffering multi-byte ECC codeword symbols 630 to store bytes of the same ECC codeword symbols 630 within the same column 118, as disclosed above in conjunction with FIG. 6N.

Step 1540 may further comprising storing ECC codeword symbols 630 according to an adaptive data layout and/or configuration within the array 115. The adaptive data layout of step 1540 may comprise one or more of a horizontal data configuration, a vertical data configuration, a hybrid channel configuration, and/or a vertical stripe configuration, as disclosed above. In a horizontal configuration, step 1540 may comprise streaming the ECC codeword symbols 630 of the data packet 610 horizontally within a 24-column channel of the array 115 (as depicted in FIGS. 6A-B and 6M-N). In a vertical configuration, step 1540 may comprise streaming the ECC codeword symbols 630 of the data packet 610 vertically within a single column of the array (as depicted in FIGS. 6C-D), while ECC codeword symbols 630 of other packets (and/or other data segments) are streamed to other columns 118 of the array 115. In a hybrid, independent channel configuration, step 1540 may comprise streaming the ECC codeword symbols 630 of the data packet 610 to a hybrid, independent channel comprising a subset of one or more columns 118 of the array 115 (as depicted in FIGS. 6E-F), while ECC codeword symbols 630 of other packets (and/or other data segments) are streamed to other independent channels, comprising other subsets of columns 118, within the array 115. In a vertical stripe configuration, step 1540 may comprise streaming the ECC codeword symbols 630 into a vertical stripe of a predetermined depth within one or more of the columns 118 of the array 115, as depicted in FIGS. 6G-I.

In some embodiments, step 1540 further comprises managing OOS conditions within the array 115 by, inter alia, streaming padding data to one or more columns 118 that are out-of-service (as indicated by the storage metadata 135).

In some embodiments, step 1540 further comprises generating parity data corresponding to one or more data rows 667 comprising the ECC codeword symbols. The data rows 667 may comprise ECC codeword symbols 630 of the data packet 610 and/or ECC codeword symbols 630 of one or more other packets and/or data segments in accordance with the adaptive data configuration implemented by the adaptive write module 248.

Step 1540 may further comprise filling program buffers of the solid-state storage elements 116A-Y in the array 115 and issuing one or more program commands to the array 115 configured to program the contents of the program buffers to the solid-state storage elements 116A-Y.

Figure 16:
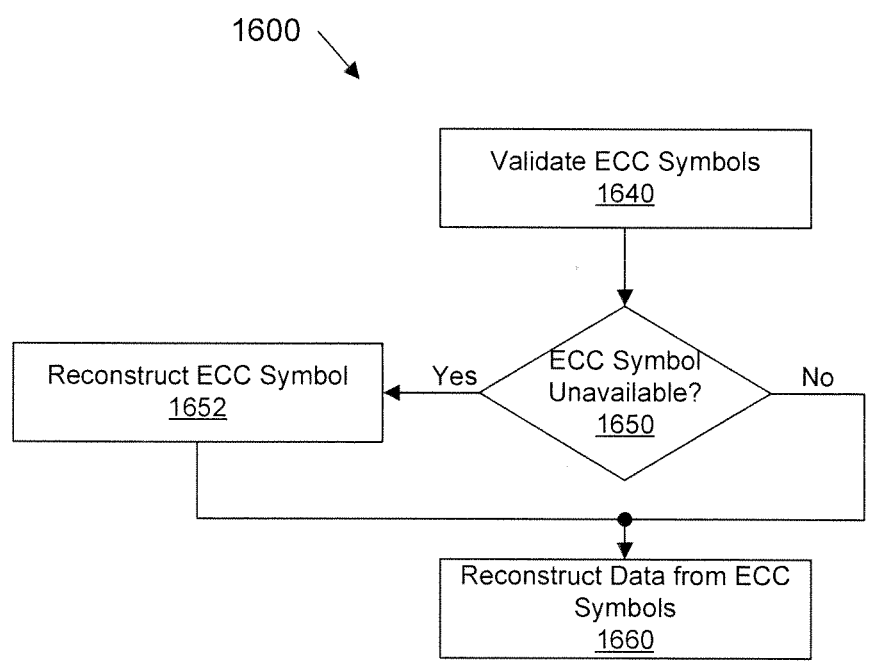
FIG. 16 is a flow diagram of one embodiment of a method for data recovery in an adaptive storage environment.

FIG. 16 is a flow diagram of a method 1600 for data recovery in an adaptive storage environment. Step 1640 may comprise validating ECC codeword symbols 630 pertaining to a data segment stored on the solid-state storage array 115. Step 1640 may comprise reading and/or accessing the ECC codeword symbols 630 in response to one or more data access requests (e.g., read requests, read modify requests, and/or the like). The requests may pertain to data stored within ECC codeword symbols 630 on the solid-state storage array 115.

The requests may reference the data by use of one or more logical identifiers and/or logical addresses. Accordingly, step 1640 may comprise determining a storage location of the ECC codeword symbols 630 comprising data of the request within the array 115 by use of the logical-to-physical translation layer 132 and/or storage metadata 135, as disclosed above. Step 1640 may further comprise scheduling and/or issuing one or more request requests to the array 115, as disclosed above.

Step 1640 may further comprise reading ECC codeword symbols 630 in accordance with an adaptive data layout. As disclosed above, ECC codeword symbols 630 of the requested data may be stored in one or more of a horizontal data configuration; a vertical data configuration; a hybrid, independent channel configuration; a vertical stripe configuration; and/or the like. In a horizontal, independent channel, and/or some vertical stripe configurations, step 1640 may comprise reading ECC codeword symbols 630 from two or more columns 118 of the array 115. In a vertical configuration, and/or some vertical stripe configurations, step 1640 may comprise reading ECC codeword symbols 630 from a single column 118 of the array 115. However, and notwithstanding the data arrangement and/or number of columns 118 used to read ECC codeword symbols 630 comprising the requested data, each ECC codeword symbol 630 read from the array 115 may be stored within a respective one of the columns 118 (e.g., the data of each ECC codeword symbol 630 may be stored within a respective one of the solid-state storage elements 116A-Y).

In some embodiments, step 1640 further comprises buffering the ECC symbol data to reconstruct ECC codeword symbols 630 (e.g., as depicted in FIG. 6N). Step 1640 may further comprise reordering the ECC codeword symbols 630 in accordance with an order and/or sequence of the requested data, as disclosed above in conjunction with FIG. 6L. Step 1640 may further comprise validating relational information of the ECC codeword symbols 630 by use of a relational verification module 645, as disclosed above.

Validating the ECC codeword symbols 630 at step 1640 may comprise detecting and/or correcting errors in the ECC codeword symbols 630 using an ECC algorithm (and/or by use of the ECC read module 245 and/or ECC symbol validation module 687).

Step 1650 may comprise identifying an ECC codeword symbol 630 that is unavailable due to, inter alia, an uncorrectable error in the ECC codeword symbol 630, read failure, hardware fault, and/or the like. The flow may continue at step 1652 in response to detecting the unavailable ECC codeword symbol; otherwise, the flow may continue at step 1660.

Step 1652 may comprise reconstructing the unavailable ECC codeword symbol 630. Step 1652 may comprise one or more byte-wise parity substitution operations, which may include, but are not limited to, accessing one or more data rows 647 comprising the unavailable ECC codeword symbol 630, wherein each data row 647 comprises one or more other ECC codeword symbols 630, correcting the other ECC codeword symbols 630 within the one or more data rows 647 (decoding and/or validating the other ECC codeword symbols 630), and using the corrected ECC codeword symbols 630 and/or corresponding parity data to reconstruct the unavailable ECC codeword symbol 630 (e.g., as illustrated in FIGS. 6O-P). Alternatively, the parity substitution operation may omit the step of correcting the other ECC codeword symbols 630. The unavailable ECC codeword symbol 630 may be reconstructed by use of the other ECC codeword symbols 630 as read from the array 115. In some embodiments, step 1652 may comprise reconstructing the unavailable ECC codeword symbol 630 using the other ECC codeword symbols, and without reference to dedicated parity data (e.g., using data reconstruction capabilities of the ECC encoding), as disclosed above.

Step 1660 may comprise reconstructing the requested data from the ECC codeword symbols 630, which may include one or more reconstructed ECC codeword symbols 630 acquired at step 1652. Step 1660 may further comprise providing the requested data to a storage client 104, which may include dewhitening, depacketizing, and/or decrypting the data, as disclosed above.

Figure 17:
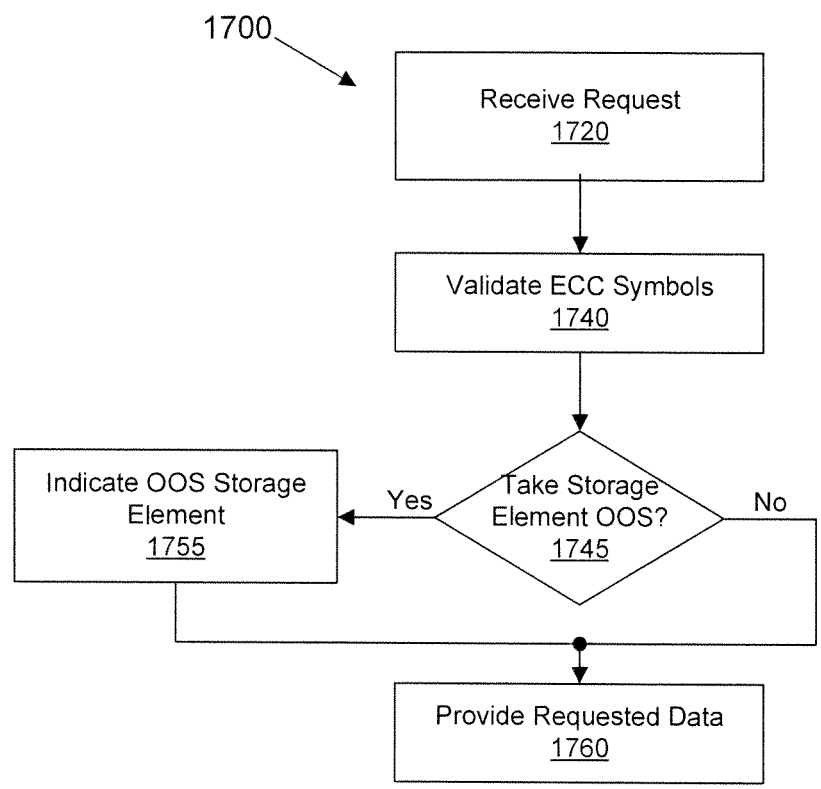
FIG. 17 is a flow diagram of another embodiment of a method for data recovery in an adaptive storage environment.

FIG. 17 is a flow diagram of another embodiment of a method 1700 data recovery in an adaptive storage environment. Step 1720 may comprise receiving a request for data stored within the solid-state storage array 115. The requested data may be embodied as a plurality of ECC codeword symbols 630, each of which may be stored within one of the solid-state storage elements 116A-Y comprising the array 115, as disclosed above.

Steps 1740 may comprise validating the ECC codeword symbols 630 comprising the requested data, as disclosed above. Step 1740 may further comprise identifying unavailable ECC codeword symbols 630, determining the source of the error(s) within the unavailable ECC codeword symbols 630 (e.g., identifying the column(s) 118 from which the unavailable ECC codeword symbols 630 were read), and/or reconstructing the unavailable ECC codeword symbols 630, as disclosed herein.

Step 1745 may comprise determining whether any of the columns 118 of the array 115 (e.g., solid-state storage elements 116A-Y and/or portions thereof) should be taken OOS. As disclosed herein, a solid-state storage element 116A-Y may be taken OOS for any number of reasons including, but not limited to, excessive wear, error rate, read and/or program failures, or the like. Step 1745 may comprise identifying solid-state storage elements 116A-Y associated with ECC codeword symbols 116 that were unavailable (if any). As disclosed herein, each ECC codeword symbol 630 may be associated with a respective column 118 (solid-state storage element 116A-Y); as such, the identification of step 1745 may be determined directly and without further parity comparisons (e.g., as in the case of ECC codewords distributed across multiple solid-state storage elements).

Columns 118 comprising unavailable ECC codeword symbols 630 may be selected as candidates for retirement. In some embodiments, a section of a solid-state storage element 116A-Y may be taken OOS in response to identifying more than a threshold number of unavailable ECC codeword symbols 630, in response to identifying more than a threshold number of correctable errors, in response to reaching a threshold wear level, or the like. The threshold(s) of step 1745 may be selected according to testing and experience. If one or more solid-state storage elements 116A-Y are identified at step 1745, the flow continues to step 1755; otherwise, the flow continues at step 1760.

Step 1755 may comprise indicating that a column 118 (and/or portion thereof) is OOS (retired). Step 1755 may comprise updating storage metadata 135 (e.g., OOS metadata) to identify the portions of the array 115 that are retired. Step 1755 may further comprise identifying storage resources to replace the OOS section(s), configuring the adaptive write module 248 to stream padding data to the OOS section(s), configuring the adaptive read module 247 to strip data corresponding to the OOS section(s), and so on.

Alternatively, in some embodiments, the identified section(s) may remain in service, and step 1755 may comprise modifying the ECC configuration of the adaptive storage module 113 to accommodate increased error rates. The modification may comprise configuring an ECC write module 246 and/or ECC read module 245 to generate larger ECC codewords, comprising a larger ratio and/or percentage of ECC information to data.

The above description provides numerous specific details for a thorough understanding of the embodiments described herein. However, those of skill in the art will recognize that one or more of the specific details may be omitted, or other methods, components, or materials may be used. In some cases, operations are not shown or described in detail.

Furthermore, the described features, operations, or characteristics may be combined in any suitable manner in one or more embodiments. It will also be readily understood that the order of the steps or actions of the methods described in connection with the embodiments disclosed may be changed as would be apparent to those skilled in the art. Thus, any order in the drawings or Detailed Description is for illustrative purposes only and is not meant to imply a required order, unless specified to require an order.

Embodiments may include various steps, which may be embodied in machine-executable instructions to be executed by a general-purpose or special-purpose computer (or other electronic device). Alternatively, the steps may be performed by hardware components that include specific logic for performing the steps, or by a combination of hardware, software, and/or firmware.

Embodiments may also be provided as a computer program product including a computer-readable storage medium having stored instructions thereon that may be used to program a computer (or other electronic device) to perform processes described herein. The computer-readable storage medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable media suitable for storing electronic instructions.

As used herein, a software module or component may include any type of computer instructions or computer executable code located within a memory device and/or computer-readable storage medium. A software module may, for instance, comprise one or more physical or logical blocks of computer instructions, which may be organized as a routine, program, object, component, data structure, etc., that perform one or more tasks or implement particular abstract data types.

In certain embodiments, a particular software module may comprise disparate instructions stored in different locations of a memory device, which together implement the described functionality of the module. Indeed, a module may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

It will be understood by those having skill in the art that many changes may be made to the details of the above-described embodiments without departing from the underlying principles of the disclosure.

We claim:

1. An apparatus, comprising:
an error-correcting code (ECC) write module configured to generate a plurality of ECC codeword symbols comprising data of a storage request;
wherein each of the ECC codeword symbols is configured for storage within one or more respective columns of a solid-state storage array, each column comprising one or more solid-state storage elements; and
an adaptive write module configured to stream each of the ECC codeword symbols comprising the data of the storage request to at least one respective column of a set of two or more columns of the solid-state storage array,
wherein the ECC write module is configured to generate multi-byte ECC codeword symbols, wherein the adaptive write module is configured to stream portions of the multi-byte ECC codeword symbols to respective solid-state storage elements in each of a plurality of stream cycles, and wherein the adaptive write module is further configured to stream the portions of the multi-byte ECC codeword symbols such that the portions of each multi-byte ECC codeword symbol are streamed to a respective one of the solid-state storage elements.

2. The apparatus of claim 1, wherein the adaptive write module is configured to stream the ECC codeword symbols to the solid-state storage array in a plurality of data rows, each data row comprising data for storage within a respective one of the columns, the apparatus further comprising a parity module configured to generate parity data corresponding to each of the data rows.

3. The apparatus of claim 1, wherein the adaptive write module is configured to stream the ECC codeword symbols comprising the data of the storage request to a first independent channel comprising a subset of the columns of the solid-state storage array with ECC codeword symbols comprising data of another storage request to a different independent channel comprising a different subset of the columns of the solid-state storage array.

4. The apparatus of claim 1, further comprising:
a read module configured to read a plurality of ECC codeword symbols stored within a plurality of different solid-state storage elements, wherein each ECC codeword symbol is read from a respective one of the solid-state storage elements; and
a data recovery module configured to reconstruct an unavailable ECC codeword symbol read from a first one of the solid-state storage elements using other ECC codeword symbols stored on others of the solid-state storage elements.

5. The apparatus of claim 4, wherein the data recovery module is configured to reconstruct the unavailable ECC codeword symbol by use of parity data corresponding to the unavailable codeword and other ECC codeword symbols.

6. The apparatus of claim 1, wherein the data of the storage request comprises one of a data packet, a data segment, a block, and a sector, and wherein the ECC write module is configured to generate a plurality of ECC codeword symbols comprising the data, and wherein the adaptive write module is configured to distribute the ECC codeword symbols between a plurality of different solid-state storage elements.

7. The apparatus of claim 1, wherein the adaptive write module is configured to stream a respective ECC codeword symbol to a plurality of solid-state storage elements in each of a plurality of stream cycles, the apparatus further comprising a parity module configured to generate parity data corresponding to the ECC symbols being streamed to the plurality of solid-state storage elements in the stream cycle, wherein the adaptive write module is configured to stream the parity data with the ECC codeword symbols corresponding to the parity data.

8. The apparatus of claim 1, wherein the ECC write module is configured to generate one-byte ECC codeword symbols, and wherein the adaptive write module is configured to stream a respective one of the ECC codeword symbols to each of a plurality of solid-state storage elements in each of a plurality of bus cycles.

9. A computer program product comprising a non-transitory computer readable storage medium storing computer usable program code executable to perform operations, the operations comprising:
 generating multi-byte error-correcting code (ECC) codeword symbols;
 streaming portions of the multi-byte ECC codeword symbols to respective solid-state storage elements in each of a plurality of stream cycles, said streaming comprising streaming each multi-byte ECC codeword symbol to a respective one of the solid-state storage elements;
 determining a storage location of a plurality of error-correcting code (ECC) codeword symbols comprising requested data;
 identifying ECC codeword symbols comprising data of one or more other requests stored within different groups of the solid-state storage elements; and
 scheduling a read operation configured to read the ECC codeword symbols of the requested data and ECC codewords comprising data of the one or more other requests in a single read operation on the solid-state storage elements.

10. The computer program product of claim 9, the operations further comprising verifying that the ECC codeword symbols comprise the requested data by verifying a mark on the ECC codeword symbols corresponding to relational information pertaining to the requested data.

11. The computer program product of claim 9, the operations further comprising:
 queuing storage requests in a request buffer; and
 determining a storage location of ECC codewords of one or more other requests in the request buffer.

12. The computer program product of claim 11, wherein scheduling the read operation comprises reordering one or more storage requests in the request buffer.

13. The computer program product of claim 11, wherein scheduling the read operation comprises indicating different addressing information for two or more of the solid-state storage elements.

14. The computer program product of claim 13, further comprising reordering contents of a read buffer to reconstruct a data packet stored within the plurality of ECC codeword symbols comprising the requested data.

15. A system, comprising:
 means for generating a plurality of sets of error-correcting code (ECC) symbols, wherein each set of ECC symbols comprises data of different respective storage requests;
 means for arranging the sets of ECC symbols for storage within different independent channels, each channel comprising two or more solid-state storage elements; and
 means for storing the arranged sets of ECC symbols to the different independent channels, comprising means for storing each ECC symbol within a respective one of the solid-state storage elements of a respective independent channel,
 wherein the means for generating is configured to generate multi-byte ECC codeword symbols, wherein the means for arranging is configured to stream portions of the multi-byte ECC codeword symbols to respective solid-state storage elements in each of a plurality of stream cycles, and wherein the means for arranging is further configured to stream the portions of the multi-byte ECC codeword symbols such that the portions of each multi-byte ECC codeword symbol are streamed to a respective one of the solid-state storage elements.

16. The system of claim 15, further comprising:
 means for identifying an independent channel comprising a set of ECC symbols corresponding to requested data; and
 means for extracting the requested data from the set of ECC symbols read from the identified independent channel.

17. The system of claim 15, further comprising means for combining two or more read requests pertaining to ECC symbols stored within different independent channels.

18. The system of claim 15, further comprising means for reconstructing an uncorrectable ECC symbol read from one of the solid-state storage elements by use of a plurality of ECC symbols stored within others of the solid-state storage elements.

* * * * *